United States Patent
Shibuya et al.

(10) Patent No.: US 7,629,107 B2
(45) Date of Patent: Dec. 8, 2009

(54) POSITIVE PHOTOSENSITIVE COMPOSITION, POLYMER COMPOUNDS FOR USE IN THE POSITIVE PHOTOSENSITIVE COMPOSITION, MANUFACTURING METHOD OF THE POLYMER COMPOUNDS, COMPOUNDS FOR USE IN THE MANUFACTURE OF THE POLYMER COMPOUNDS, AND PATTERN-FORMING METHOD USING THE POSITIVE PHOTOSENSITIVE COMPOSITION

(75) Inventors: Akinori Shibuya, Haibara-gun (JP); Takayuki Kato, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 78 days.

(21) Appl. No.: 11/857,178

(22) Filed: Sep. 18, 2007

(65) Prior Publication Data
US 2008/0085464 A1 Apr. 10, 2008

(30) Foreign Application Priority Data
Sep. 19, 2006 (JP) .............................. 2006-252626

(51) Int. Cl.
G03F 7/004 (2006.01)
G03F 7/30 (2006.01)
C08F 2/42 (2006.01)
C07C 323/22 (2006.01)

(52) U.S. Cl. .................... 430/270.1; 430/326; 430/905; 430/910; 526/82; 526/85; 526/281; 526/284; 560/15

(58) Field of Classification Search .............. 430/270.1, 430/326, 905, 910; 526/82, 85, 281, 284; 560/15
See application file for complete search history.

(56) References Cited

U.S. PATENT DOCUMENTS

| | | | | | |
|---|---|---|---|---|---|
| 7,105,268 | B2* | 9/2006 | Funaki et al. | ............ | 430/270.1 |
| 7,504,194 | B2* | 3/2009 | Fukuhara et al. | ......... | 430/270.1 |
| 2006/0068324 | A1* | 3/2006 | Mita | ....................... | 430/270.1 |

FOREIGN PATENT DOCUMENTS

| | | |
|---|---|---|
| EP | 1 698 645 A1 | 9/2006 |
| JP | 2000-214587 A | 8/2000 |
| JP | 2001-106737 A | 4/2001 |
| JP | 2003-167347 A | 6/2003 |
| JP | 2003-223001 A | 8/2003 |
| JP | 2001-98034 A | 4/2004 |
| JP | 2004-250377 A | 9/2004 |
| JP | 2006-91664 A | 4/2006 |
| JP | 2006-91762 A | 4/2006 |
| WO | 2005/000912 A2 | 1/2005 |
| WO | 2005/085301 A1 | 9/2005 |
| WO | 2005085301 A | 9/2005 |

OTHER PUBLICATIONS

European Office Action 07018182.1-1226 dated Feb. 15, 2008.
Idriss Blakey, et al "Synthesis of high refractive index sulfur containing polymers for 193nm immersion lithography" Pro SPIE Int Soc Opt Eng, vol. 6153, No. 1, Feb. 2006 pp. 61530H1-61530H10, XP002465914.

* cited by examiner

*Primary Examiner*—John S Chu
(74) *Attorney, Agent, or Firm*—Sughrue Mion, PLLC

(57) ABSTRACT

A positive photosensitive composition comprises: a polymer compound having an acid-decomposable structure on a terminal of the polymer compound; and a compound capable of generating an acid upon irradiation with actinic ray or radiation.

9 Claims, 1 Drawing Sheet

POSITIVE PHOTOSENSITIVE COMPOSITION, POLYMER COMPOUNDS FOR USE IN THE POSITIVE PHOTOSENSITIVE COMPOSITION, MANUFACTURING METHOD OF THE POLYMER COMPOUNDS, COMPOUNDS FOR USE IN THE MANUFACTURE OF THE POLYMER COMPOUNDS, AND PATTERN-FORMING METHOD USING THE POSITIVE PHOTOSENSITIVE COMPOSITION

BACKGROUND OF THE INVENTION

1. Field of the Invention

The present invention relates to a positive photosensitive composition used in a manufacturing process of semiconductors, such as IC, manufacture of circuit substrates for liquid crystals, thermal heads and the like, and other photo-fabrication processes, a positive photosensitive composition for use in the positive photosensitive composition, a polymer compound used in the positive photosensitive composition, a manufacturing method of the polymer compound, a compound for use in the manufacture of the polymer compound, and a pattern-forming method using the positive photosensitive composition. More specifically, the invention relates to a positive photosensitive composition suitable for use in the case where far ultraviolet rays of 250 nm or less, preferably 220 nm or less, are used as exposure light sources, and electron beams are used as irradiation source, a polymer compound used in the positive photosensitive composition, a manufacturing method of the polymer compound, a compound for use in the manufacture of the polymer compound, and a pattern-forming method using the positive photosensitive composition.

2. Description of the Related Art

Chemical amplification photosensitive compositions are pattern-forming materials capable of generating an acid at an exposed part upon irradiation with actinic ray or radiation, e.g., far ultraviolet rays, changing the solubility in a developing solution of the irradiated part and non-irradiated part with actinic ray or radiation by the reaction with the acid as a catalyst, and forming a pattern on a substrate.

When a KrF excimer laser is used as the exposure light source, resins having poly(hydroxystyrene) as a fundamental skeleton low in absorption in the region of 248 nm are mainly used, so that a high sensitivity, high resolution and good pattern is formed as compared with conventionally used naphthoquinonediazide/novolak resins.

On the other hand, when a light source of further shorter wavelength, e.g., an ArF excimer laser (193 nm), is used as the exposure light source, even the above chemically amplified photosensitive compositions are not sufficient, since compounds containing an aromatic group substantially show large absorption in the region of 193 nm.

To cope with this problem, resists that contain a resin having an alicyclic hydrocarbon structure have been developed for an ArF excimer laser. For example, compositions containing resins having a polycyclic acid-decomposable repeating unit and a non-acid-decomposable repeating unit are disclosed in JP-A-2003-167347 and JP-A-2003-223001. These resins are chemically amplified resists having protective groups that are dissociated by the action of an acid and unstable to an acid, but now under the circumstances of further fining of the resist pattern is required, it is more and more difficult to obtain sufficient resist performance with these protective groups alone.

Therefore, for example, as disclosed in JP-A-2001-98034, JP-A-2000-214587 and JP-A-2001-106737, resist polymers in which a crosslinking site that is dissociated by the action of an acid is introduced to the side chain of the resin containing a repeating unit having an acid-dissociating protective group are also examined.

This is by the mechanism that the crosslinkage is broken by the action of the acid catalyst and dissolution contrast between the exposed area and the unexposed area is improved. However, since a bifunctional monomer such as diacrylate is used in the polymerization of the polymer and crosslinking reaction occurs on the side chain of the polymer chain, the molecular weight distribution of the polymer formed is very great and solubility is low. In addition, a polymer of super high molecular weight is liable to be formed, so that a high molecular weight hardly soluble component difficult to be dissolved in an alkali developing solution is present even after being decomposed by acid, and development defect occurs due to the polymer component remaining undissolved at the time of fine pattern formation.

Also, as disclosed in JP-A-2001-98034, in the case where a crosslinked polymer having a crosslinking site having an acetal skeleton unstable to acid on the side chain of the polymer is used as a resist polymer, the polymer is very sensitive to acid, so that the preservation stability is inferior.

On the other hand, positive photosensitive resins having introduced an acid-dissociating structure into the main chain of a polymer are proposed in JP-A-2006-91762 and WO 2005/085301A1. These are the propositions to solve the problem of the above side chain crosslinking type polymers, but the effect is not sufficient.

SUMMARY OF THE INVENTION

The invention has been done in view of the background art, and a first object of the invention is to provide a positive photosensitive composition for use in fine pattern forming such as the manufacture of semiconductors that is higher sensitivity and further improved in falling down of a pattern as compared with conventional ones, a second object is to provide a polymer compound for use in the positive photosensitive composition, a third object is to provide a manufacturing method of the polymer compound, a fourth object is to provide a compound for use in the manufacture of the polymer compound, and the fifth object is to provide a pattern forming method using the positive photosensitive composition.

The invention is as follows.

(1) A positive photosensitive composition comprising: a polymer compound having an acid-decomposable structure on a terminal of the polymer compound; and a compound capable of generating an acid upon irradiation with actinic ray or radiation.

(2) The positive photosensitive composition as described in the above item (1), wherein the polymer compound further has a repeating unit having a lactone group.

(3) The positive photosensitive composition as described in the above item (1) or (2), wherein the polymer compound has a structure represented by formula (1) on the terminal:

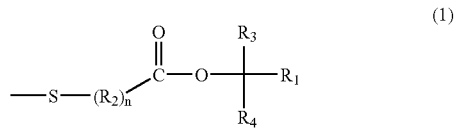

wherein $R_1$ represents an alkyl group, a cycloalkyl group, or an aryl group; $R_2$ represents an alkylene group, a cycloalkylene group, or an arylene group; $R_3$ and $R_4$ each independently represents a hydrogen atom, an alkyl group, a cycloalkyl group, an alkenyl group, or an aryl group, provided that at least one of $R_3$ and $R_4$ does not represent a hydrogen atom, and $R_3$ or $R_4$ may be bonded to contiguous $R_1$ to form a cyclic structure; and n represents 0 or 1.

(4) The positive photosensitive composition as described in the above item (1) or (2), wherein the polymer compound has a structure represented by formula (3) on the terminal:

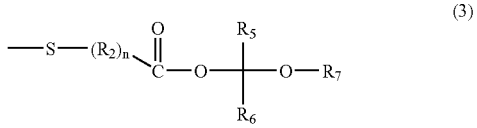

wherein $R_7$ represents an alkyl group, a cycloalkyl group, or an aryl group; $R_2$ represents an alkylene group, a cycloalkylene group, or an arylene group; $R_5$ and $R_6$ each independently represents a hydrogen atom, an alkyl group, a cycloalkyl group, an alkenyl group, or an aryl group, and $R_5$ and $R_6$ may be bonded to the carbon atom on $R_7$ to form a cyclic structure; and n represents 0 or 1.

(5) A polymer compound having a structure represented by formula (1) on a terminal of the polymer compound:

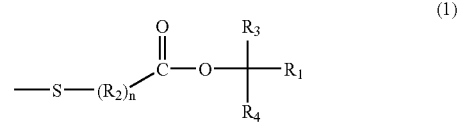

wherein $R_1$ represents an alkyl group, a cycloalkyl group, or an aryl group; $R_2$ represents an alkylene group, a cycloalkylene group, or an arylene group; $R_3$ and $R_4$ each independently represents a hydrogen atom, an alkyl group, a cycloalkyl group, an alkenyl group, or an aryl group, provided that at least one of $R_3$ and $R_4$ does not represent a hydrogen atom, and $R_3$ or $R_4$ may be bonded to contiguous $R_1$ to form a cyclic structure; and n represents 0 or 1.

(6) A polymer compound having a structure represented by formula (3) on a terminal of the polymer compoundl:

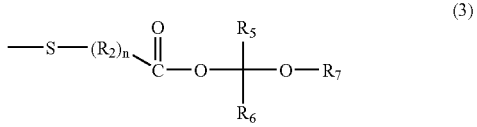

wherein $R_7$ represents an alkyl group, a cycloalkyl group, or an aryl group; $R_2$ represents an alkylene group, a cycloalkylene group, or an arylene group; $R_5$ and $R_6$ each independently represents a hydrogen atom, an alkyl group, a cycloalkyl group, an alkenyl group, or an aryl group, and $R_5$ and $R_6$ may be bonded to the carbon atom on $R_7$ to form a cyclic structure; and n represents 0 or 1.

(7) A manufacturing method of a polymer compound, comprising polymerizing a polymerizable compound having an ethylenic double bond by using a compound represented by formula (2) and a polymerization initiator:

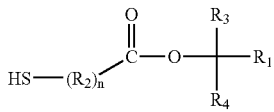

wherein $R_1$ represents an alkyl group, a cycloalkyl group, or an aryl group; $R_2$ represents an alkylene group, a cycloalkylene group, or an arylene group; $R_3$ and $R_4$ each independently represents a hydrogen atom, an alkyl group, a cycloalkyl group, an alkenyl group, or an aryl group, provided that at least one of $R_3$ and $R_4$ does not represent a hydrogen atom, and $R_3$ or $R_4$ may be bonded to contiguous $R_1$ to form a cyclic structure; and n represents 0 or 1.

(8) A compound represented by formula (2):

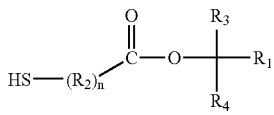

wherein $R_1$ represents an alkyl group, a cycloalkyl group, or an aryl group; $R_2$ represents an alkylene group, a cycloalkylene group, or an arylene group; $R_3$ and $R_4$ each independently represents a hydrogen atom, an alkyl group, a cycloalkyl group, an alkenyl group, or an aryl group, provided that at least one of $R_3$ and $R_4$ does not represent a hydrogen atom, and $R_3$ or $R_4$ may be bonded to contiguous $R_1$ to form a cyclic structure; and n represents 0 or 1.

(9) A pattern-forming method comprising: forming a photosensitive film with the positive photosensitive composition as described in the above items (1) to (4); and exposing and developing the photosensitive film.

DETAILED DESCRIPTION OF THE INVENTION

Figure 1:
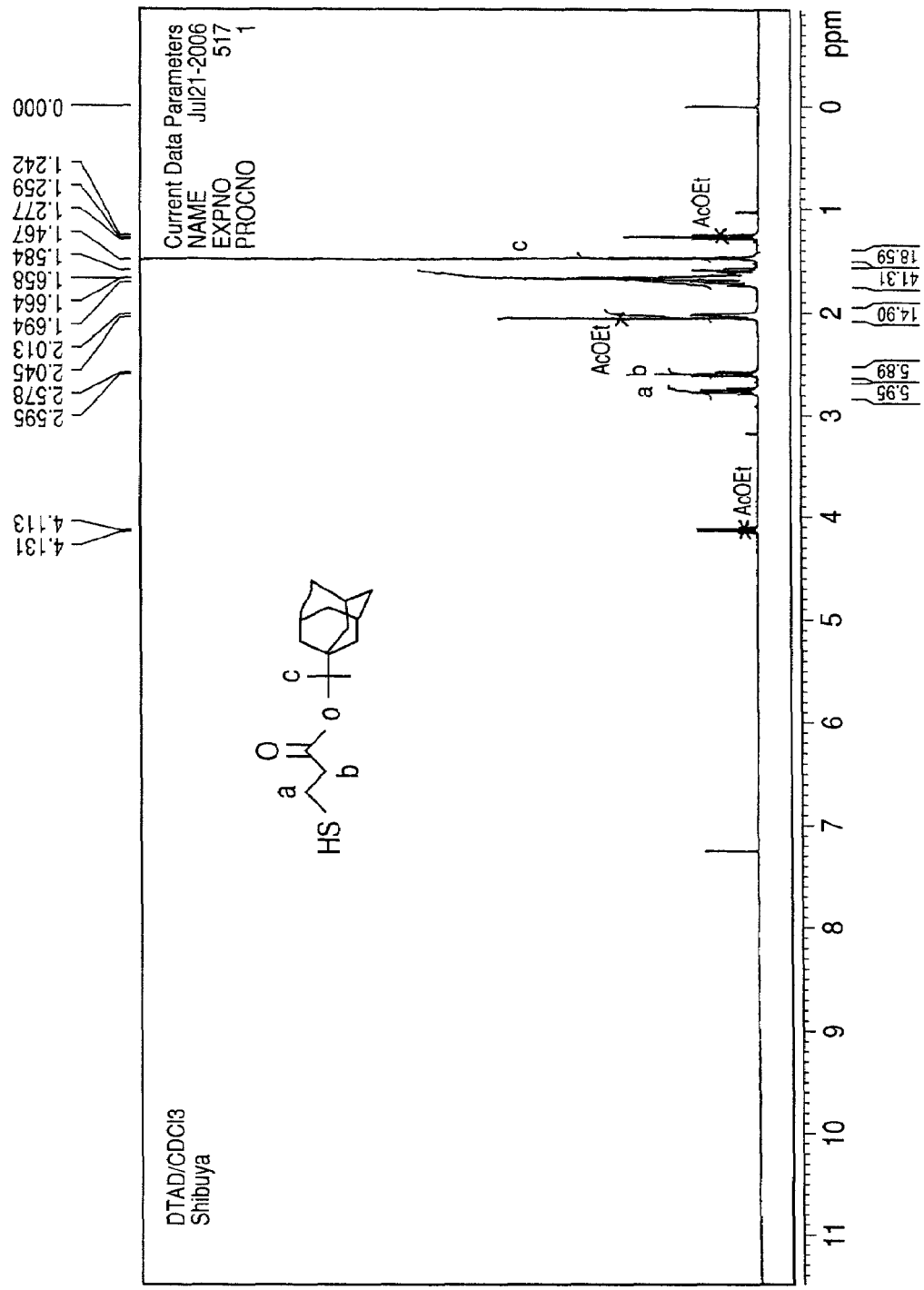
FIG. 1 is a graph showing $^1$H-NMR spectrum of compound (S1) synthesized in the invention.

The best mode for carrying out the invention will be described below.

In the description of a group (an atomic group) in the specification of the invention, the description not referring to substitution or unsubstitution includes both a group not having a substituent and a group having a substituent. For example, "an alkyl group" includes not only an alkyl group having no substituent (an unsubstituted alkyl group) but also an alkyl group having a substituent (a substituted alkyl group).

Further, "terminal" in the specification of the invention means a structure originating in the polymerization initiator, chain transfer agent and solvent used in the synthesis of a polymer.

A Polymer Compound Having an Acid-Decomposable Structure on the Terminal:

The positive photosensitive composition in the invention contains a polymer compound having an acid-decomposable structure on the terminal.

As the acid-decomposable structures on the terminal of a polymer compound, alkali-soluble groups such as a carboxyl group, a phenolic hydroxyl group, a sulfonic acid group, a thiol group and the like in which the hydrogen atom is protected with a group capable of being desorbed by the action of an acid can be exemplified.

As the groups capable of being desorbed by the action of an acid, for example, —C($R_{36}$)($R_{37}$)($R_{38}$), —C($R_{36}$)($R_{37}$)(O$R_{39}$), —C(=O)—O—C($R_{36}$)($R_{37}$)($R_{38}$), —C($R_{01}$)($R_{02}$)(O$R_{39}$), —C($R_{01}$)($R_{02}$)—C(=O)—O—C($R_{36}$)($R_{37}$)($R_{38}$), etc., can be exemplified.

In the formulae, $R_{36}$ to $R_{39}$ each independently represents an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represents a hydrogen atom, an alkyl group, a cycloalkyl group, an aryl group, an aralkyl group, or an alkenyl group.

The alkyl group represented by $R_{36}$ to $R_{39}$, $R_{01}$ and $R_{02}$ is preferably an alkyl group having from 1 to 8 carbon atoms, e.g., a methyl group, an ethyl group, a propyl group, an n-butyl group, a sec-butyl group, a hexyl group and an octyl group can be exemplified.

The cycloalkyl group represented by $R_{36}$ to $R_{39}$, $R_{01}$ and $R_{02}$ may be monocyclic or polycyclic. The monocyclic type cycloalkyl is preferably a cycloalkyl group having from 3 to 8 carbon atoms, e.g., a cyclopropyl group, a cyclobutyl group, a cyclopentyl group, a cyclohexyl group, a cyclooctyl group, etc., can be exemplified. The polycyclic type cycloalkyl is preferably a cycloalkyl group having from 6 to 20 carbon atoms, e.g., an adamantyl group, a norbornyl group, an isoboronyl group, a camphanyl group, a dicyclopentyl group, an α-pinel group, a tricyclodecanyl group, a tetracyclododecyl group, an androstanyl group, etc., can be exemplified. Incidentally, a part of the carbon atoms in the cycloalkyl group may be substituted with a hetero atom, such as an oxygen atom.

The aryl group represented by $R_{36}$ to $R_{39}$, $R_{01}$ and $R_{02}$ is preferably an aryl group having from 6 to 10 carbon atoms, e.g., a phenyl group, a naphthyl group, an anthryl group, etc., can be exemplified.

The aralkyl group represented by $R_{36}$ to $R_{39}$, $R_{01}$ and $R_{02}$ is preferably an aralkyl group having from 7 to 12 carbon atoms, e.g., a benzyl group, a phenethyl group, a naphthylmethyl group, etc., can be exemplified.

The alkenyl group represented by $R_{36}$ to $R_{39}$, $R_{01}$ and $R_{02}$ is preferably an alkenyl group having from 2 to 8 carbon atoms, e.g., a vinyl group, an allyl group, a butenyl group, a cyclohexenyl group, etc., can be exemplified.

As the structure of the terminal of a polymer compound, a structure represented by the following formula (1) is preferred.

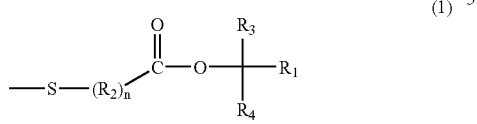

(1)

In formula (1), $R_1$ represents an alkyl group, a cycloalkyl group, or an aryl group.

$R_2$ represents an alkylene group, a cycloalkylene group, or an arylene group.

$R_3$ and $R_4$ each independently represents a hydrogen atom, an alkyl group, a cycloalkyl group, an alkenyl group, or an aryl group, provided that at least one of $R_3$ and $R_4$ does not represent a hydrogen atom, and $R_3$ or $R_4$ may be bonded to contiguous $R_1$ to form a cyclic structure.

n represents 0 or 1.

$R_1$ in formula (1) represents an alkyl group, a cycloalkyl group, or an aryl group, preferably an alkyl group having from 1 to 20 carbon atoms, a cycloalkyl group having from 3 to 20 carbon atoms, or an aryl group having from 1 to 20 carbon atoms, more preferably an alkyl group having from 1 to 4 carbon atoms, and a cycloalkyl group having from 6 to 20 carbon atoms are exemplified, and a cycloalkyl group having from 6 to 20 carbon atoms, e.g., a norbornane group and an adamantane group are especially preferred. The aryl group may have a hetero atom. As the aryl group having a hetero atom, for example, a monovalent thiazoline ring group (a group obtained by removing one hydrogen atom from a thiazoline ring, hereinafter the same), a monovalent oxazoline ring group, and a monovalent imidazoline ring group can be exemplified.

$R_2$ represents an alkylene group, a cycloalkylene group, or an arylene group, preferably an alkylene group having from 1 to 10 carbon atoms, a cycloalkylene group having from 3 to 10 carbon atoms, and an arylene group having from 1 to 10 carbon atoms are exemplified, and more preferably an alkylene group having from 6 to 10 carbon atoms, and a cycloalkylene group having from 6 to 10 carbon atoms are exemplified. The arylene group may have a hetero atom. As the arylene group having a hetero atom, for example, a divalent thiazoline ring group (a group obtained by removing two hydrogen atoms from a thiazoline ring, hereinafter the same), a divalent oxazoline ring group, and a divalent imidazoline ring group can be exemplified.

$R_3$ and $R_4$ each independently represents a hydrogen atom, an alkyl group, a cycloalkyl group, an alkenyl group, or an aryl group, preferably a methyl group, an ethyl group, a propyl group, and an isobutyl group are exemplified.

$R_1$, $R_2$, $R_3$ and $R_4$ may each have a substituent such as a hydroxyl group, an alkoxyl group, or a halogen atom.

As the cyclic structure formed by the bonding of $R_3$ or $R_4$ and contiguous $R_1$, for example, an adamantyl group and a cyclohexyl group can be exemplified.

The cyclic structure formed by the bonding of $R_3$ or $R_4$ and $R_1$ may have a substituent such as a hydroxyl group, an alkoxyl group, or a halogen atom.

Further, as the structure of the terminal of a polymer compound, a structure represented by the following formula (3) is preferred.

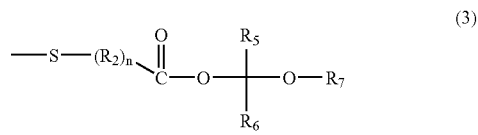

(3)

In formula (3), $R_7$ represents an alkyl group, a cycloalkyl group, or an aryl group; $R_2$ represents an alkylene group, a cycloalkylene group, or an arylene group; $R_5$ and $R_6$ each independently represents a hydrogen atom, an alkyl group, a cycloalkyl group, an alkenyl group, or an aryl group, and $R_5$ and $R_6$ may be bonded to the carbon atom on $R_7$ to form a cyclic structure; and n represents 0 or 1.

As the alkyl group, cycloalkyl group, and aryl group represented by $R_7$ in formula (3), the same groups as the alkyl group, cycloalkyl group, and aryl group represented by $R_1$ in formula (1) can be exemplified; $R_2$ is the same as $R_2$ in formula (1); as the alkyl group, cycloalkyl group, alkenyl group, and aryl group represented by $R_5$ and $R_6$, the same groups as the alkyl group, cycloalkyl group, alkenyl group, and aryl group represented by $R_3$ and $R_4$ in formula (1) can be exemplified A Compound Represented by Formula (2):

The polymer compound having a structure represented by formula (1) on the terminal can be manufactured by polymerizing a polymerizable compound having an ethylenic double bond by using a compound represented by the following formula (2) and a polymerization initiator.

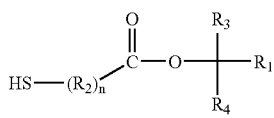
(2)

In formula (2), $R_1$ represents an alkyl group, a cycloalkyl group, or an aryl group.

$R_2$ represents an alkylene group, a cycloalkylene group, or an arylene group.

$R_3$ and $R_4$ each independently represents a hydrogen atom, an alkyl group, a cycloalkyl group, an alkenyl group, or an aryl group, provided that at least one of $R_3$ and $R_4$ does not represent a hydrogen atom, and $R_3$ or $R_4$ may be bonded to contiguous $R_1$ to form a cyclic structure.

n represents 0 or 1.

$R_1$ to $R_4$ and n in formula (2) are the same as $R_1$ to $R_4$ and n in formula (1).

The compound represented by formula (2) is a novel compound.

The compound represented by formula (2) can be synthesized according to the method disclosed, e.g., in JP-A-2006-91762 or WO 2005/085301A1.

A compound represented by formula (4):

A polymer compound having a structure represented by formula (3) on the terminal can be manufactured by polymerizing a polymerizable compound having an ethylenic double bond with a compound represented by the following formula (4) and a polymerization initiator.

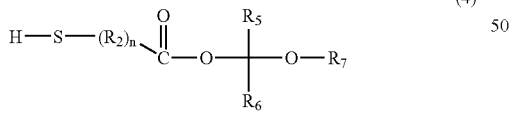
(4)

In formula (4), $R_7$ represents an alkyl group, a cycloalkyl group, or an aryl group; $R_2$ represents an alkylene group, a cycloalkylene group, or an arylene group; $R_5$ and $R_6$ each independently represents a hydrogen atom, an alkyl group, a cycloalkyl group, an alkenyl group, or an aryl group, and $R_5$ and $R_6$ may be bonded to the carbon atom on $R_7$ to form a cyclic structure; and n represents 0 or 1.

$R_7$, $R_2$, $R_5$, $R_6$ and n in formula (4) each has the same meaning as $R_7$, $R_2$, $R_5$, $R_6$ and n in formula (3).

The specific examples (S1) to (S36) of the compounds represented by formula (2) or (4) are shown below, but the invention is not restricted thereto.

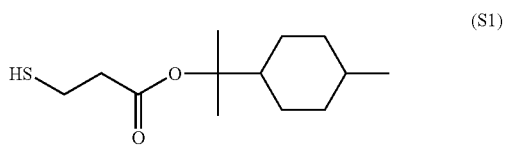
(S1)

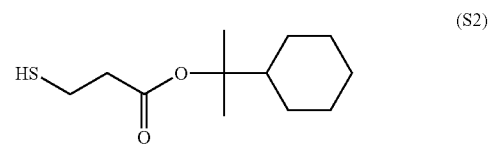
(S2)

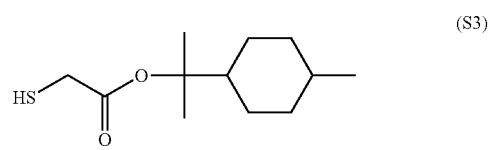
(S3)

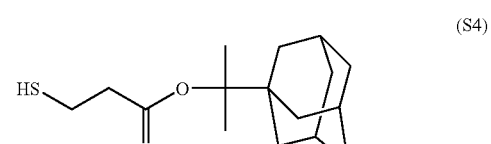
(S4)

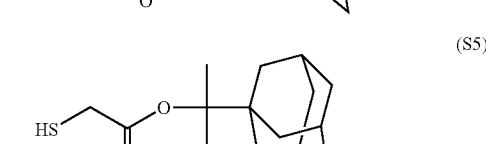
(S5)

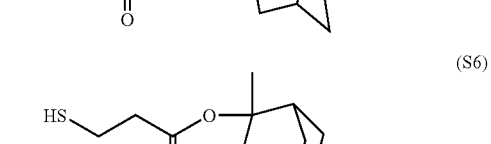
(S6)

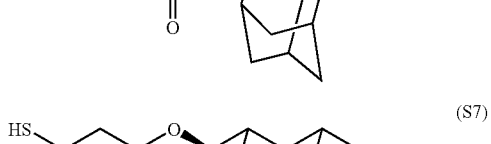
(S7)

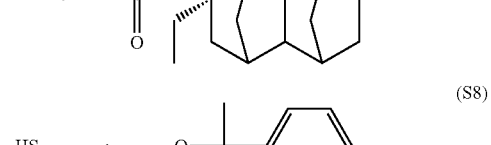
(S8)

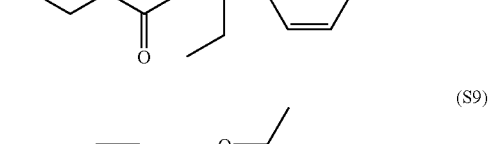
(S9)

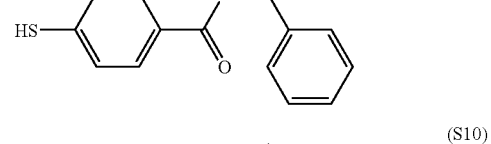
(S10)

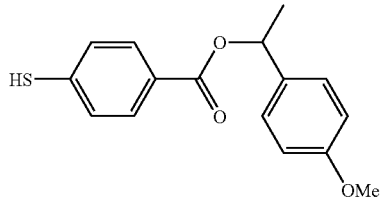

-continued
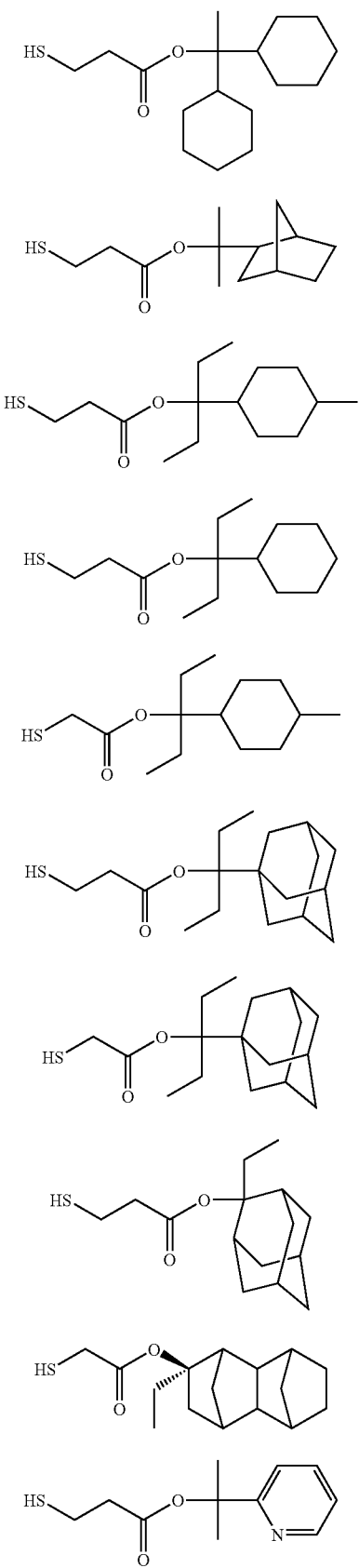
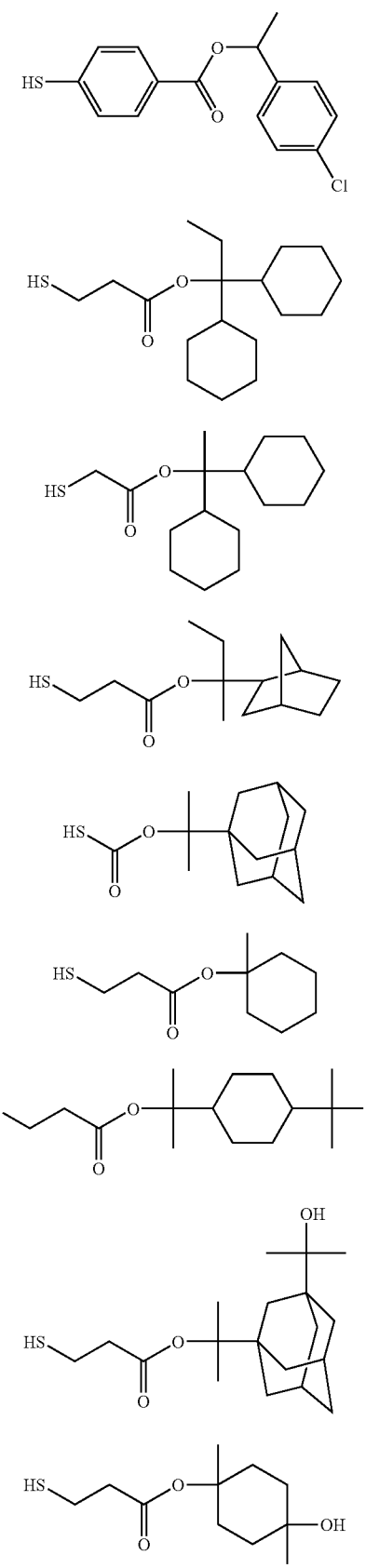

-continued

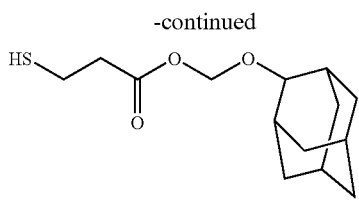 (S30)

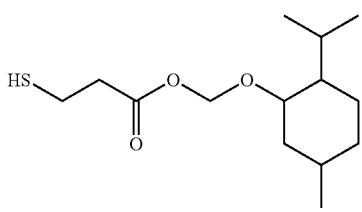 (S31)

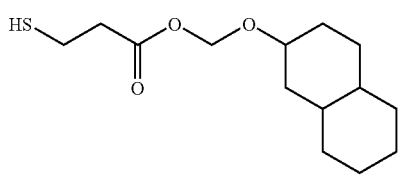 (S32)

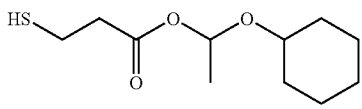 (S33)

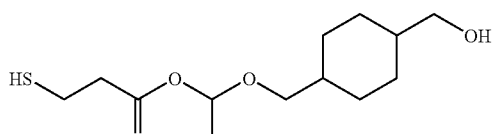 (S34)

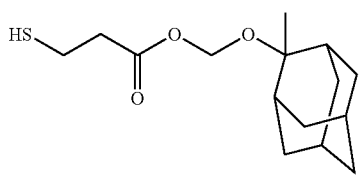 (S35)

-continued (S36)

Polymerization Initiator:

The polymerization initiators for use in the manufacturing method of the polymer compound in the invention are not especially restricted so long as they are compounds generally used as radical generators. For example, azo compounds, e.g., 2,2'-azobisisobutyronitrile, 2,2'-azobis-(2-methylbutyronitrile), 2,2'-azobisisodimethylbutyrate, 1,1'-azobis(cyclohexane-1-carbonitrile), 4,4'-azobis(4-cyanovaleric acid), etc.; and organic peroxides, e.g., decanoyl peroxide, lauroyl peroxide, benzoyl peroxide, bis(3,5,5-trimethylhexanoyl)peroxide, succinic acid peroxide, t-butylperoxy-2-ethylhexanoate, etc., are exemplified, and these compounds can be used alone or as mixture.

Addition Molar Ratio of Compound (S) Represented by Formula (2) or (4) and Polymerization Initiator (I):

In the manufacturing method of the polymer compound in the invention, the use amount of the compound (S) represented by formula (2) or (4) and polymerization initiator (I) is preferably 10.0 or less in the addition molar ratio (I/S). By making the addition molar ratio (I/S) 10.0 or less, the proportion of the polymer having the residue derived from the polymerization initiator having been introduced to the terminal of the main chain of the polymer compound is reduced, and dissolution accelerating effect of the acid-decomposable structure introduced to the terminal in the exposed area can be sufficiently brought out.

A telomerization reaction utilizing a chain transfer agent, e.g., a mercapto compound, generally progresses according to the following scheme, so that the molar ratio of the polymerization initiator and the chain transfer agent at first time is very important as the unit introduced into the polymer terminal.

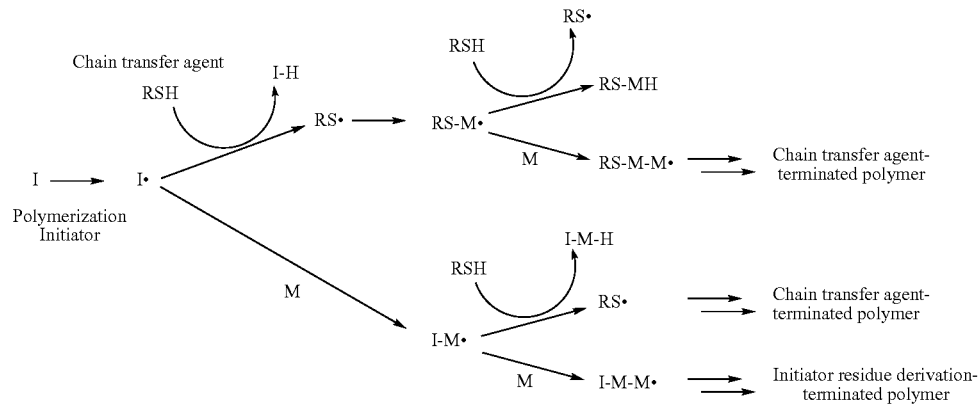

Addition molar ratio (I/S) in the invention is preferably 100 or less, more preferably 0.5 or less, and in view of the above scheme, still more preferably 1.0 or less, and especially preferably 0.5 or less. The proportion of the structure represented by formula (1) or (3) (an acid-decomposable structure) introduced into the main chain terminal in the polymer compound obtained in the case where (I/S) is 1.0 or less is higher than the proportion of the polymer compound to which the residue derived from the polymerization initiator is introduced, so that particularly preferred. By taking such an addition molar ratio, when the polymer compound manufactured according to the method of the invention is used as a resist composition, dissolution accelerating effect by breaking of the terminal acid is revealed more largely, dissolution contrast between the exposed area and the unexposed area is improved, and sensitivity can be increased as compared with conventional resist compositions. The improving effect of falling down of a pattern by the flattening of a resist pattern at the interface of the exposed part and the unexposed part can be exhibited more conspicuously.

The compound represented by formula (2) or (4) is preferably used in the range of from 0.1 to 50 mol % based on all the mol number of the polymerizable compound having an ethylenic double bond (monomer), preferably from 1 to 30 mol %, and especially preferably from 2.5 to 10 mol %. The more the addition amount of the compound represented by formula (2) or (4), the more is the content of the structure represented by formula (1) or (3) in the polymer compound, but the smaller is the molecular weight of the polymer compound to be obtained. Accordingly, in using the polymer compound of the invention as a resist composition, the addition amount of the above range is preferred. Further, polymerization initiators differ by the monomers used in the polymerization reaction, the kinds and amounts of chain transfer agents, polymerization temperature, and the polymerization conditions of polymerization solvents, so that the use amount of polymerization initiators cannot be prescribed unconditionally. However, the amount is selected, besides satisfying the above addition molar ratio (I/S), from the range of 0.1 to 120 mol % (from 0.001 to 1.2 showing in the addition molar ratio (I/S)) per mol of the chain transfer agent, preferably from 1 to 50 mol % (from 0.01 to 0.5 showing in the addition molar ratio (I/S)), and more preferably from 10 to 30 mol % (from 0.1 to 0.3 showing in the addition molar ratio (I/S)).

Polymerizable Compound (Monomer) Having an Ethylenic Double Bond:

The material monomers for use in manufacturing the polymer compound of the invention are not particularly restricted reactionally so long as they are polymerizable compounds (monomers) having an ethylenic double bond, however the polymer compound is preferably a positive photosensitive resin in which the acid-dissociating protective group is dissociated by the action of an acid to increase solubility in an alkali developing solution. For that purpose, it is preferred for the polymer compound to have at least constituent unit (A) having a structure capable of dissociating by the action of an acid to increase solubility in an alkali developing solution.

Constituent unit (A) having a structure capable of dissociating by the action of an acid to increase solubility in an alkali developing solution means the structures conventionally generally used as resists. Constituent unit (A) can be obtained by polymerization of a monomer having a structure capable of dissociating by the action of an acid to increase solubility in an alkali developing solution, or by polymerization of a monomer having an alkali-soluble structure and then protecting the alkali-soluble group with an acid dissociating group.

Constituent unit (A) having a structure capable of dissociating by the action of an acid to increase solubility in an alkali developing solution is preferably at least one kind of a constituent unit selected from the group consisting of a constituent unit having a partial structure containing alicyclic hydrocarbon represented by any of the following formulae (pI) to (pV), and a constituent unit represented by the following formula (II-AB).

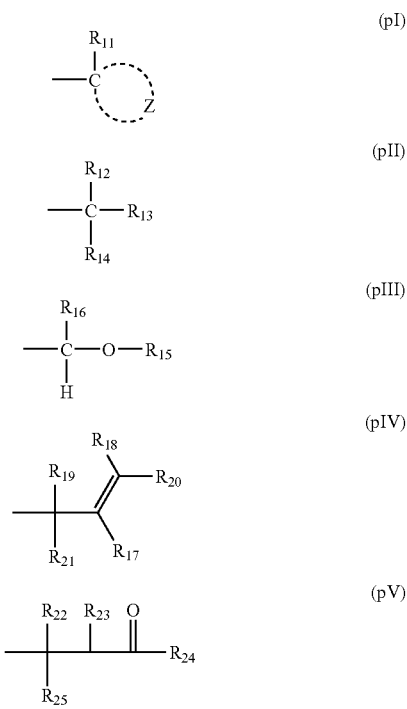

In formulae (pI) to (pV), $R_{11}$ represents an alkyl group.

Z represents an atomic group necessary to form a cycloalkyl group together with a carbon atom.

$R_{12}$, $R_{13}$, $R_{14}$, $R_{15}$ and $R_{16}$ each independently represents an alkyl group or a cycloalkyl group.

$R_{17}$, $R_{18}$, $R_{19}$, $R_{20}$ and $R_{21}$ each independently represents a hydrogen atom, an alkyl group having from, or a cycloalkyl group.

$R_{22}$, $R_{23}$, $R_{24}$ and $R_{25}$ each independently represents a hydrogen atom, an alkyl group, or a cycloalkyl group, and $R_{23}$ and $R_{24}$ may be bonded to each other to form a ring.

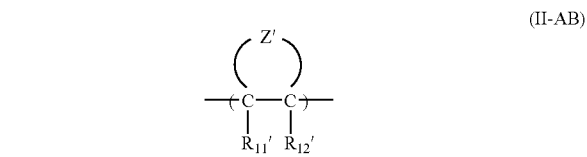

In formula (II-AB), $R_{11}'$ and $R_{12}'$ each independently represents a hydrogen atom, a cyano group, a halogen atom, or an alkyl group.

Z' contains bonded two carbon atoms (C—C) and represents an atomic group to form an alicyclic structure.

Formula (II-AB) is preferably formula (II-AB1) or (II-AB2).

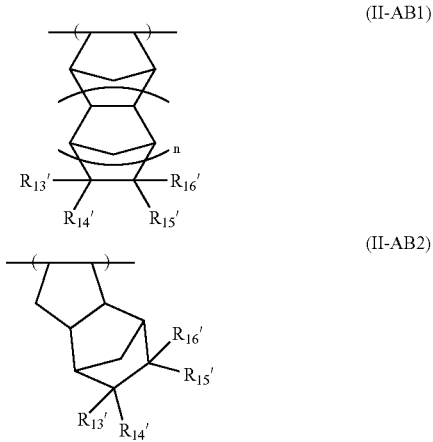

In formulae (II-AB1) and (II-AB2), $R_{13}'$, $R_{14}'$, $R_{15}'$ and $R_{16}'$ each independently represents a hydrogen atom, a halogen atom, a cyano group, —COOH, —COOR$_5$, a group capable of decomposing by the action of an acid, —C(=O)—X—A'—R$_{17}'$, an alkyl group, or a cycloalkyl group, and at least two of $R_{13}'$ to $R_{16}'$ may be bonded to form a ring.

$R_5$ represents an alkyl group, a cycloalkyl group, or a group having a lactone structure.

X represents an oxygen atom, a sulfur atom, —NH—, —NHSO$_2$—, or —NHSO$_2$NH—.

A' represents a single bond or a divalent linking group.

$R_{17}'$ represents —COOH, —COOR$_5$, —CN, a hydroxyl group, an alkoxyl group, —CO—NH—R$_6$, —CO—NH—SO$_2$—R$_6$, or a group having a lactone structure.

$R_6$ represents an alkyl group or a cycloalkyl group.

n represents 0 or 1.

In formulae (pI) to (pV), the alkyl group represented by $R_1$ to $R_{25}$ is preferably a straight chain or branched alkyl group having from 1 to 4 carbon atoms.

The cycloalkyl groups represented by $R_{12}$ to $R_{25}$ or the cycloalkyl groups formed by Z and carbon atoms may be monocyclic or polycyclic. Specifically, groups having a monocyclic, bicyclic, tricyclic or tetracyclic structure having 5 or more carbon atoms can be exemplified. The carbon atom number of these cycloalkyl groups is preferably from 6 to 30, and especially preferably from 7 to 25.

As preferred cycloalkyl groups, an adamantyl group, a noradamantyl group, a decalin residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group, and a cyclododecanyl group can be exemplified. More preferred cycloalkyl groups are an adamantyl group, a norbornyl group, a cyclohexyl group, a cyclopentyl group, a tetracyclododecanyl group, and a tricyclodecanyl group.

These alkyl groups and cycloalkyl groups may further have a substituent.

As the substituents of the alkyl groups and cycloalkyl groups, an alkyl group (having from 1 to 4 carbon atoms), a halogen atom, a hydroxyl group, an alkoxyl group (having from 1 to 4 carbon atoms), a carboxyl group, and an alkoxycarbonyl group (having from 2 to 6 carbon atoms) can be exemplified. As the substituents that these alkyl group, alkoxyl group and alkoxycarbonyl group may further have, a hydroxyl group, a halogen atom and an alkoxyl group can be exemplified.

In formulae (pI) to (pV), it is preferred that $R_{11}$, or at least one of $R_{12}$ to $R_{14}$, or $R_{16}$, or at least one of $R_{19}$ and $R_{21}$, or at least one of $R_{22}$ and $R_{25}$ represents a methyl group.

The structures represented by formulae (pI) to (pV) in the above resins can be used for the protection of the alkali-soluble groups. As the alkali-soluble groups, various groups known in this technical field can be exemplified.

Specifically, such structures that the hydrogen atoms of a carboxylic acid group, a sulfonic acid group, a phenol group and a thiol group are substituted with the structures represented by any of formulae (pI) to (pV) are exemplified, and preferably the structures that the hydrogen atoms of a carboxylic acid group and a sulfonic acid group are substituted with the structures represented by any of formulae (pI) to (pV) are exemplified.

As the constituent unit having the alkali-soluble group protected with the structure represented by any of formulae (pI) to (pV), a constituent unit represented by the following formula (PA-A) is preferred.

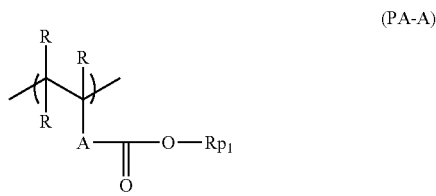

In formula (PA-A), R represents a hydrogen atom, a halogen atom, or a straight chain or branched alkyl group having from 1 to 4 carbon atoms. A plurality of R's may be the same or different.

A represents a single group or a combination comprising two or more groups selected from the group consisting of a single bond, an alkylene group, an ether group, a thioether group, a carbonyl group, an ester group, an amido group, a sulfonamido group, a urethane group, and a urea group, and preferably a single bond.

$Rp_1$ represents a group represented by any of formulae (pI) to (pV).

The constituent unit represented by formula (pA-A) is preferably a constituent unit by 2-alkyl-2-adamantyl (meth)acrylate, or dialkyl(1-adamantyl)methyl (meth)acrylate.

The specific examples of the constitutional units represented by formula (pA-A) are shown below, but the invention is not restricted to these compounds.

(In the formulae, Rx represents H, CH$_3$, CF$_3$ or CH$_2$OH, and Rxa and Rxb each represents an alkyl group having from 1 to 4 carbon atoms.)

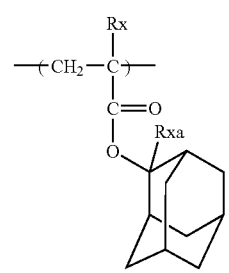

-continued
2
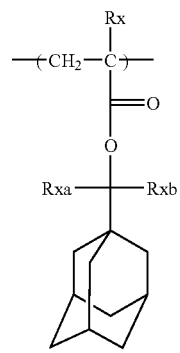
3
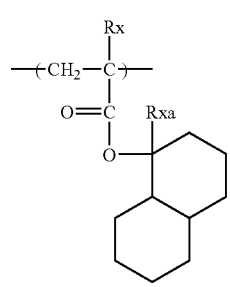
4
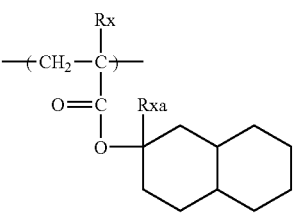
5
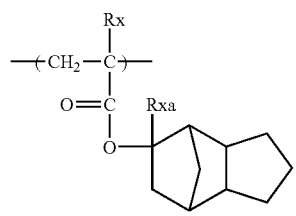
6
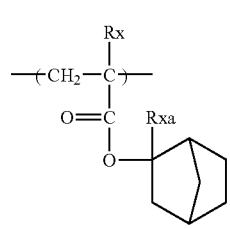
7
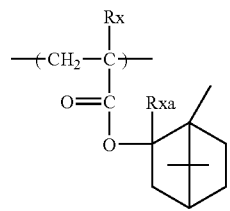
-continued
8
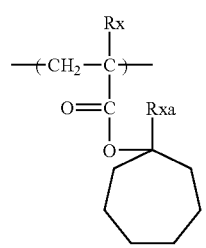
9
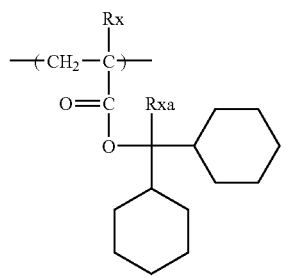
10
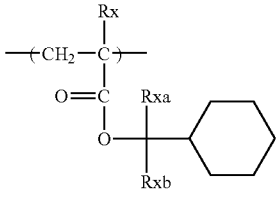
11
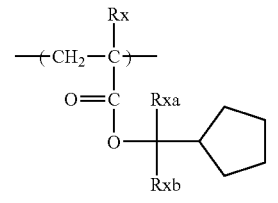
12
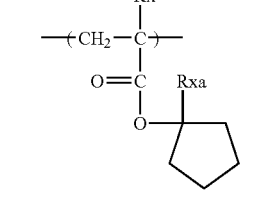
13
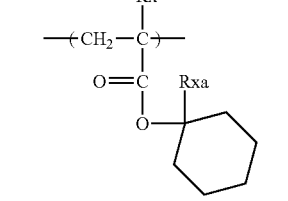
14
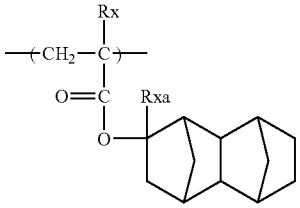

-continued

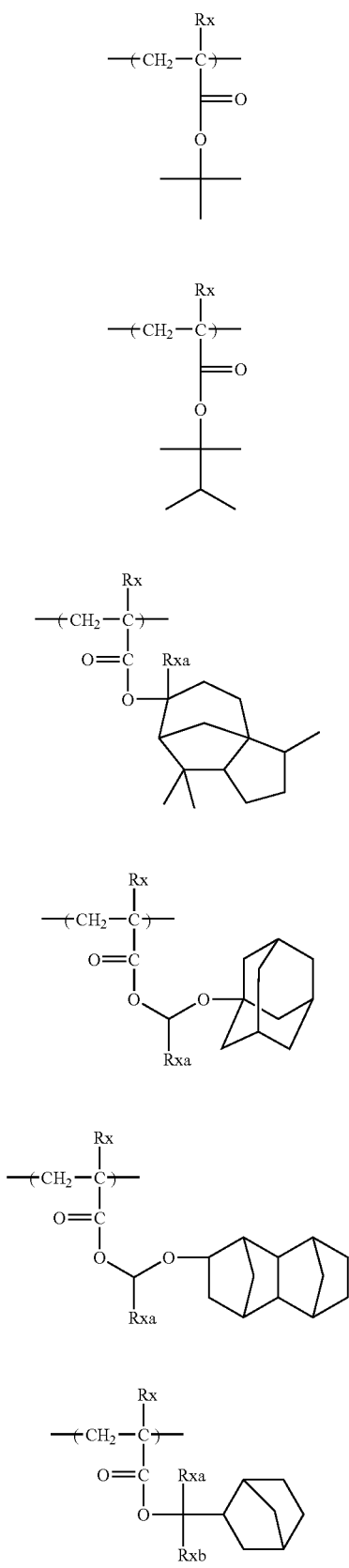

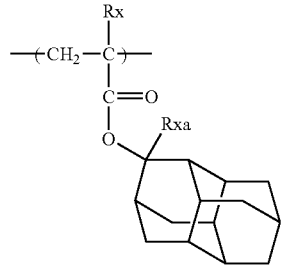

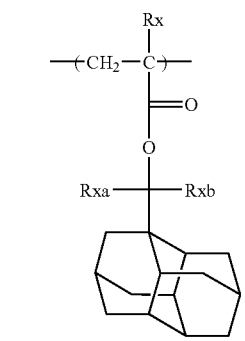

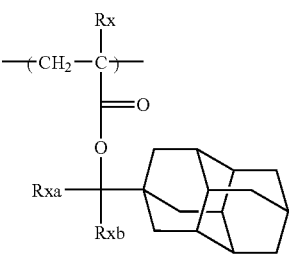

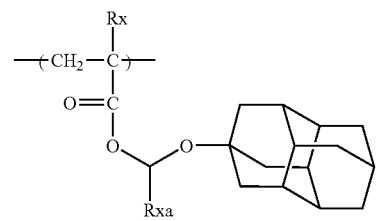

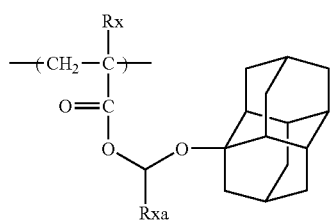

As the halogen atoms represented by $R_{11}'$ and $R_{12}'$ in formula (II-AB), a chlorine atom, a bromine atom, a fluorine atom and an iodine atom are exemplified.

As the alkyl groups represented by $R_{11}'$ and $R_{12}'$, straight chain or branched alkyl groups having from 1 to 10 carbon atoms are exemplified.

The atomic group for forming an alicyclic structure represented by Z' is an atomic group to form a constituent unit of alicyclic hydrocarbon that may have a substituent in the resin, and an atomic group to form a bridged alicyclic structure for forming a bridged alicyclic hydrocarbon constituent unit is especially preferred.

As the skeleton of the alicyclic hydrocarbon to be formed, the same cycloalkyl groups as represented by $R_{12}$ to $R_{25}$ in formulae (pI) to (pV) are exemplified.

The skeleton of the alicyclic hydrocarbon may have a substituent, and as the substituents, the groups represented by $R_{13}'$ to $R_{16}'$ in formula (II-AB1) or (II-AB2) can be exemplified.

In the polymer compound in the invention, a group capable of decomposing by the action of an acid can be contained in at least one constituent unit of the constituent unit having a partial structure containing the alicyclic hydrocarbon represented by any of formulae (pI) to (pV), the constituent unit represented by formula (II-AB), and a constituent unit of the later-described copolymer component.

Acid-decomposable constituent units may be used by one kind alone, but it is preferred to use two or more kinds of acid-decomposable constituent units different in carbon atom number of acid-desorption groups in combination, by which the balance of resolution and exposure latitude is improved.

Various substituents of $R_{13}'$ to $R_{16}'$ in formula (II-AB1) or (II-AB2) can also be used as the substituents of the atomic group to form an alicyclic structure, or atomic group Z' to form a bridged alicyclic structure in formula (II-AB).

The specific examples of the constituent units represented by formula (II-AB1) or (II-AB2) are shown below, but the invention is not restricted to these specific examples.

[II-1]
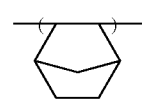

[II-2]
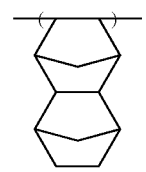

[II-3]
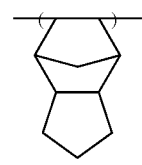

[II-4]
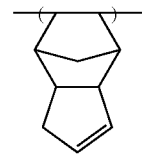

[II-5]

[II-6]
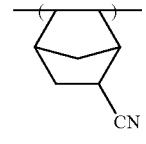

-continued

[II-7]
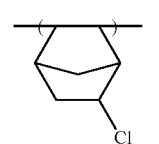

[II-8]
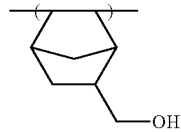

[II-9]
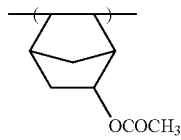

[II-10]
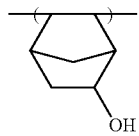

[II-11]
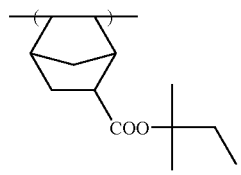

[II-12]
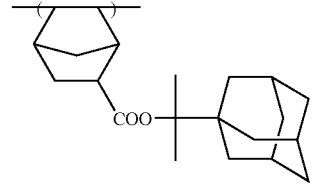

[II-13]
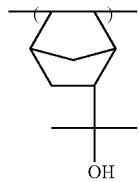

[II-14]
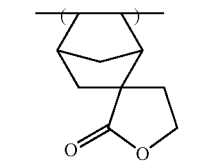

[II-15]
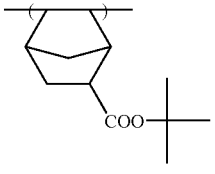

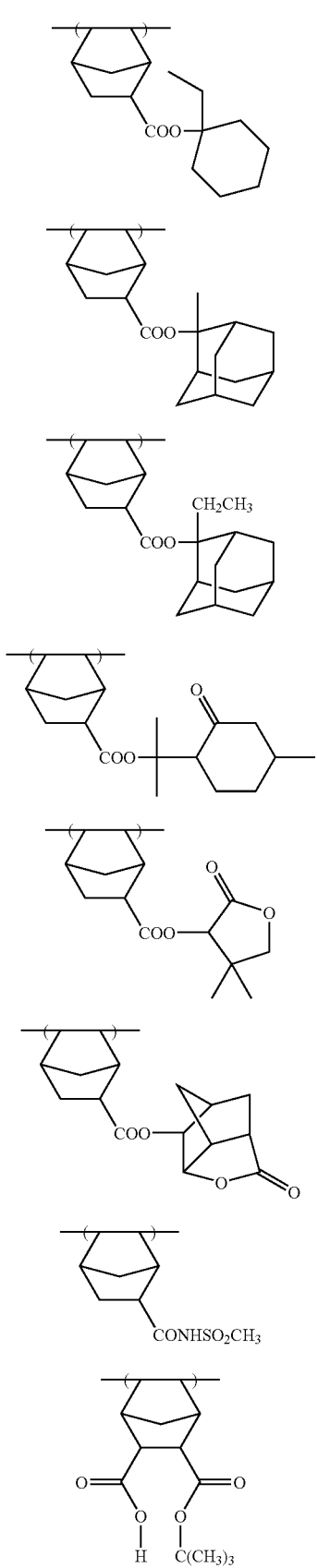
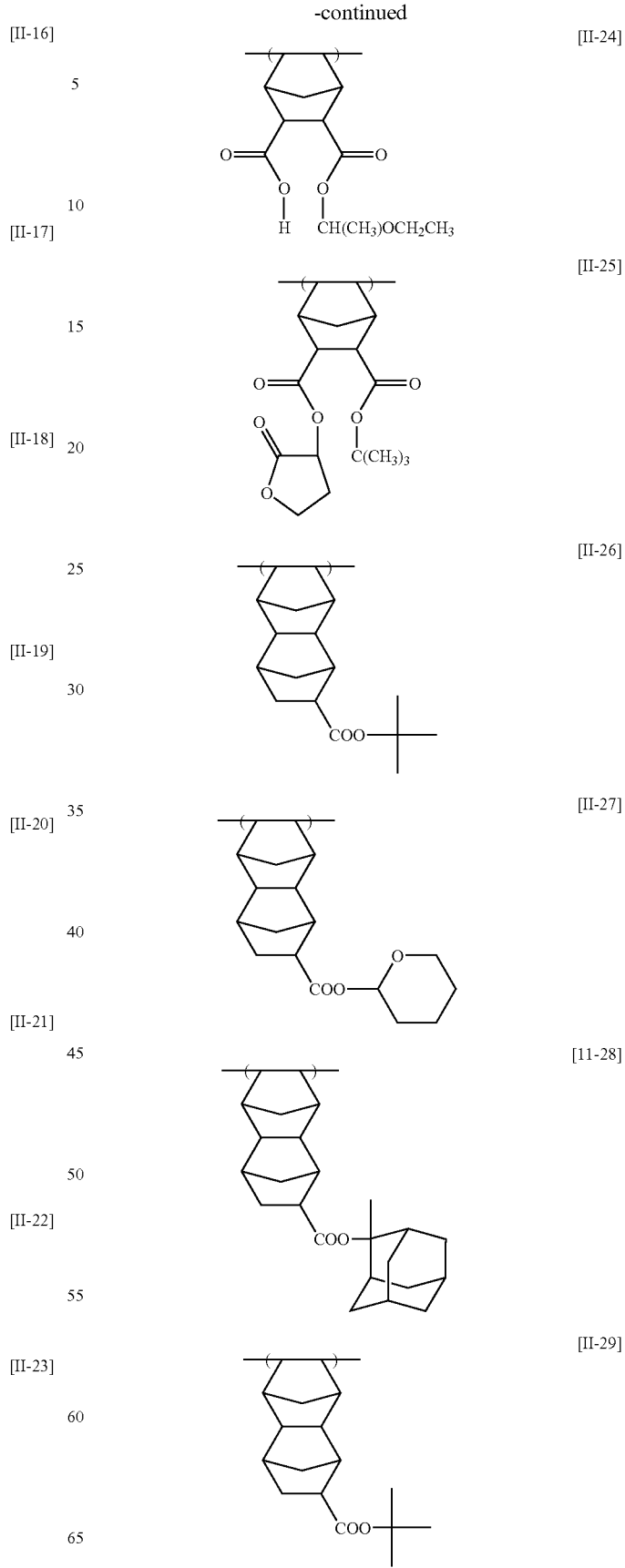

-continued

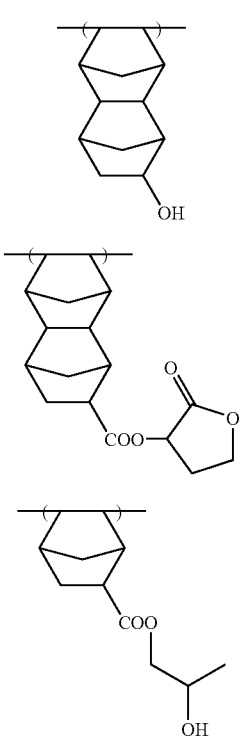

[II-30]

[II-31]

[II-32]

Constituent unit (A) is preferably a constituent unit having a monocyclic alicyclic hydrocarbon group.

It is preferred for the polymer compound manufactured according to the manufacturing method of the invention to have a lactone group. As the lactone group, any group having a lactone structure can be used, but groups having a 5- to 7-membered ring lactone structure are preferred, and groups having a 5- to 7-membered ring lactone structure condensed with other ring structures in the form of forming a bicyclo structure or a spiro structure are preferred. It is more preferred to have a constituent unit having a group having a lactone structure represented by any of the following formulae (LC1-1) to (LC1-16). A group having a lactone structure may be directly bonded to the main chain of the constituent unit. Preferred lactone structures are (LC1-1), (LC1-4), (LC1-5), (LC1-6), (LC1-13) and (LC1-14). By the use of a specific lactone structure, line edge roughness and development defect are bettered.

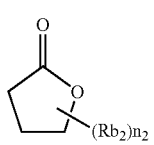

LC1-1

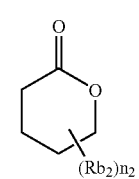

LC1-2

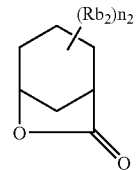

LC1-3

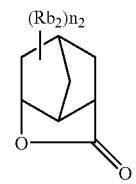

LC1-4

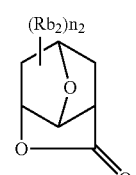

LC1-5

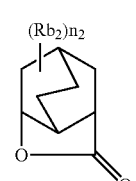

LC1-6

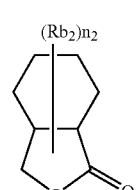

LC1-7

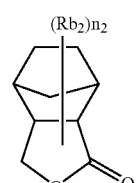

LC1-8

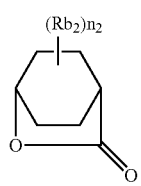

LC1-9

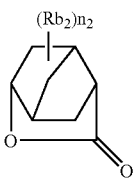

LC1-10

LC1-11
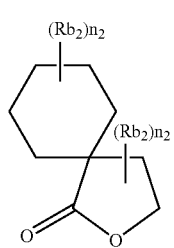

LC1-12
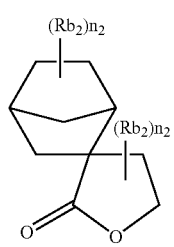

LC1-13
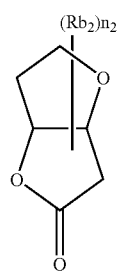

LC1-14
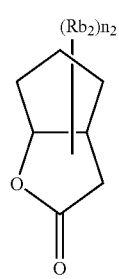

LC1-15
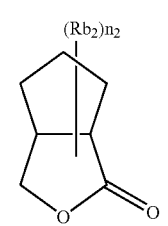

LC1-16
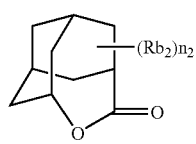

A lactone structure moiety may have or may not have a substituent ($Rb_2$). As preferred substituent ($Rb_2$), an alkyl group having from 1 to 8 carbon atoms, a cycloalkyl group having from 4 to 7 carbon atoms, an alkoxyl group having from 1 to 8 carbon atoms, an alkoxycarbonyl group having from 1 to 8 carbon atoms, a carboxyl group, a halogen atom, a hydroxyl group, a cyano group, and an acid-decomposable group are exemplified. $n_2$ represents an integer of from 0 to 4. When $n_2$ is 2 or more, a plurality of $Rb_2$'s may be the same or different, and a plurality of $Rb_2$'s may be bonded to each other to form a ring.

As the constituent units having a group having a lactone structure represented by any of formulae (LC1-1) to (LC1-16), a constituent unit represented by formula (II-AB1) or (II-AB2) in which at least one of $R_{13}'$ to $R_{16}'$ has a group represented by any of formulae (LC1-1) to (LC1-16) (for example, $R_5$ of —$COOR_5$ represents a group represented by any of formulae (LC1-1) to (LC1-16)), or a constituent unit represented by the following formula (AI) can be exemplified.

$$\underset{COO-Ab-V}{\overset{Rb_0}{\diagup\!\!\!\!\diagdown}} \qquad (AI)$$

In formula (AI), $Rb_0$ represents a hydrogen atom, a halogen atom, or an alkyl group having from 1 to 4 carbon atoms. As the preferred substituents that the alkyl group represented by $Rb_0$ may have, a hydroxyl group and a halogen atom are exemplified. As the halogen atom represented by $Rb_0$, a fluorine atom, a chlorine atom, a bromine atom and an iodine atom can be exemplified. $Rb_0$ preferably represents a hydrogen atom or a methyl group.

Ab represents a single bond, an alkylene group, a divalent linking group having a monocyclic or polycyclic alicyclic hydrocarbon structure, an ether group, an ester group, a carboxyl group, or a divalent linking group combining these groups. Ab preferably represents a single bond or a linking group represented by —$Ab_1$—$CO_2$—. $Ab_1$ represents a straight chain or branched alkylene group, or a monocyclic or polycyclic cycloalkylene group, and preferably a methylene group, an ethylene group, a cyclohexylene group, an adamantylene group, or a norbornylene group.

V represents a group represented by any of formulae (LC1-1) to (LC1-16).

Constituent units having a lactone structure generally have optical isomers, and any optical isomers may be used. One kind of optical isomer may be used alone, or a plurality of optical isomers may be used as mixture. When one kind of optical isomer is mainly used, the optical purity (ee) of the optical isomer is preferably 90 or more, and more preferably 95 or more.

The content of the constituent unit having a lactone structure is preferably from 15 to 60 mol % based on all the constituent units in the polymer, more preferably from 20 to 50 mol %, and still more preferably from 30 to 50 mol %.

The specific examples of constituent units having a group having a lactone structure are shown below, but the invention is not restricted thereto.

(In the formulae, Rx represents H, CH₃, CH₂OH or CF₃.)
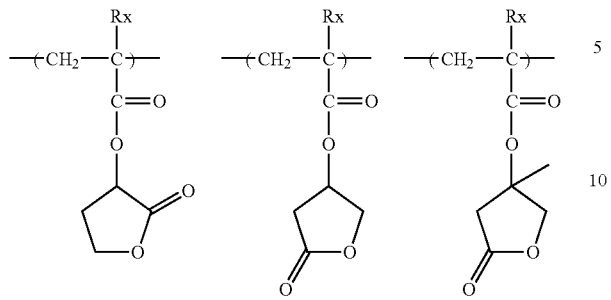
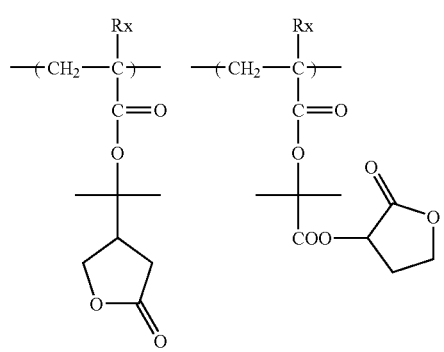
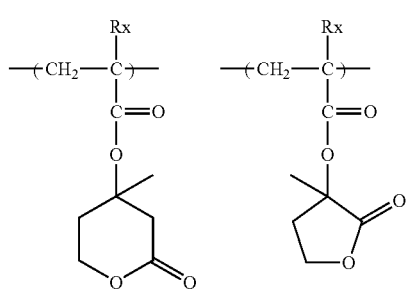
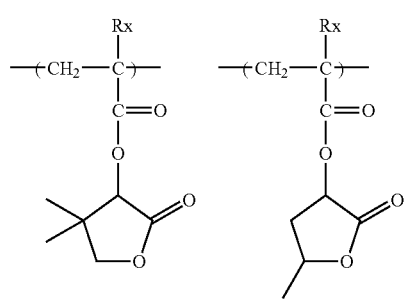
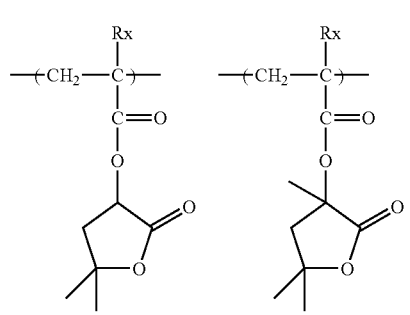
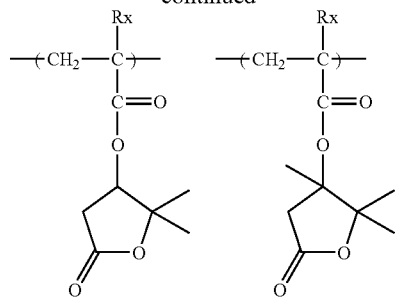
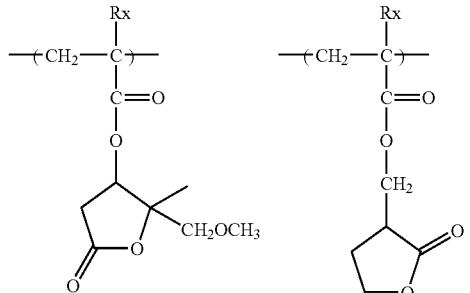
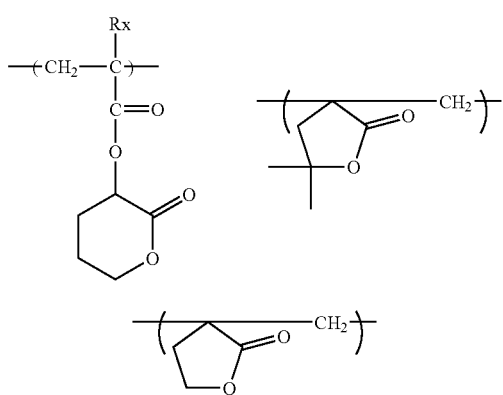
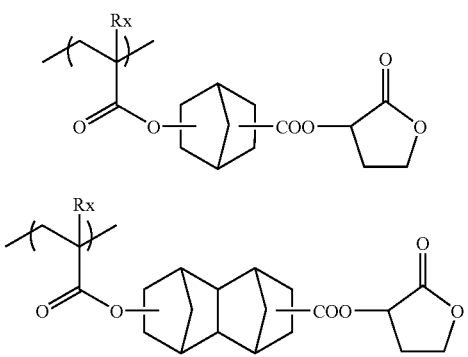
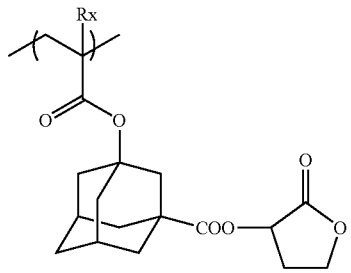

(In the formulae, Rx represents H, CH₃, CH₂OH or CF₃.)
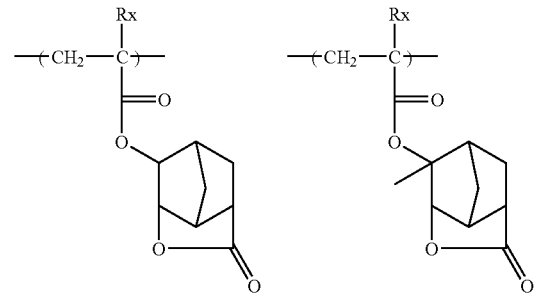
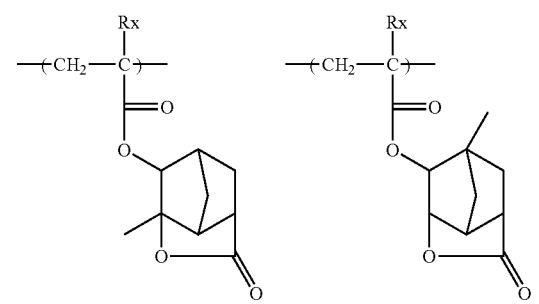
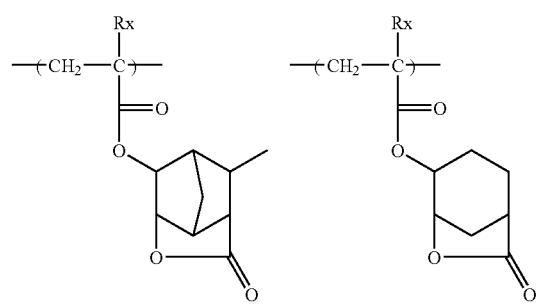
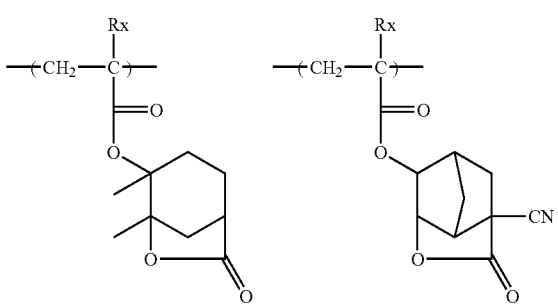
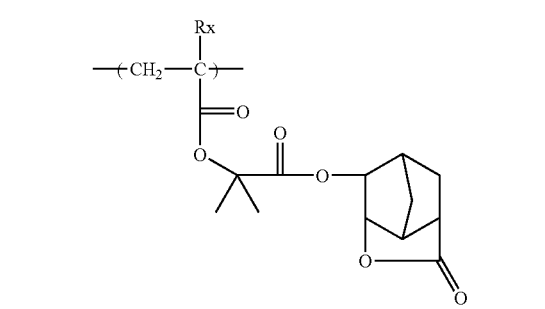
-continued
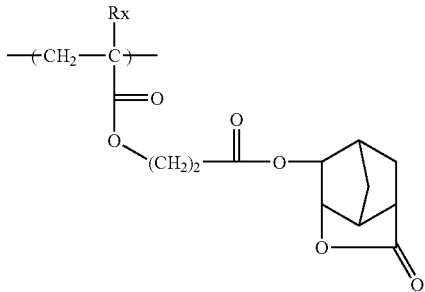
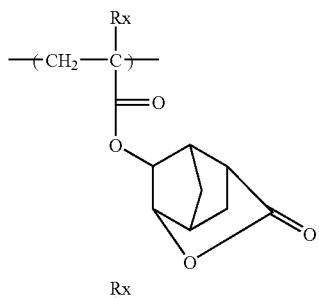
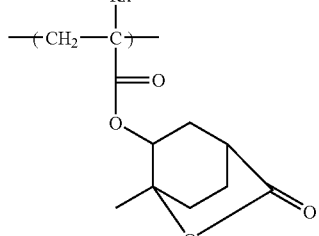
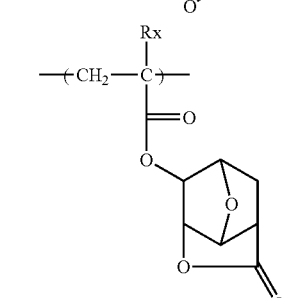
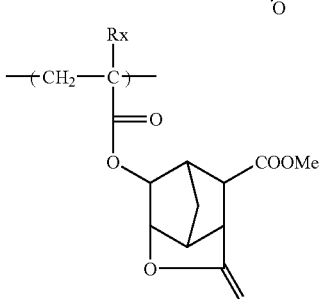
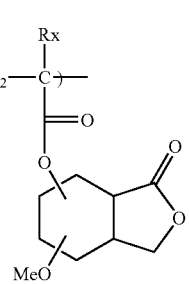

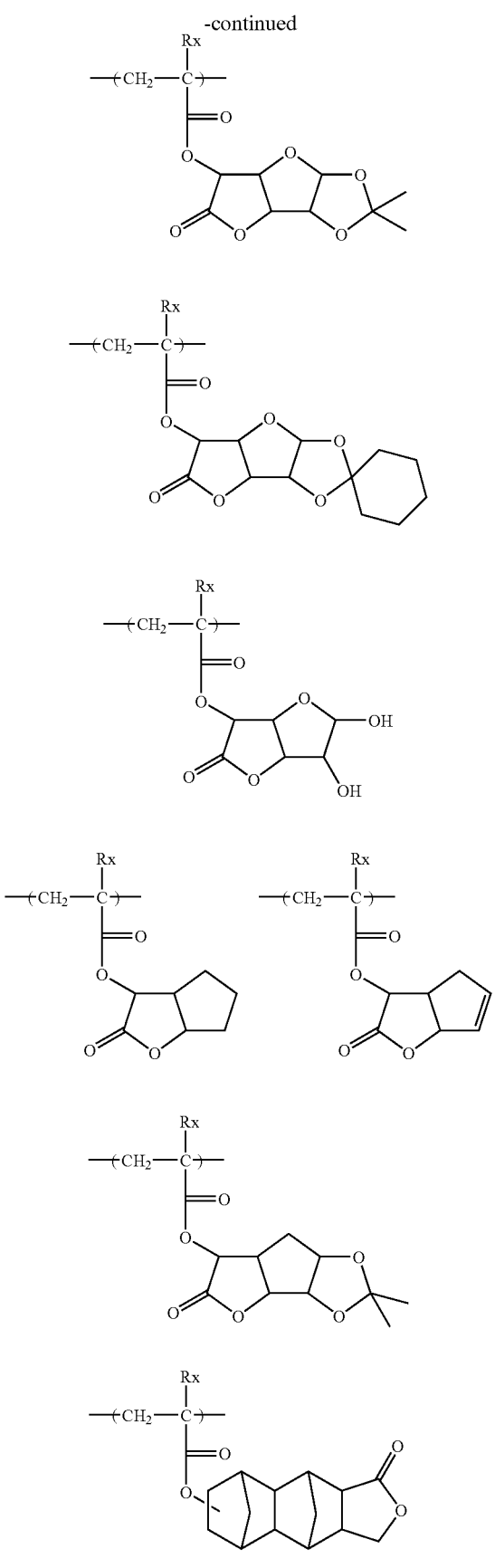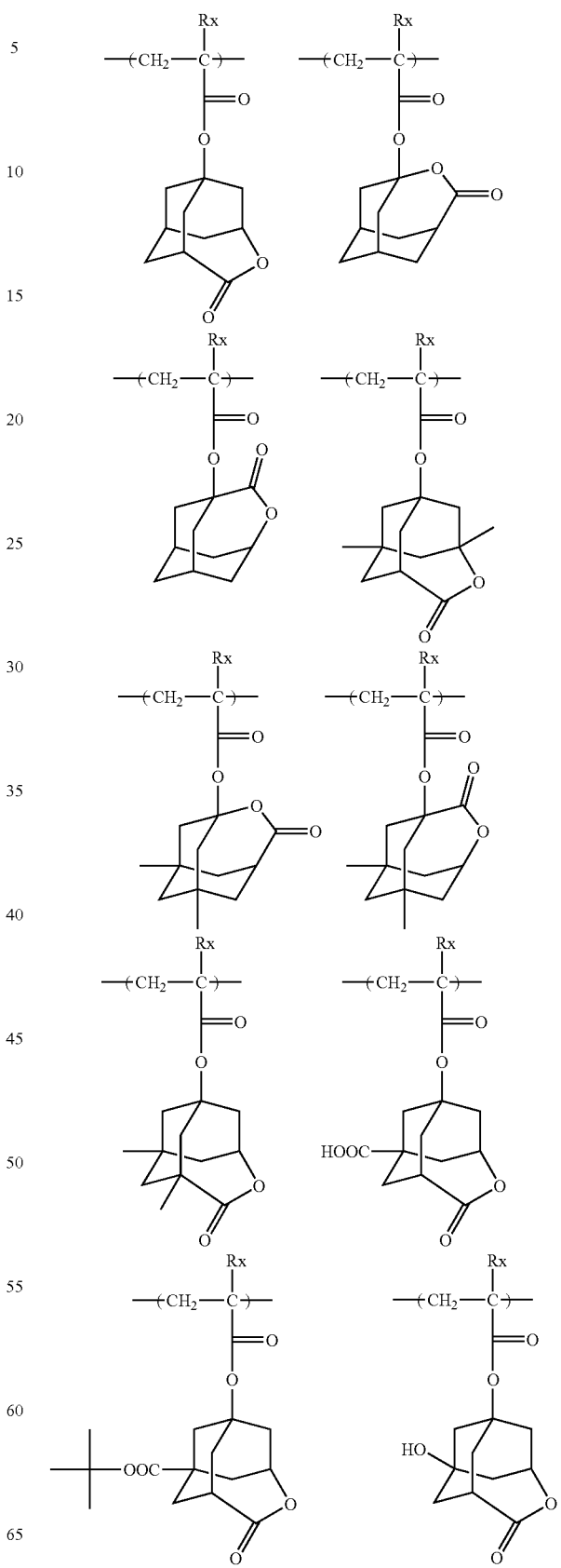
(In the formulae, Rx represents H, CH₃, CH₂OH or CF₃.)

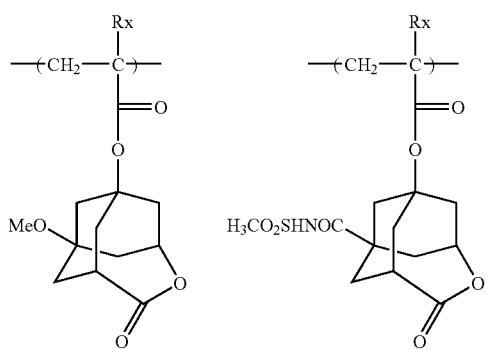

As especially preferred constituent units having a lactone group, the following constituent units are exemplified. By the selection of optimal lactone structure, pattern profile and condensation and rarefaction dependency are bettered.

(In the formulae, Rx represents H, CH$_3$, CH$_2$OH or CF$_3$.)

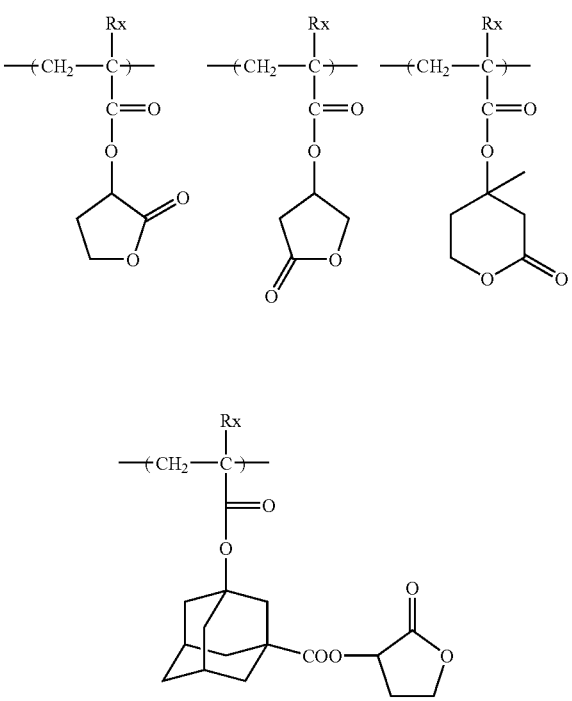

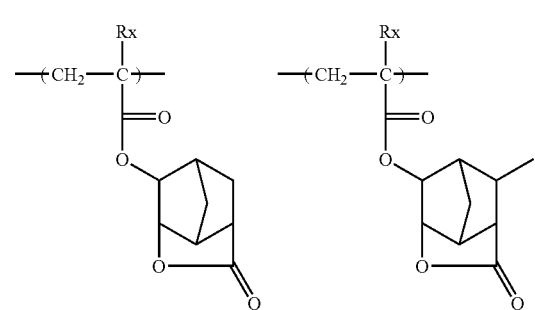

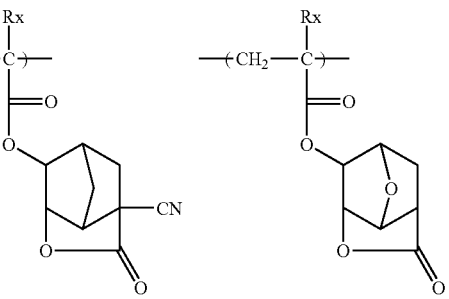

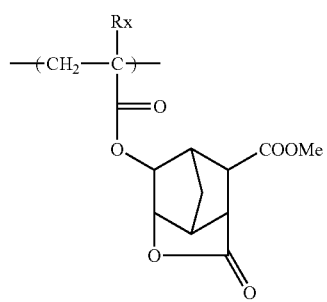

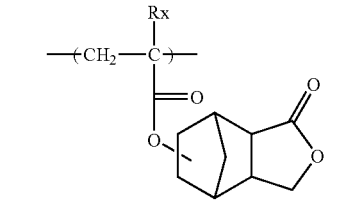

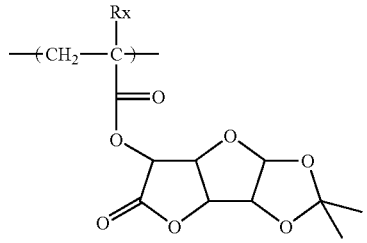

It is preferred for the polymer compound manufactured according to the manufacturing method of the invention to have a constituent unit having an alicyclic hydrocarbon structure substituted with a polar group, by which adhesion with a substrate and affinity with a developing solution are improved. As the alicyclic hydrocarbon structure of the alicyclic hydrocarbon structure substituted with a polar group, an adamantyl group, a diamantyl group, and a norbornane group are preferred. As the polar groups, a hydroxyl group and a cyano group are preferred. As the alicyclic hydrocarbon structure substituted with a polar group, partial structures represented by any of the following formulae (VIIa) to (VIId) are preferred.

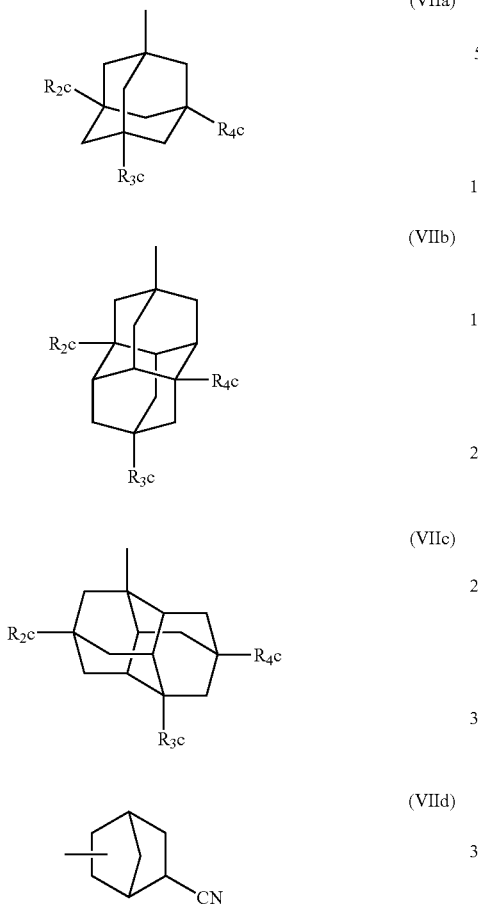

(VIIa)

(VIIb)

(VIIc)

(VIId)

In formula (VIIa) to (VIIc), $R_{2c}$, $R_{3c}$, and $R_{4c}$ each independently represents a hydrogen atom, a hydroxyl group, or a cyano group, provided that at least one of $R_{2c}$, $R_{3c}$ and $R_{4c}$ represents a hydroxyl group or a cyano group. Preferably one or two of $R_{2c}$, $R_{3c}$ and $R_{4c}$ represent a hydroxyl group and the remainder represent a hydrogen atom. In formula (VIIa), more preferably two of $R_{2c}$, $R_{3c}$ and $R_{4c}$ represent a hydroxyl group and the remainder represents a hydrogen atom.

As the constituent unit having a group represented by any of formulae (VIIa) to (VIId), a constituent unit represented by formula (II-AB1) or (II-AB2) in which at least one of $R_{13}'$ to $R_{16}'$ has a group represented by formula (VII) (for example, $R_5$ of —$COOR_5$ represents a group represented by any of formulae (VIIa) to (VIId)), or a constituent unit represented by any of the following formulae (AIIa) to (AIId) can be exemplified.

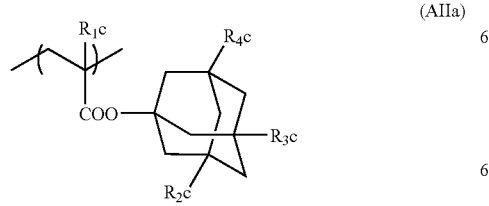

(AIIa)

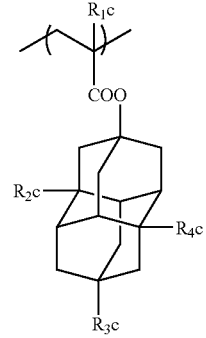

(AIIb)

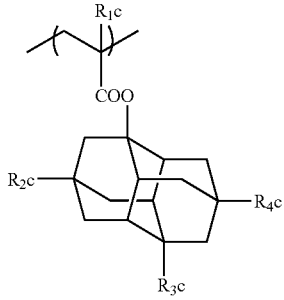

(AIIc)

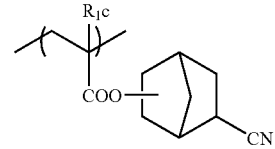

(AIId)

In formulae (AIIa) to (AIId), $R_{1c}$ represents a hydrogen atom, a methyl group, a trifluoromethyl group, or a hydroxymethyl group.

$R_{2c}$, $R_{3c}$ and $R_{4c}$ each independently represents a hydrogen atom, a hydroxyl group, or a cyano group, provided that at least one of $R_{2c}$, $R_3$, and $R_4$, represents a hydroxyl group or a cyano group. $R_{2c}$, $R_{3c}$ and $R_{4c}$, have the same meaning as $R_{2c}$, $R_{3c}$, and $R_{4c}$, in formulae (VIIa) to (VIIc).

The content of the constituent unit having an alicyclic hydrocarbon structure substituted with a polar group is preferably from 5 to 40 mol % based on all the constituent units in the polymer, more preferably from 5 to 30 mol %, and still more preferably from 10 to 25 mol %.

The specific examples of the constituent units having the structure represented by any of formulae (AIIa) to (AIIb) are shown below, but the invention is not restricted to these examples.

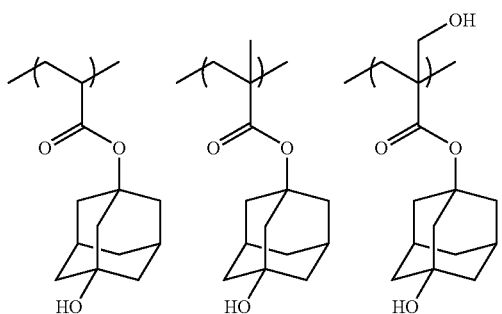

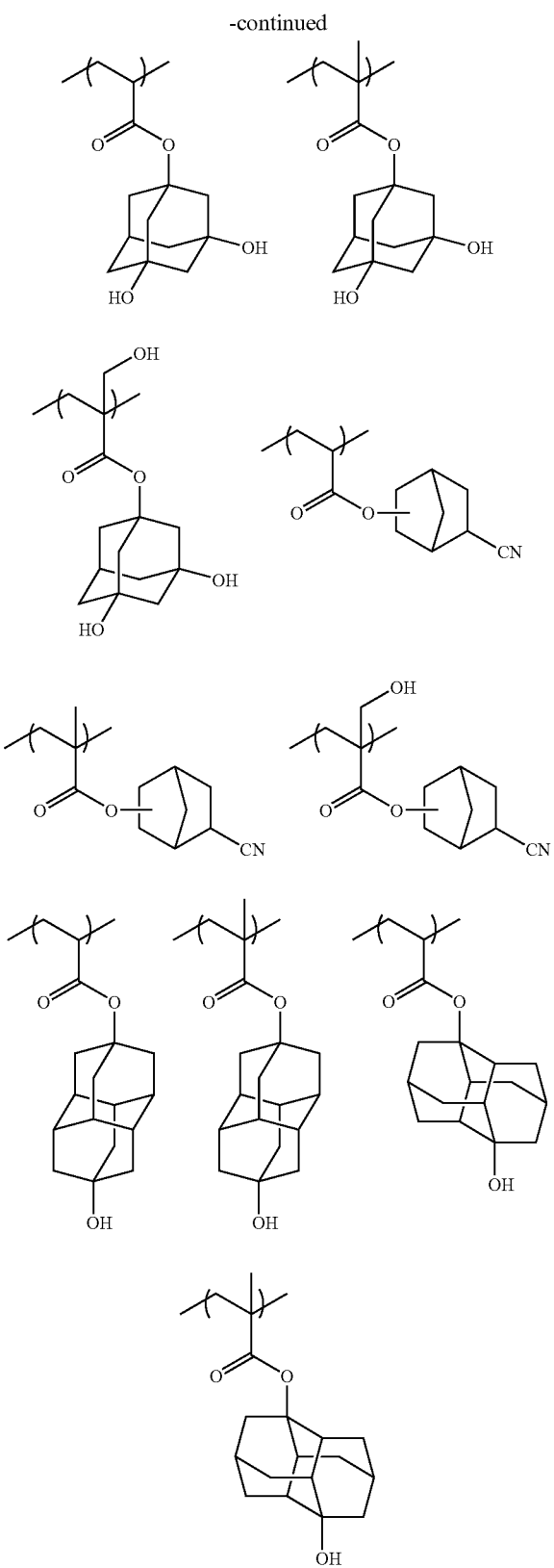

The polymer compound manufactured according to the manufacturing method in the invention may have a constituent unit represented by the following formula (VIII).

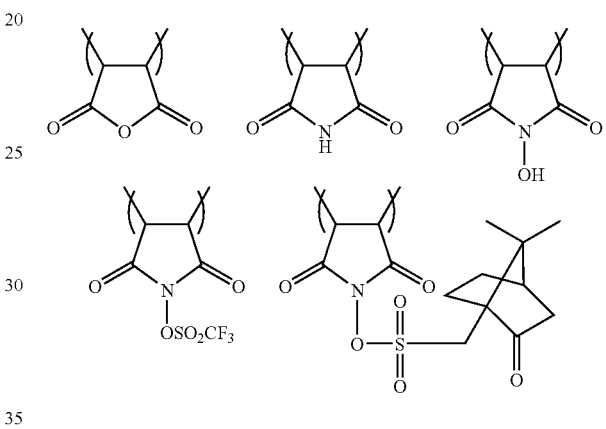

In formula (VIII), $Z_2$ represents —O— or —N($R_{41}$)—. $R_{41}$ represents a hydrogen atom, a hydroxyl group, an alkyl group, or —OSO$_2$—$R_{42}$. $R_{42}$ represents an alkyl group, a cycloalkyl group, or a camphor residue. The alkyl group represented by $R_{41}$ and $R_{42}$ may be substituted with a halogen atom (preferably a fluorine atom) and the like.

As the specific examples of the constituent units represented by formula (VIII), the following compounds are exemplified, but the invention is not restricted thereto.

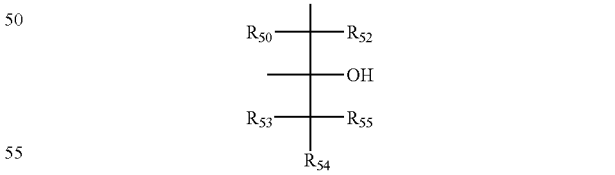

It is preferred for the polymer compound manufactured according to the manufacturing method in the invention to have a constituent unit having an alkali-soluble group. As the alkali-soluble groups, a carboxyl group, a sulfonamido group, a sulfonylimido group, a bisulfonylimido group, and an aliphatic alcohol substituted with an electron attractive group on the α-position (preferably a structure represented by the following formula (F1)) are exemplified. It is more preferred to have a constituent unit having a carboxyl group or a sulfonamido group.

(F1)

$$\begin{array}{c} R_{51} \\ R_{50}-\overset{|}{\underset{|}{C}}-R_{52} \\ \phantom{R_{50}-}OH \\ R_{53}-\overset{|}{\underset{|}{C}}-R_{55} \\ R_{54} \end{array}$$

In formula (F1), $R_{50}$, $R_{51}$, $R_{52}$, $R_{53}$, $R_{54}$ and $R_{55}$ each independently represents a hydrogen atom, a fluorine atom, or an alkyl group, provided that at least one of $R_{50}$ to $R_{55}$ represents a fluorine atom, or an alkyl group in which at least one hydrogen atom is substituted with a fluorine atom. It is preferred that all of $R_{50}$ to $R_{55}$ represent a fluorine atom.

By having a constituent unit having an alkali-soluble group, the resolution in the use for contact hole is enhanced. As the constituent units having an alkali-soluble group, a constituent unit having an alkali-soluble group directly bonded to the main chain of a resin such as a constituent unit by acrylic acid or methacrylic acid, a constituent unit having an alkali-soluble group bonded to the main chain of a resin via a linking group, and a constituent unit having an alkali-soluble group introduced to the terminals of a polymer chain by polymerization with a polymerization initiator having an alkali-soluble group and a chain transfer agent are exemplified, and any of these constituent units is preferably used. The linking group may have a monocyclic or polycyclic hydrocarbon structure. The constituent unit by acrylic acid or methacrylic acid is especially preferred.

The content of the constituent unit having an alkali-soluble group is from 1 to 20 mol % based on all the constituent units in the polymer, more preferably from 3 to 15 mol %, and still more preferably from 5 to 10 mol %.

The specific examples of the constituent units having an alkali-soluble group are shown below, but the invention is not restricted thereto.

(In the formulae, Rx represents H, $CH_3$, $CF_3$ or $CH_2OH$.)

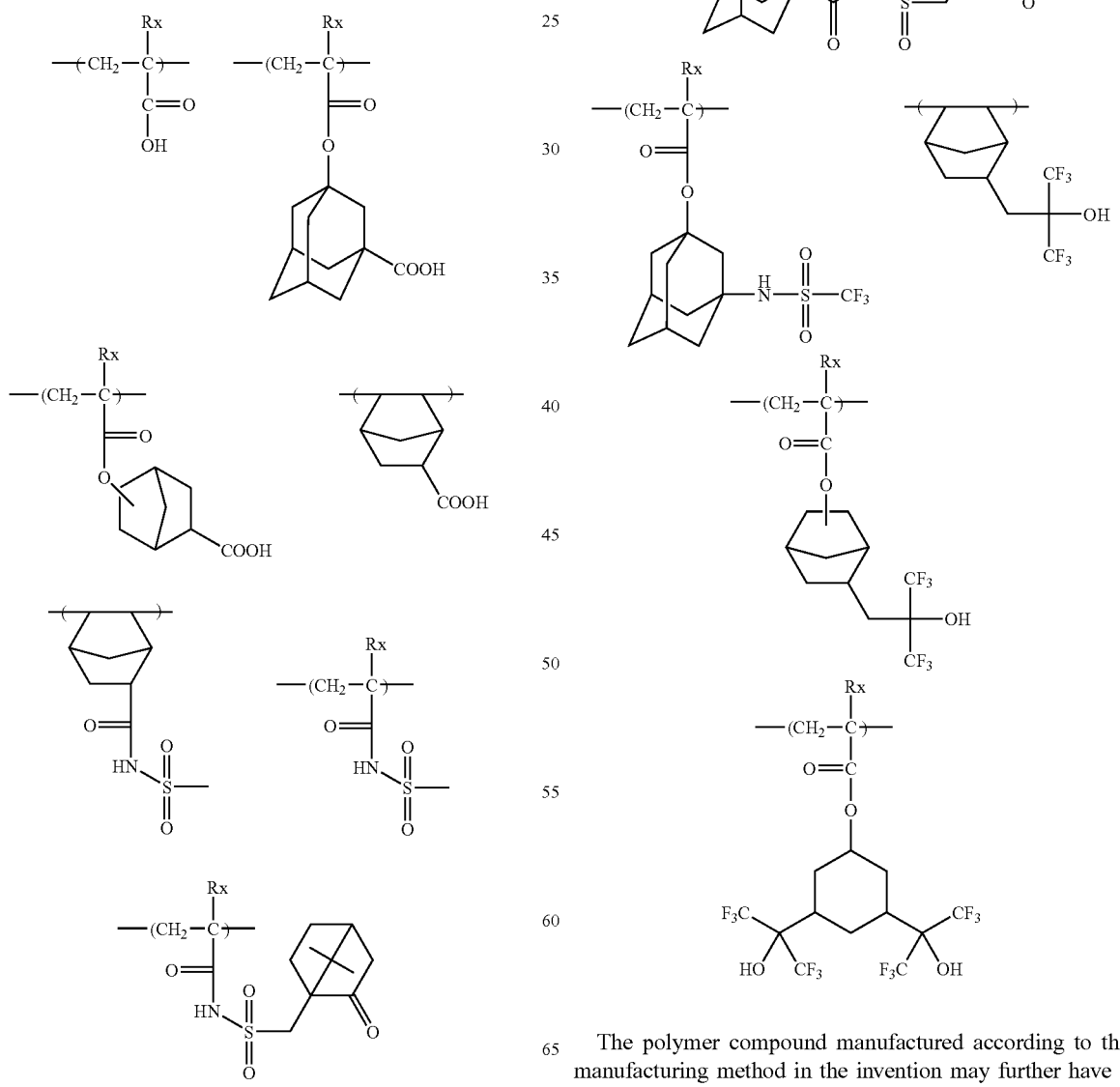

The polymer compound manufactured according to the manufacturing method in the invention may further have a constituent unit having an alicyclic hydrocarbon structure and not showing acid decomposability, by containing such a constituent unit, the elution of low molecular weight components from a resist film into an immersion liquid can be reduced at the time of immersion exposure. As such constituent units, e.g., 1-adamantyl (meth)acrylate, tricyclodecanyl (meth)acrylate, and cyclohexyl (meth)acrylate are exemplified.

The polymer compound manufactured according to the manufacturing method in the invention can contain various kinds of repeating structural units besides the above repeating structural units for the purpose of the adjustments of dry etching resistance, aptitude for standard developing solutions, adhesion to a substrate, resist profile, and general requisite characteristics of resists, e.g., resolution, heat resistance and sensitivity.

As these repeating structural units, the repeating structural units corresponding to monomers shown below can be exemplified, but the invention is not restricted thereto.

By containing such various repeating structural units, fine adjustment of performances required of alicyclic hydrocarbon series acid-decomposable resin, in particular the following performances, becomes possible, that is, (1) Solubility in a coating solvent, (2) A film-forming property (a glass transition point), (3) An alkali developing property, (4) Decrease of layer thickness (hydrophobic-hydrophilic property, selection of an alkali-soluble group), (5) Adhesion of an unexposed part to a substrate, and (6) Dry etching resistance.

The examples of such monomers include compounds having one addition polymerizable unsaturated bond selected from acrylic esters, methacrylic esters, acrylamides, methacryl-amides, allyl compounds, vinyl ethers, vinyl esters, etc.

In addition to the aforementioned compounds, addition polymerizable unsaturated compounds copolymerizable with the monomers corresponding to the above various repeating structural units may be used for copolymerization.

In the polymer compound manufactured according to the manufacturing method in the invention, the molar ratio of the content of each repeating structural unit is arbitrarily set to adjust dry etching resistance, aptitude for standard developing solutions, adhesion to a substrate, and resist profile of a resist, in addition to these characteristics, general requisite characteristics of resists, e.g., resolution, heat resistance and sensitivity.

As preferred embodiments of the polymer compound manufactured according to the manufacturing method in the invention, the following are exemplified.

(1) A polymer compound containing the constituent unit having a partial structure containing the alicyclic hydrocarbon represented by any of formulae (pI) to (pV) (a side chain type), preferably a polymer compound containing a (meth)acrylate constituent unit having the structure of any of formulae (pI) to (pV);

(2) A polymer compound having the constituent unit represented by formula (II-AB) (a main chain type); and the following is further exemplified as embodiment (2):

(3) A polymer compound having the constituent unit represented by formula (II-AB), a constituent unit by a maleic anhydride derivative, and a constituent unit by a (meth)acrylate (a hybrid type).

The content of the constituent unit having an acid decomposable group in the polymer compound manufactured according to the manufacturing method of the invention is preferably from 10 to 60 mol % in all the repeating structural units, more preferably from 20 to 50 mol %, and still more preferably from 25 to 40 mol %.

The content of the constituent unit having a partial structure containing the alicyclic hydrocarbon represented by any of formulae (pI) to (pV) in the polymer compound manufactured according to the manufacturing method of the invention is preferably from 20 to 70 mol % in all the repeating structural units, more preferably from 20 to 50 mol %, and still more preferably from 25 to 40 mol %.

The content of the constituent unit represented by formula (II-AB) in the polymer compound manufactured according to the manufacturing method of the invention is preferably from 10 to 60 mol %, more preferably from 15 to 55 mol %, and still more preferably from 20 to 50 mol %.

The content of the repeating structural units on the basis of the monomers of further copolymerization components in the resin can also be optionally set according to desired resist performances, and the content is generally preferably 99 mol % or less based on the total mol number of the repeating structural unit having the partial structure containing the alicyclic hydrocarbon represented by any of formulae (pI) to (pV) and the constituent unit represented by formula (II-AB), more preferably 90 mol % or less, and still more preferably 80 mol % or less.

When the composition of the invention is for ArF exposure, it is preferred that the resin does not have an aromatic group from the aspect of transparency to ArF rays.

The polymer compound manufactured according to the manufacturing method of the invention is preferably such that all the repeating units consist of (meth)acrylate constituent units. In this case, any of the following cases can be used, that is, a case where all the constituent units consist of methacrylate constituent units, a case where all the constituent units consist of acrylate constituent units, and a case where all the constituent units consist of mixture of methacrylate constituent units and acrylate constituent units, but it is preferred that acrylate constituent units account for 50 mol % or less of all the constituent units.

The polymer compound manufactured according to the manufacturing method of the invention is preferably a copolymer containing from 20 to 50 mol % of a constituent unit having the partial structure containing the alicyclic hydrocarbon represented by any of formulae (pI) to (pV), from 20 to 50 mol % of a constituent unit having a lactone structure, and from 5 to 30 mol % of a constituent unit having an alicyclic hydrocarbon structure substituted with a polar group, or a copolymer further containing from 0 to 20 mol % of other constituent units.

An especially preferred polymer compound is a copolymer containing from 20 to 50 mol % of a constituent unit having an acid-decomposable group represented by any of the following formulae (ARA-1) to (ARA-5), from 20 to 50 mol % of a constituent unit having a lactone group represented by any of the following formulae (ARL-1) to (ARL-6), and from 5 to 30 mol % of a constituent unit having an alicyclic hydrocarbon structure substituted with a polar group represented by any of the following formulae (ARH-1) to (ARH-3), or a copolymer further containing from 5 to 20 mol % of a constituent unit having a carboxyl group or a structure represented by formula (F1), and a constituent unit having an alicyclic hydrocarbon structure and not showing acid decomposability.

In the following formulae, $Rxy_1$ represents a hydrogen atom or a methyl group, and $Rxa_1$ and $Rxb_1$ each independently represents a methyl group or an ethyl group.

ARA-1 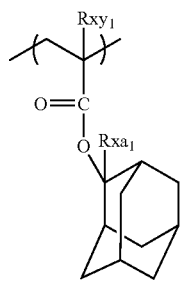
ARA-2 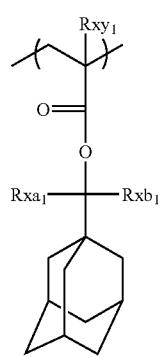
ARA-3 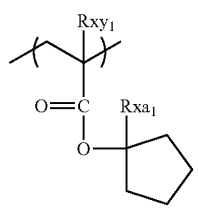
ARA-4 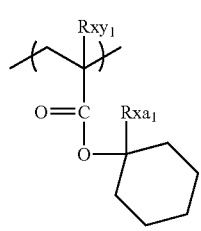
ARA-5 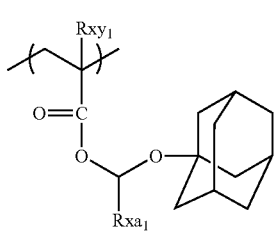
ARL-1 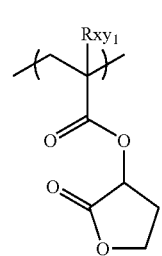
-continued
ARL-2 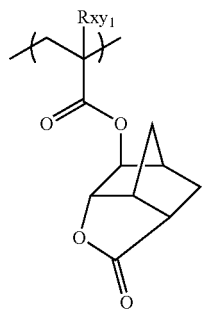
ARL-3 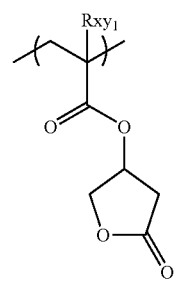
ARL-4 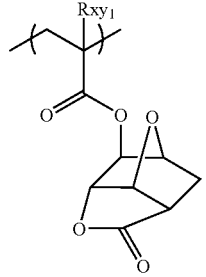
ARL-5 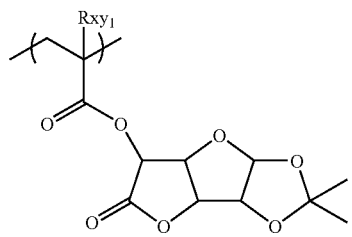
ARL-6 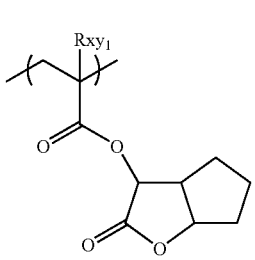

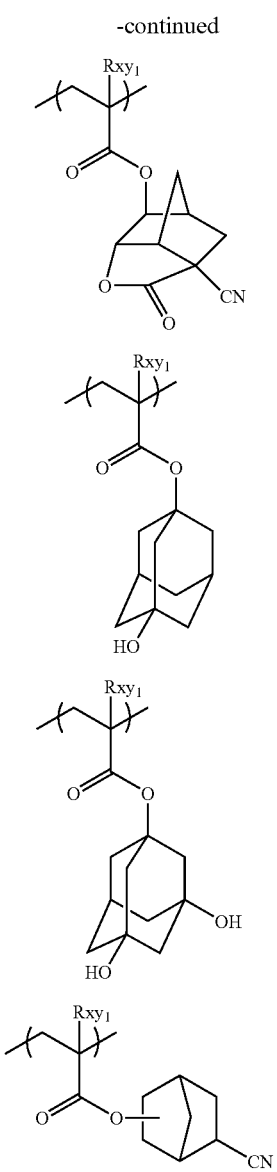

It is preferred for the polymer compound manufactured according to the manufacturing method of the invention to have a structure represented by the above formula (1) wherein at least one of $R_3$ and $R_4$ represents an alkyl group having 2 or more carbon atoms, and it is more preferred to have, with the above structure, any of the above shown specific examples (1) to (25) or any of constituent units (ARA-1) to (ARA-5) wherein at least either of Rxa or $Rxa_1$, and Rxb or $Rxb_1$, represents a methyl group, and it is still more preferred to have a structure represented by the above formula (1) wherein both $R_3$ and $R_4$ represent an alkyl group having 2 or more carbon atoms (in particular, an ethyl group), and any of the specific examples (1) to (25) or any of constituent units (ARA-1) to (ARA-5) wherein both of Rxa or $Rxa_1$, and Rxb or $Rxb_1$, represent a methyl group.

When the positive resist composition in the invention is irradiated with KrF excimer laser beams, electron beams, X-rays, or high energy rays of wavelength 50 nm or less (e.g., EUV), the polymer compound is preferably an acid-decomposable resin having a hydroxystyrene repeating unit (hereinafter also referred to as "hydroxystyrene-based acid-decomposable resin"). As the hydroxystyrene acid-decomposable resins, a copolymer of hydroxystyrene and hydroxystyrene protected with a group capable of separating by the action of an acid, a copolymer of hydroxystyrene and (meth)acrylic acid tertiary alkyl ester, a copolymer of hydroxystyrene, hydroxystyrene protected with a group capable of separating by the action of an acid, and (meth)acrylic acid tertiary alkyl ester, a copolymer of hydroxystyrene, hydroxystyrene protected with a group capable of separating by the action of an acid, and styrene, a copolymer of hydroxystyrene, (meth)acrylic acid tertiary alkyl ester, and styrene, and a copolymer of hydroxystyrene, hydroxystyrene protected with a group capable of separating by the action of an acid, (meth)acrylic acid tertiary alkyl ester, and styrene are preferably exemplified.

In hydroxystyrene acid-decomposable resins, the content of the acid-decomposable groups is expressed by B/(B+S), taking the number of the acid-decomposable groups in the resin as (B), and the number of alkali-soluble groups not protected with groups capable of separating by the action of an acid as (S). The content of acid-decomposable groups is preferably from 0.01 to 0.7, more preferably from 0.05 to 0.50, and still more preferably from 0.05 to 0.40.

The polymer compound having a structure represented by formula (1) is a novel compound.

The polymer compound having a structure represented by formula (1) can be synthesized according to ordinary methods (for example, radical polymerization). For instance, as ordinary methods, a batch polymerization method of dissolving a monomer, a compound represented by formula (2), and a polymerization initiator in a solvent and heating the solution to perform polymerization, and a dropping polymerization method of adding a solution containing a monomer, a compound represented by formula (2), and a polymerization initiator to a heated solvent over 1 to 10 hours by dropping are exemplified, and dropping polymerization is preferred. As reaction solvents, ethers, e.g., tetrahydrofuran, 1,4-dioxane, and diisopropyl ether, ketones, e.g., methyl ethyl ketone and methyl isobutyl ketone, an ester solvent, e.g., ethyl acetate, amide solvents, e.g., dimethylformamide and dimethyacetamide, and the later-described solvents capable of dissolving the composition of the invention, e.g., propylene glycol monomethyl ether acetate, propylene glycol monomethyl ether, and cyclohexanone are exemplified. It is more preferred to use the same solvent in polymerization as the solvent used in the resist composition of the invention, by which the generation of particles during preservation can be restrained.

It is preferred to perform polymerization reaction in the atmosphere of inert gas such as nitrogen or argon.

After termination of the reaction, the reaction product is put into a solvent and an objective polymer compound is recovered as powder or in a solid state. The reaction concentration is from 5 to 50 mass %, and preferably from 10 to 30 mass %. The reaction temperature is generally from 10 to 150° C., preferably from 30 to 120° C., and more preferably from 60 to 100° C.

The weight average molecular weight of the polymer compound in the invention is preferably from 1,000 to 200,000 as polystyrene equivalent by the GPC method, more preferably from 3,000 to 20,000, and most preferably from 5,000 to 15,000. By making the weight average molecular weight from 1,000 to 200,000, deteriorations of heat resistance and dry etching resistance can be prevented, and degradations of developing property and film-forming property due to viscosity becoming too high can be prevented.

The degree of dispersion (molecular weight distribution) of the polymer compound is generally from 1 to 5, preferably from 1 to 3, and more preferably from 1 to 2. The smaller the molecular weight distribution, the more excellent is the resolution and the resist form, and the more smooth is the sidewall of the resist pattern, and the more excellent is the roughness property.

In the positive photosensitive composition of the invention, the compounding amount of all the polymer compounds concerning the invention in the composition as a whole is preferably from 60 to 99 mass % in all the solids content, and more preferably from 80 to 98 mass %.

In the invention, the polymer compound can be used by one kind alone, or two or more kinds may be used in combination.

The specific examples of the polymer compounds in the invention are shown below, but the invention is not restricted thereto.

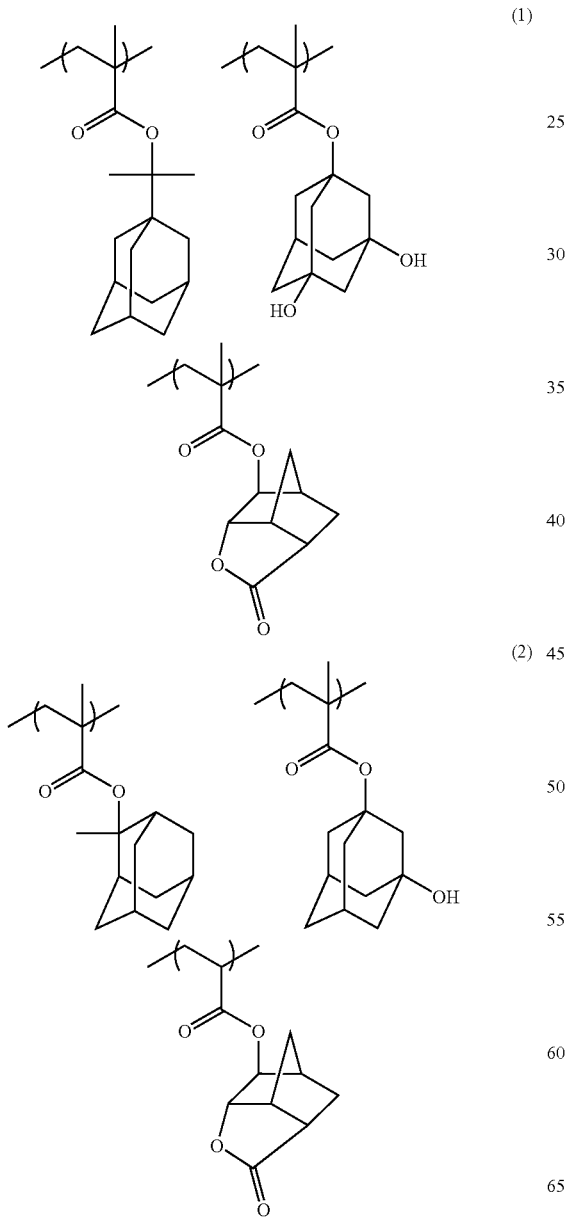

-continued

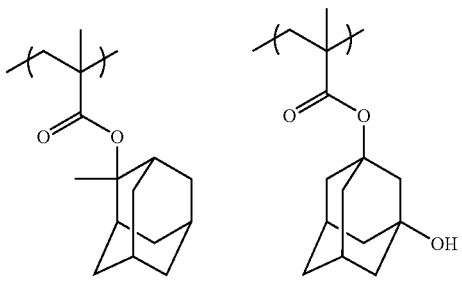

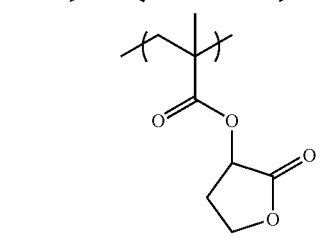

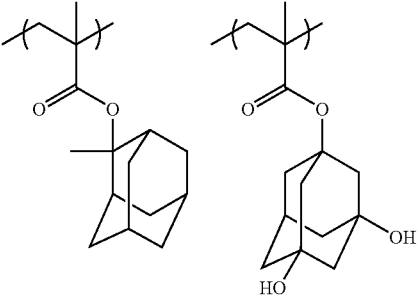

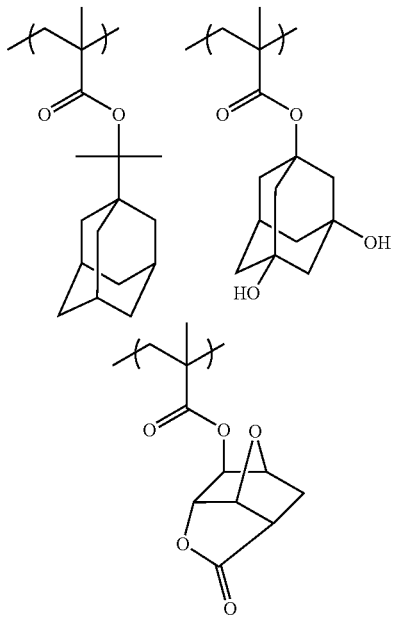

(6)
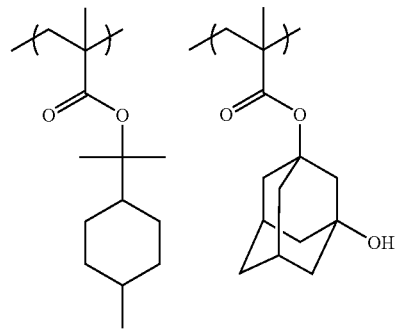
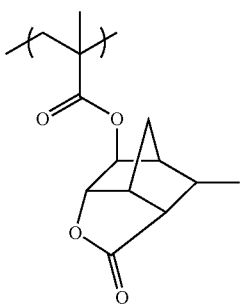
(7)
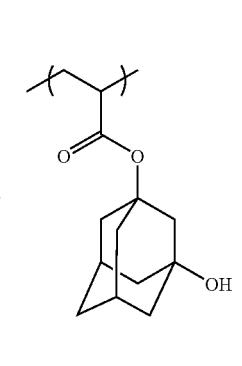
(8)
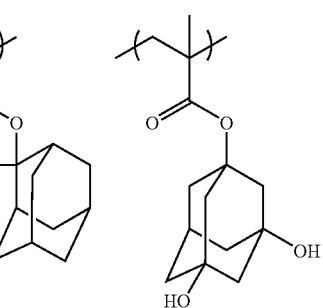
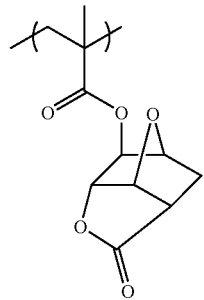
(9)
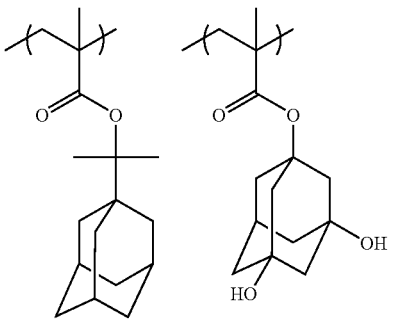
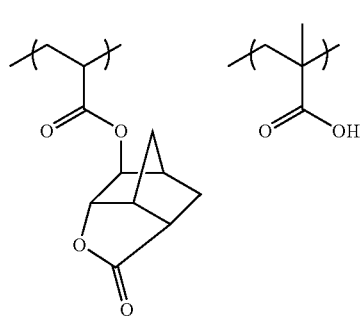
(10)
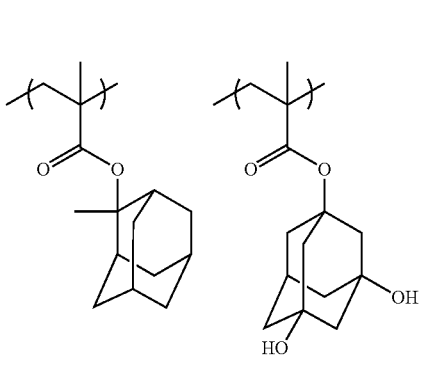
(11)
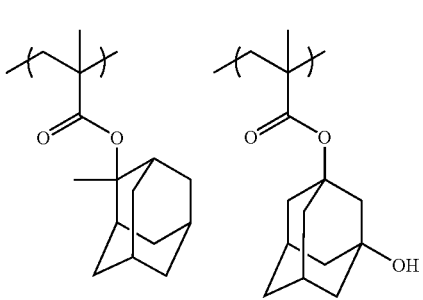

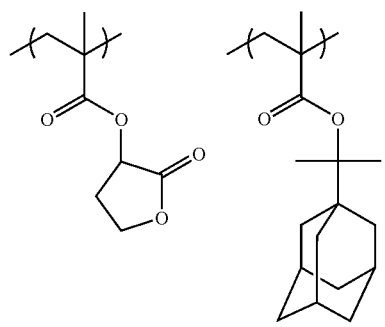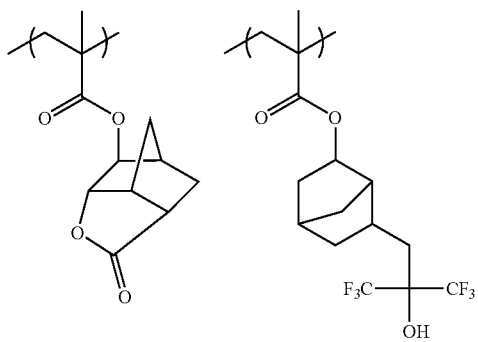
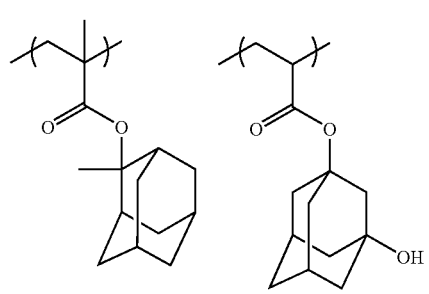
(12)
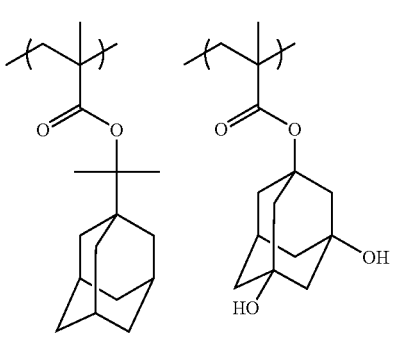
(15)
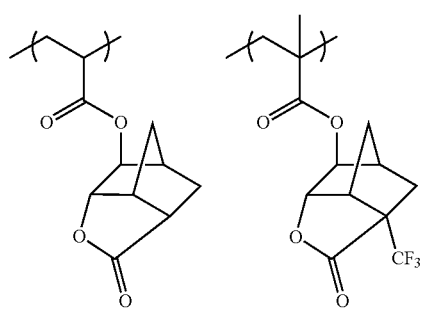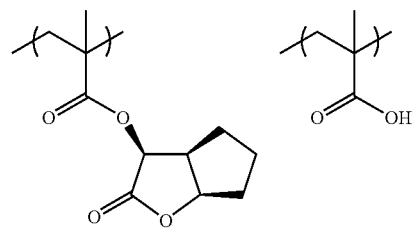
(13)
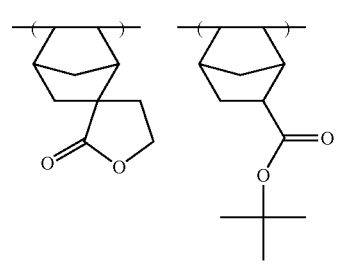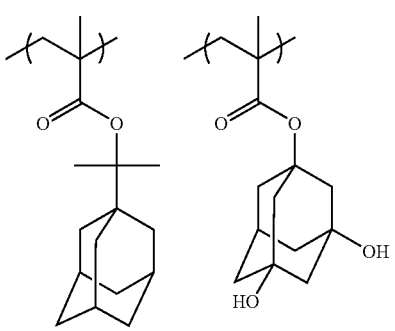
(16)
(14)
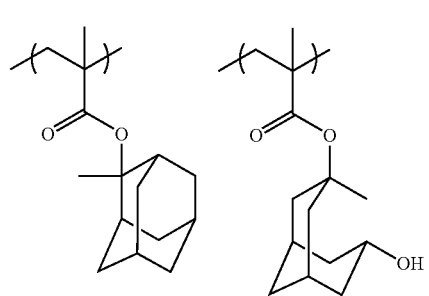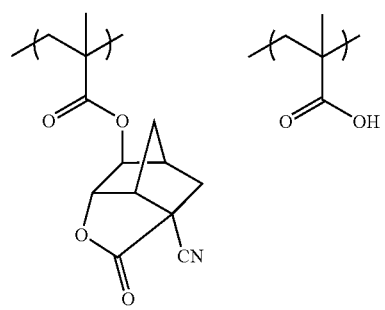

-continued
(17)
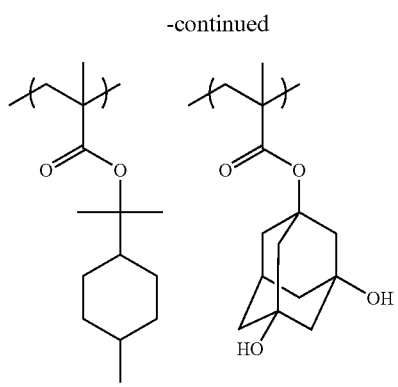
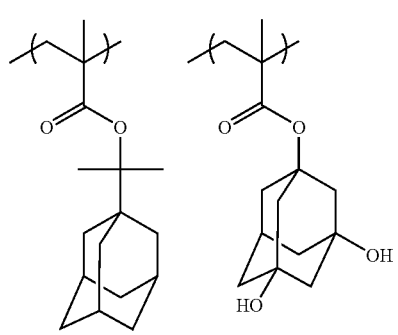
(18)
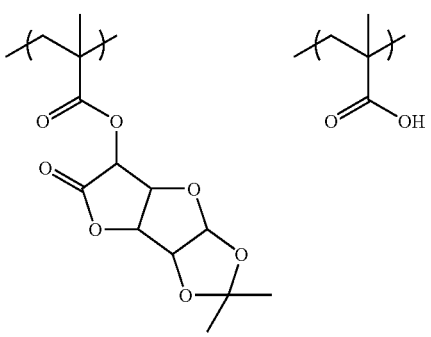
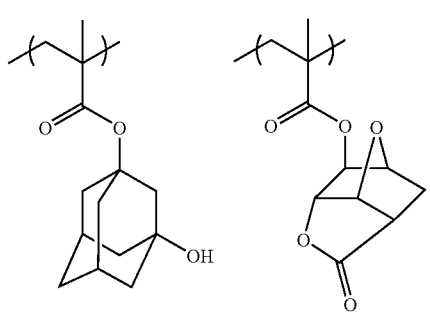
(19)
-continued
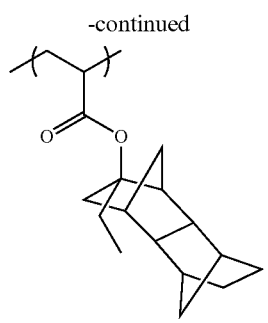
(20)
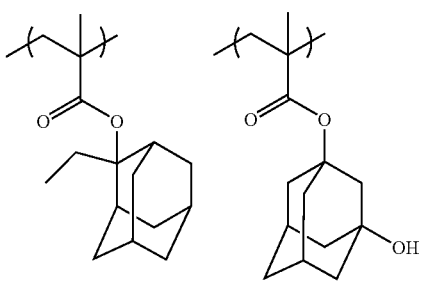
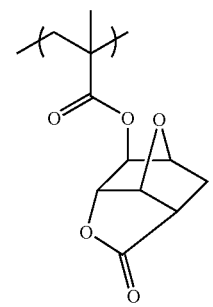
(21)
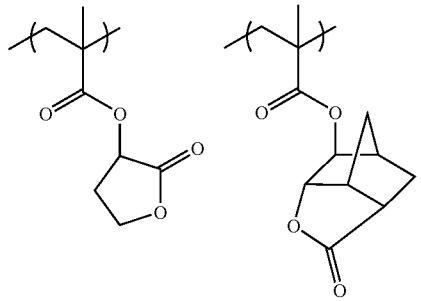
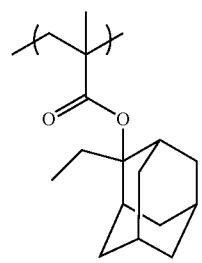

-continued
(22)
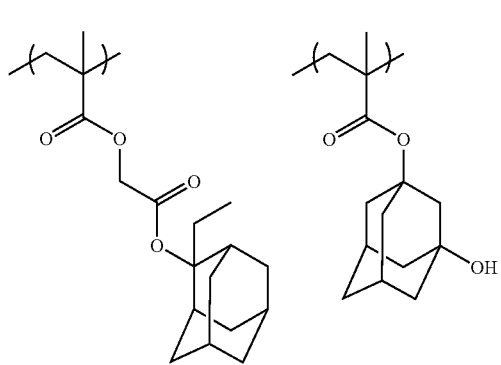
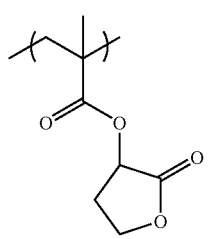
(23)
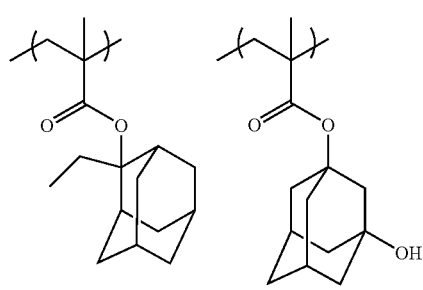
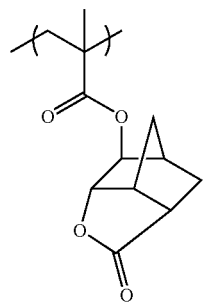
(24)
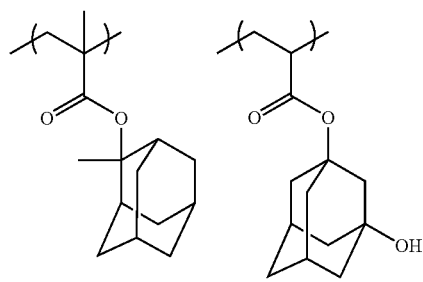
-continued
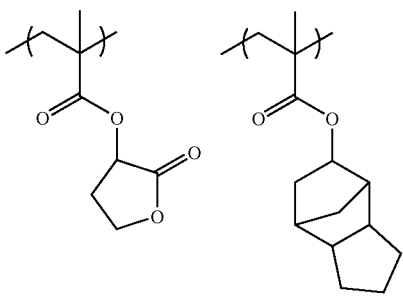
(25)
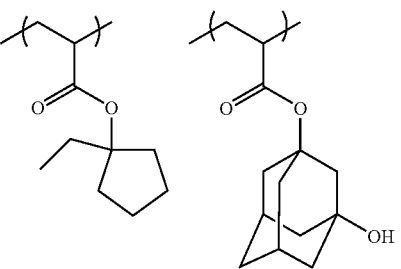
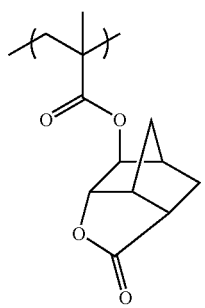
(R-1)
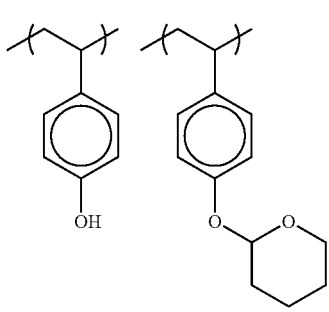
(R-2)
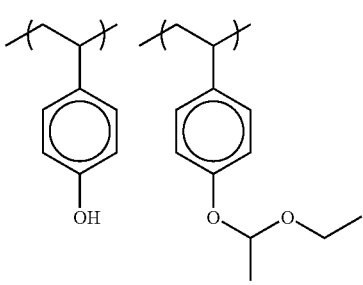

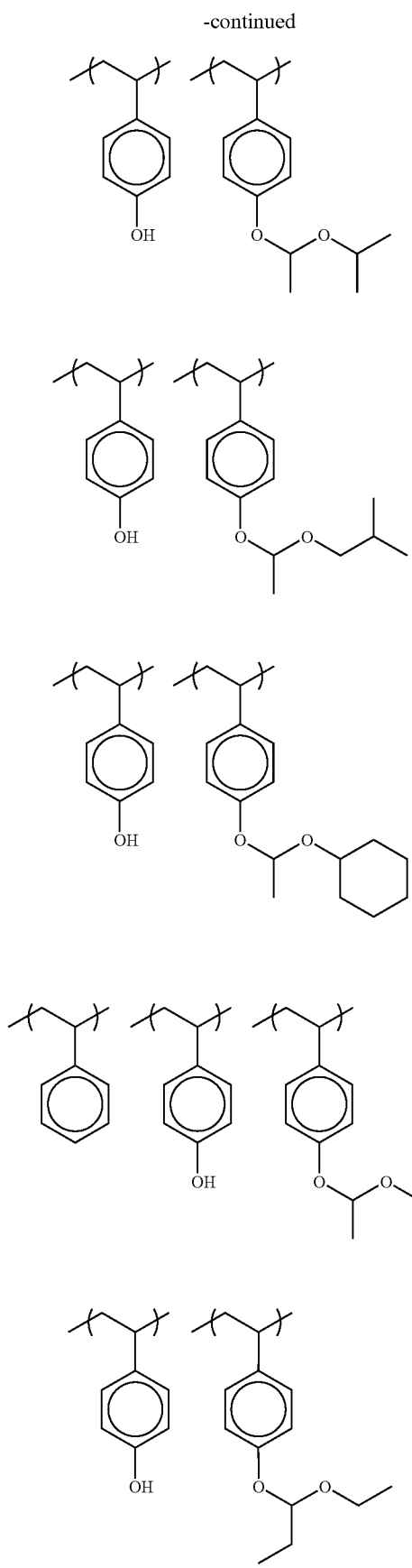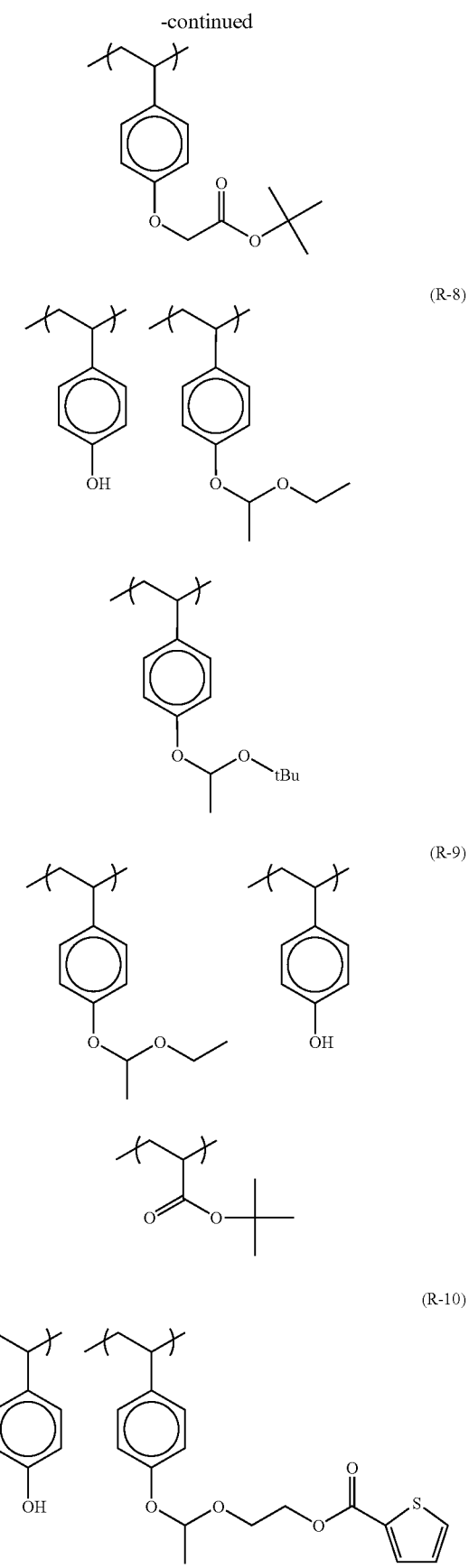

-continued
(R-11)
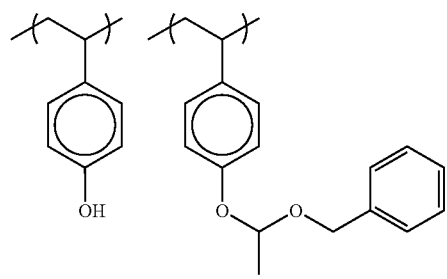
(R-14)
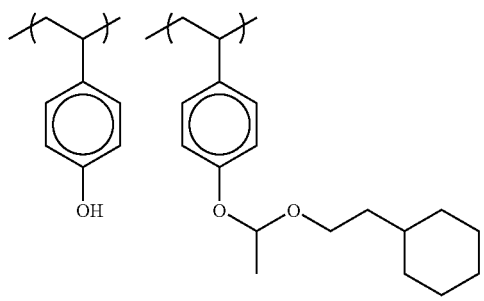
(R-12)
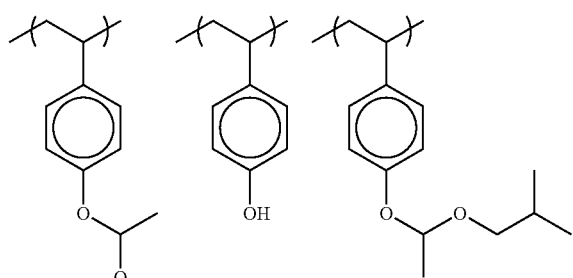
(R-15)
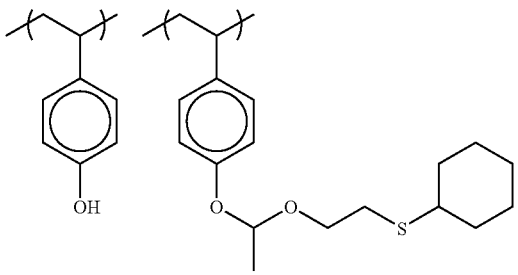
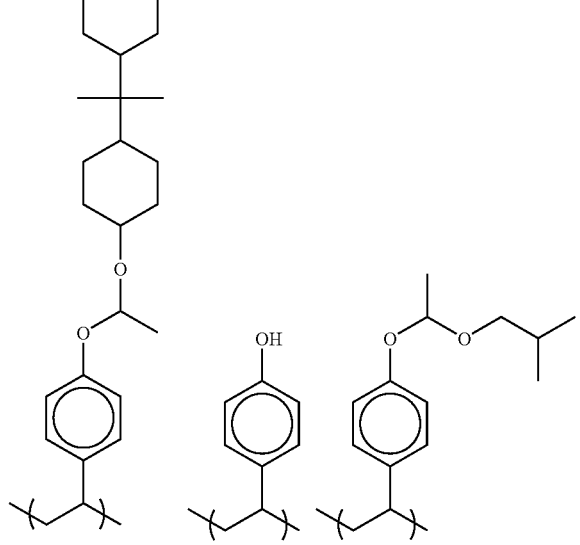
(R-16)
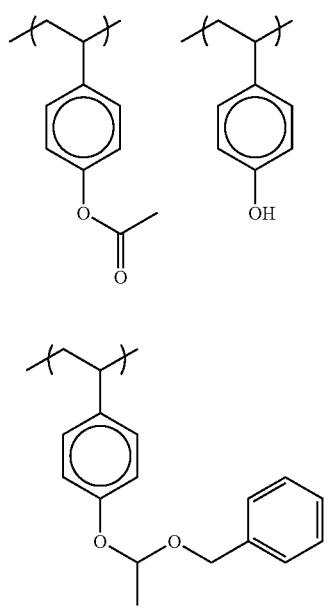
(R-13)
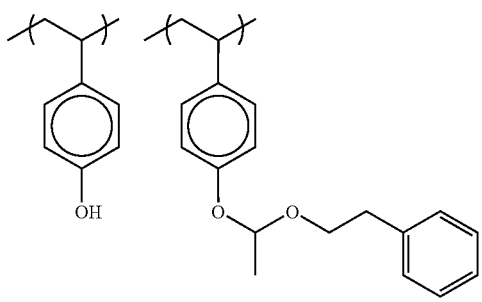
(R-17)
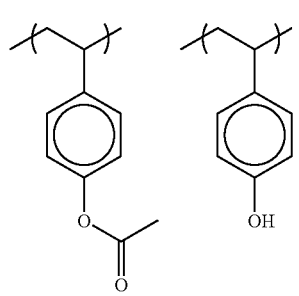

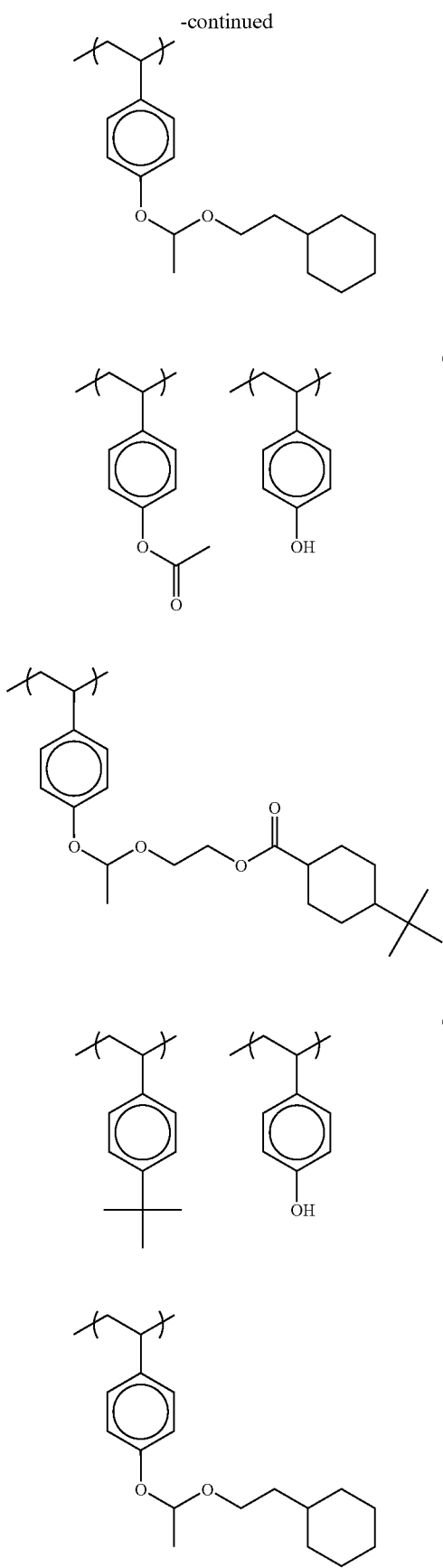
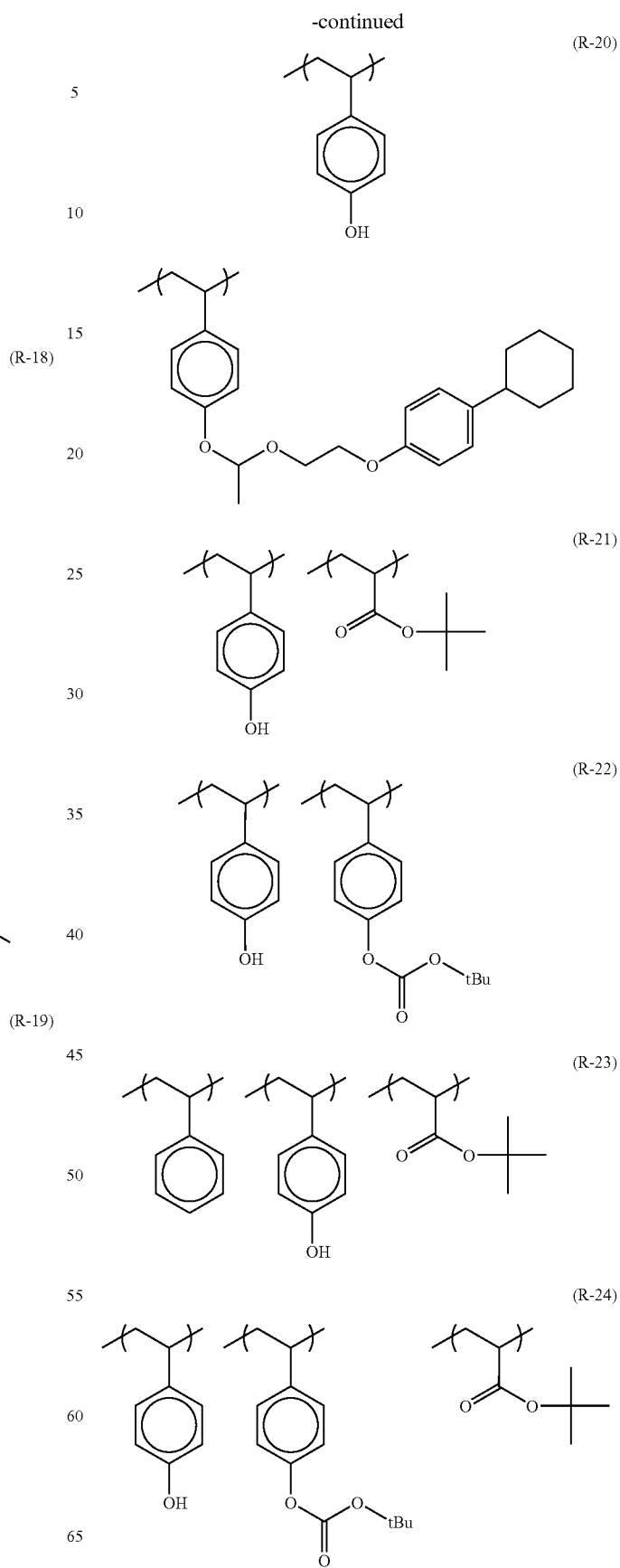

(R-25)
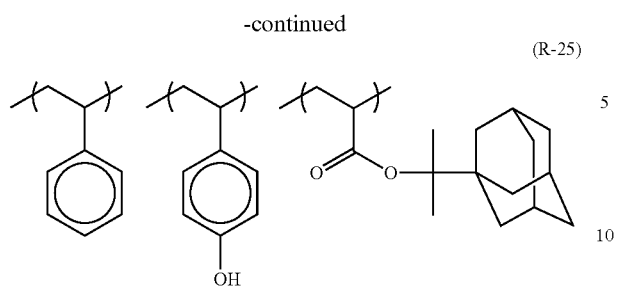
(R-26)
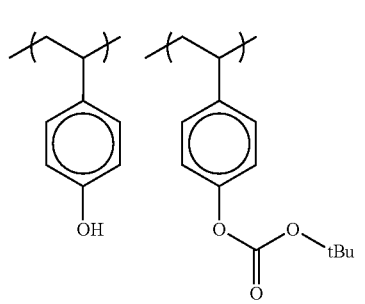
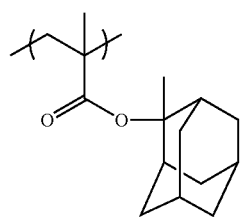
(R-27)
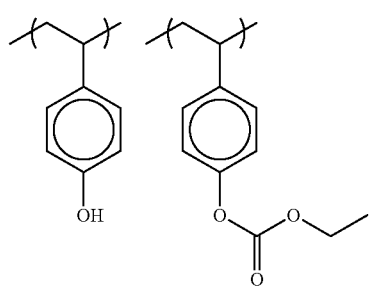
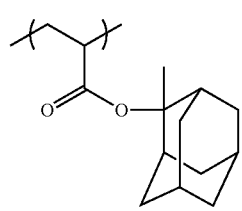
(R-28)
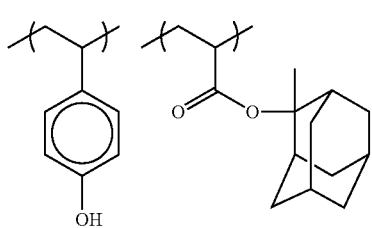
(R-29)
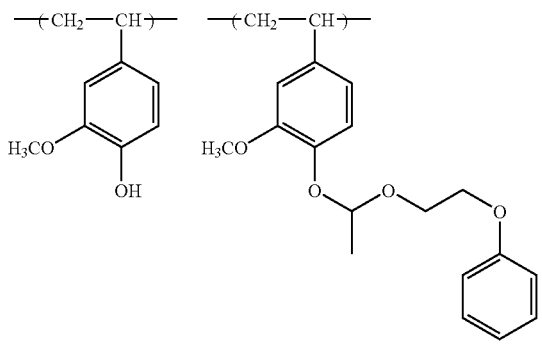
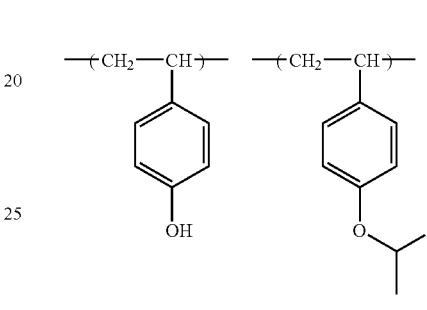
(R-30)
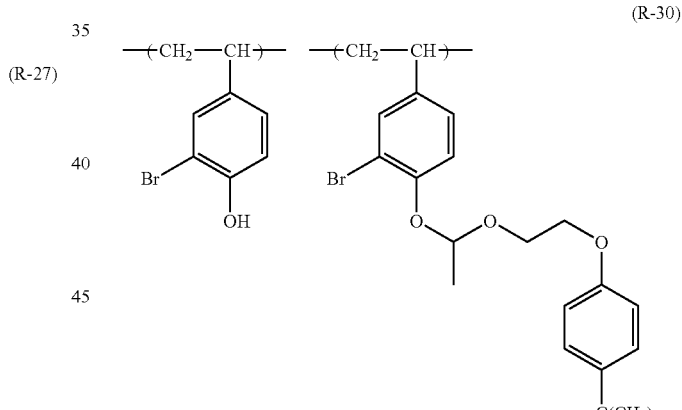
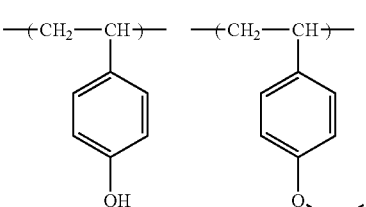
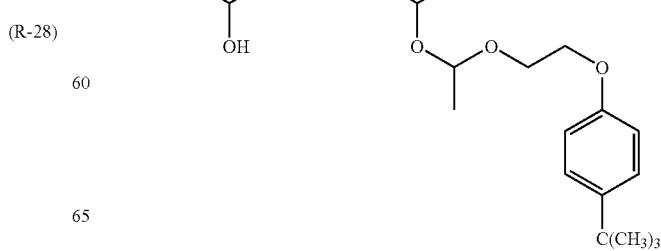

-continued
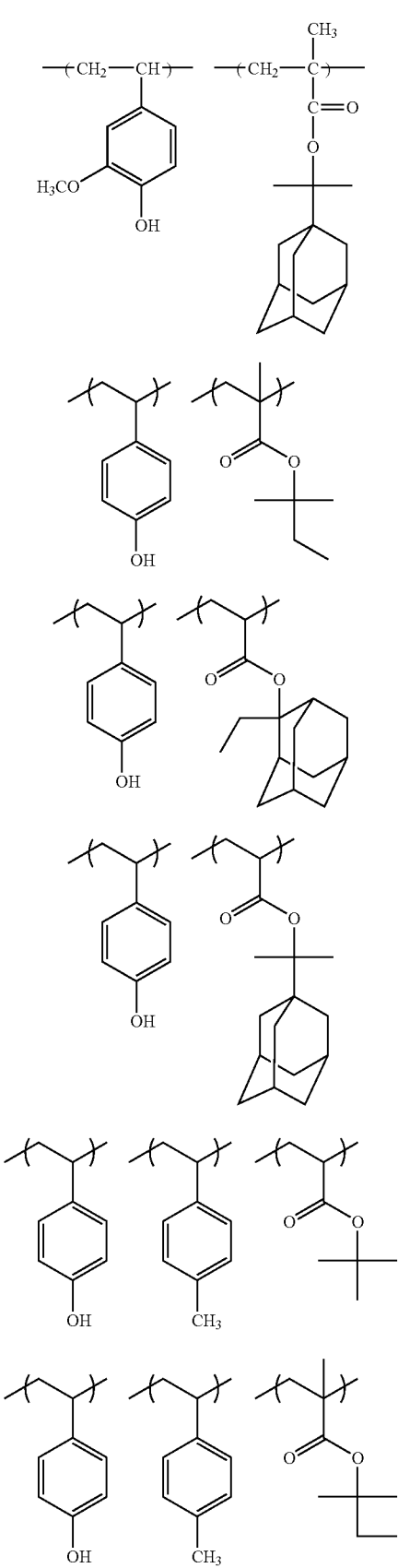
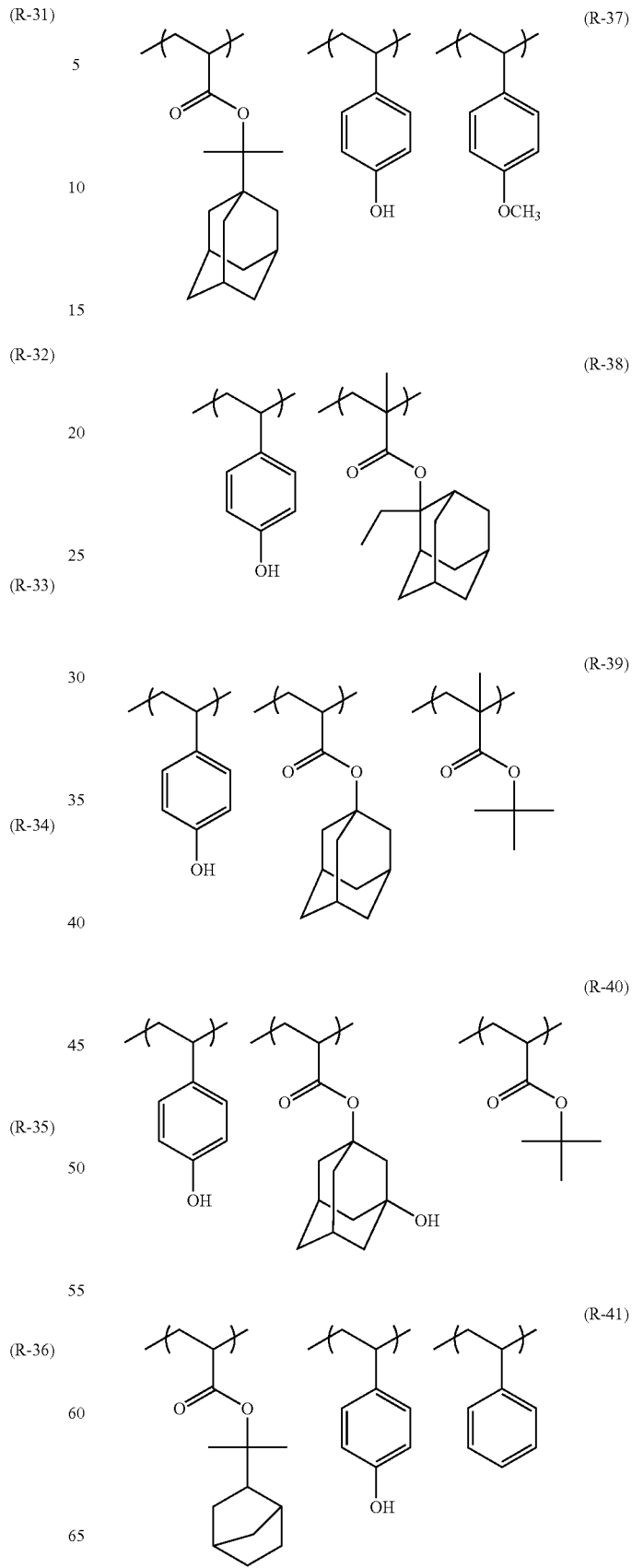

(R-42)
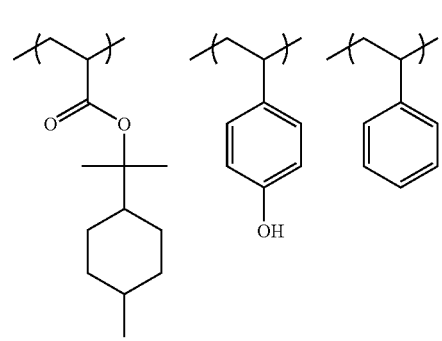
(R-43)
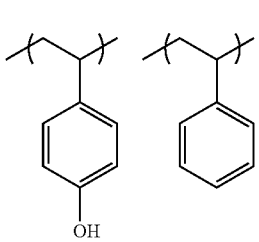
(R-44)
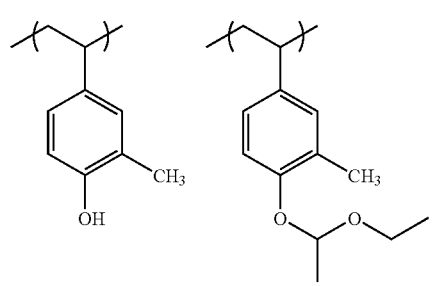
(R-45)
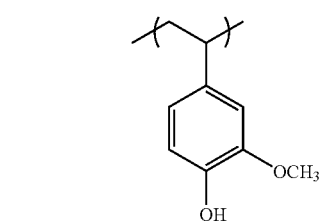
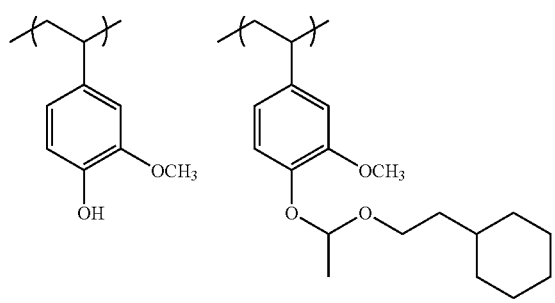
(R-46)
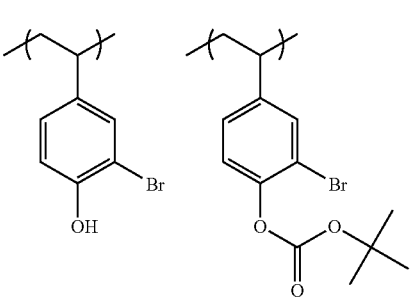
(R-47)
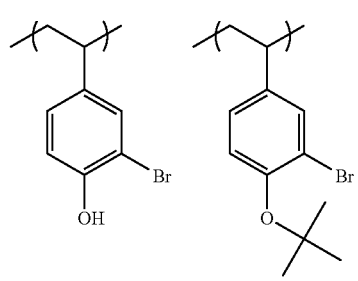
(R-48)
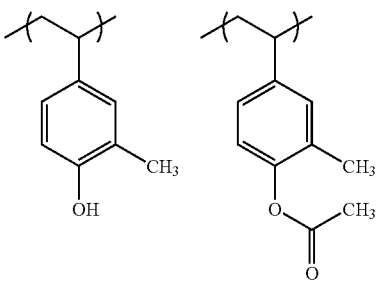
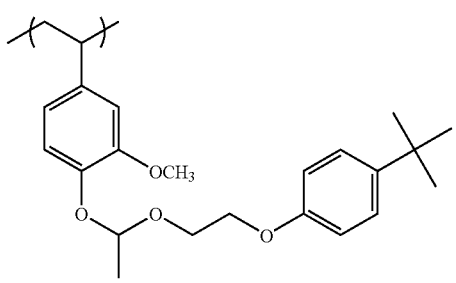
(R-49)
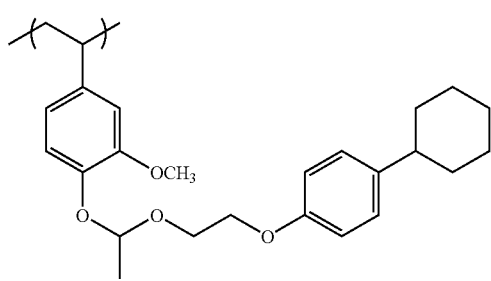
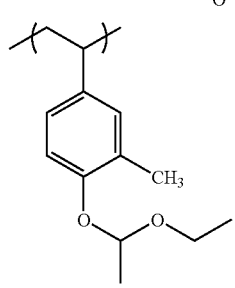

-continued
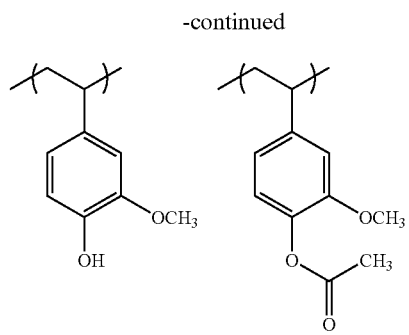
(R-50)
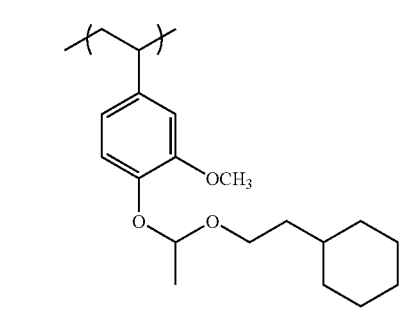
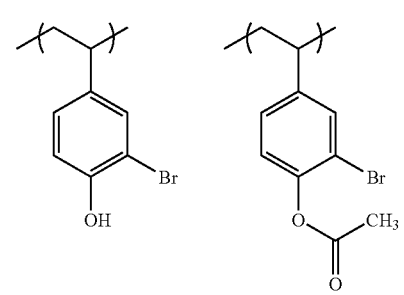
(R-51)
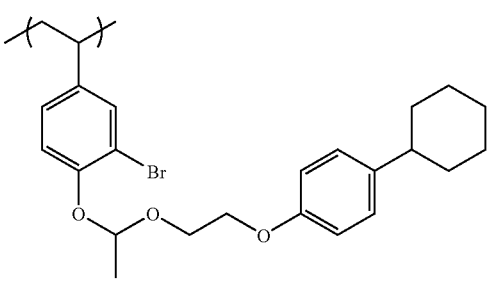
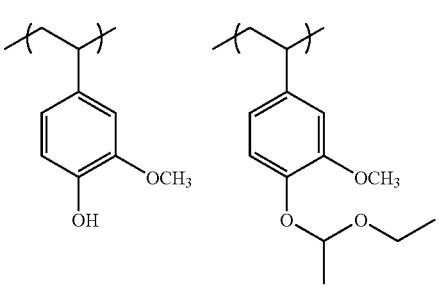
(R-52)
-continued
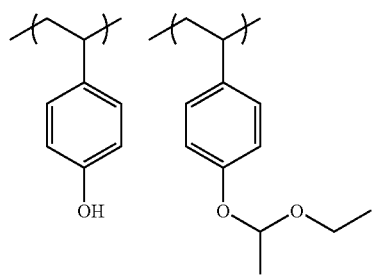
(R-53)
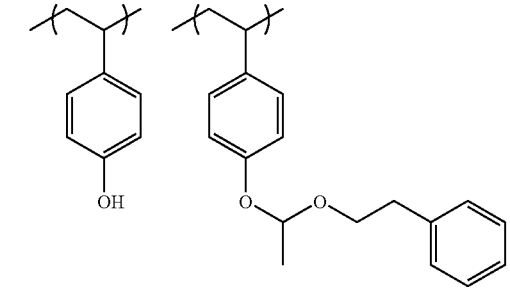
(R-54)

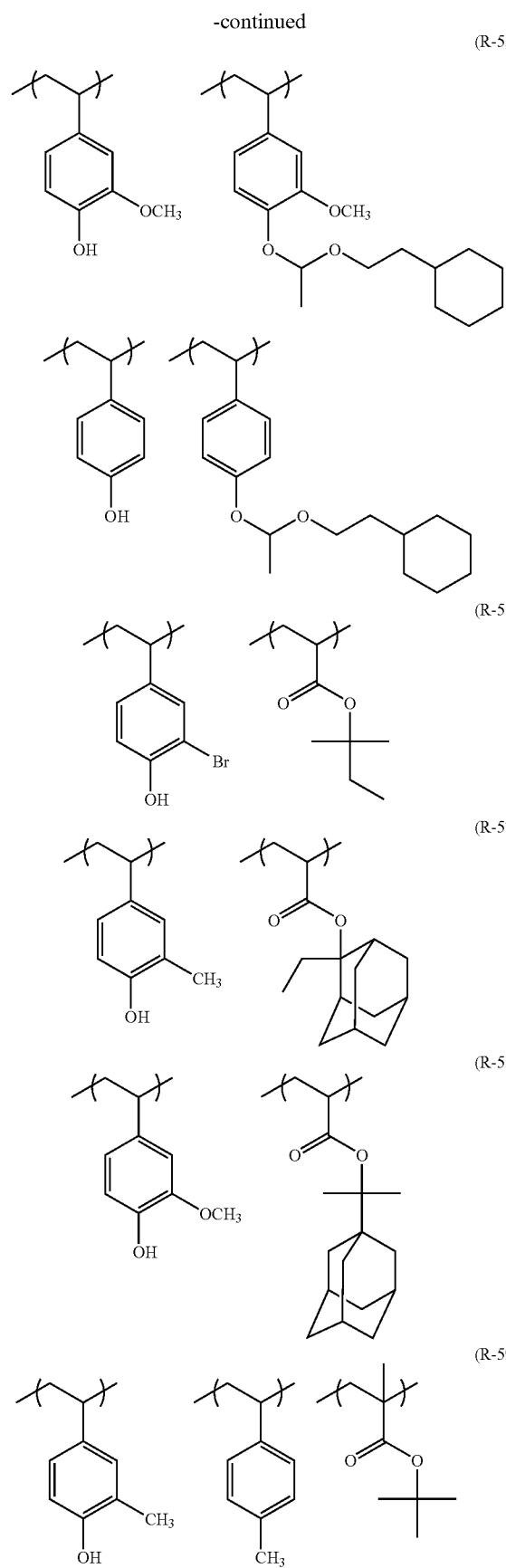
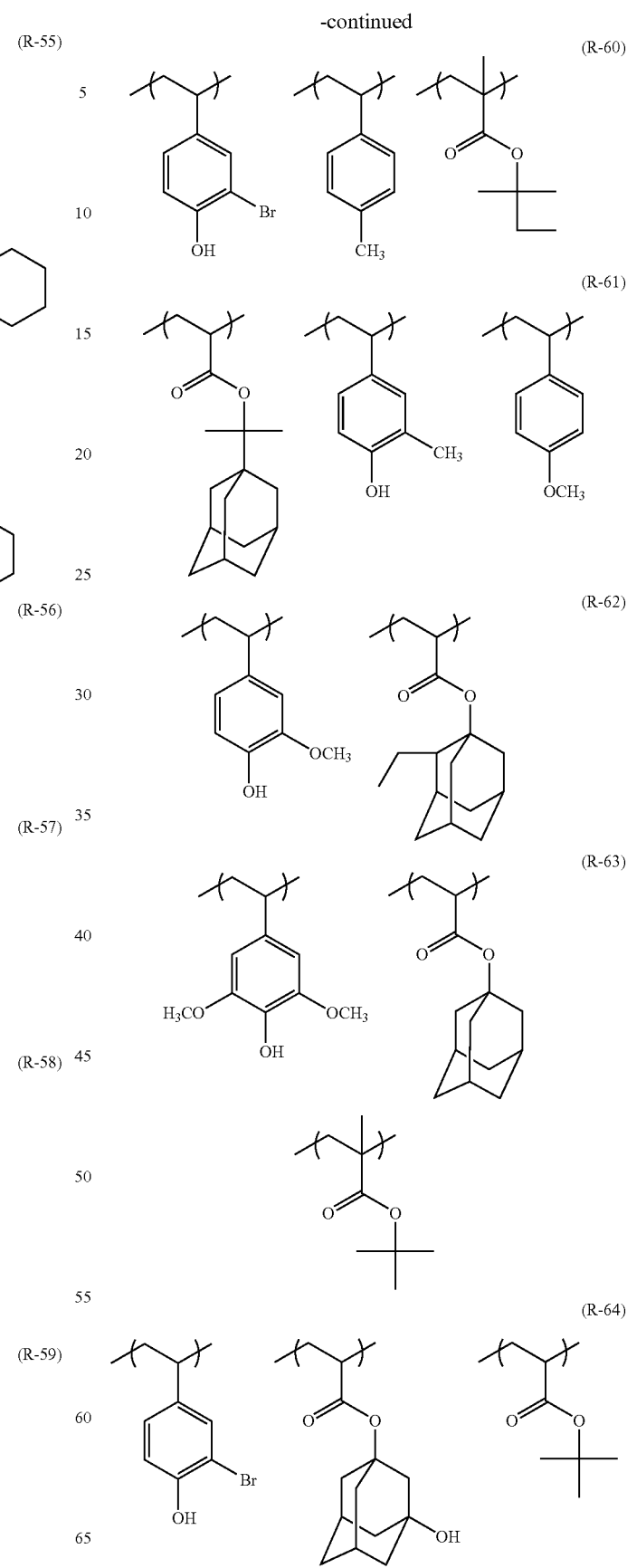

-continued
(R-65)
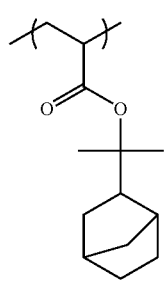 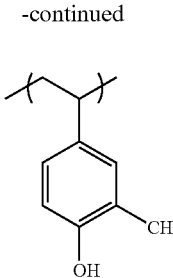 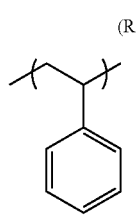
(R-66)
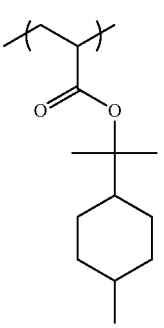 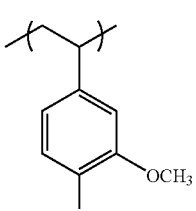 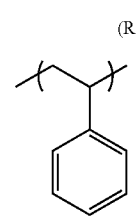
(R-67)
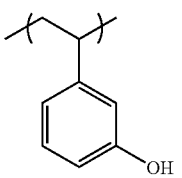 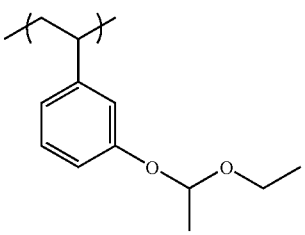
(R-68)
 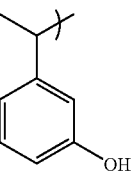
(R-69)
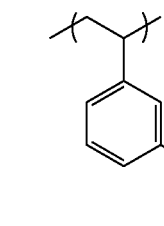 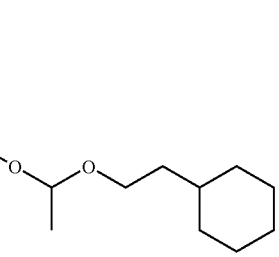
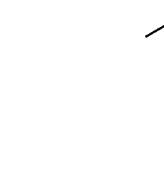 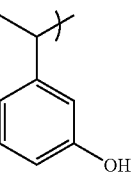
-continued
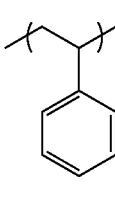
(R-70)
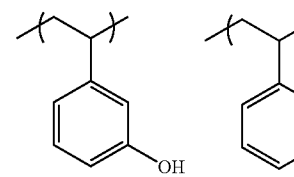
(R-71)
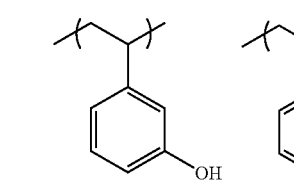
(R-72)
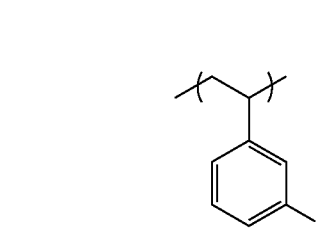
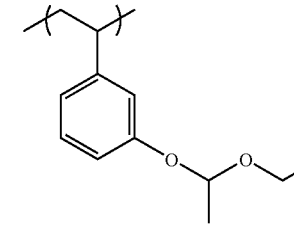
(R-73)
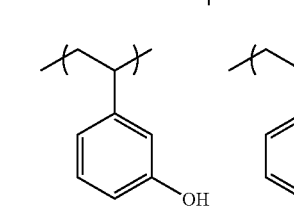
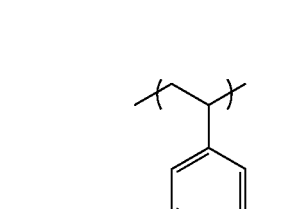
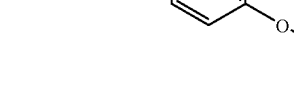

-continued
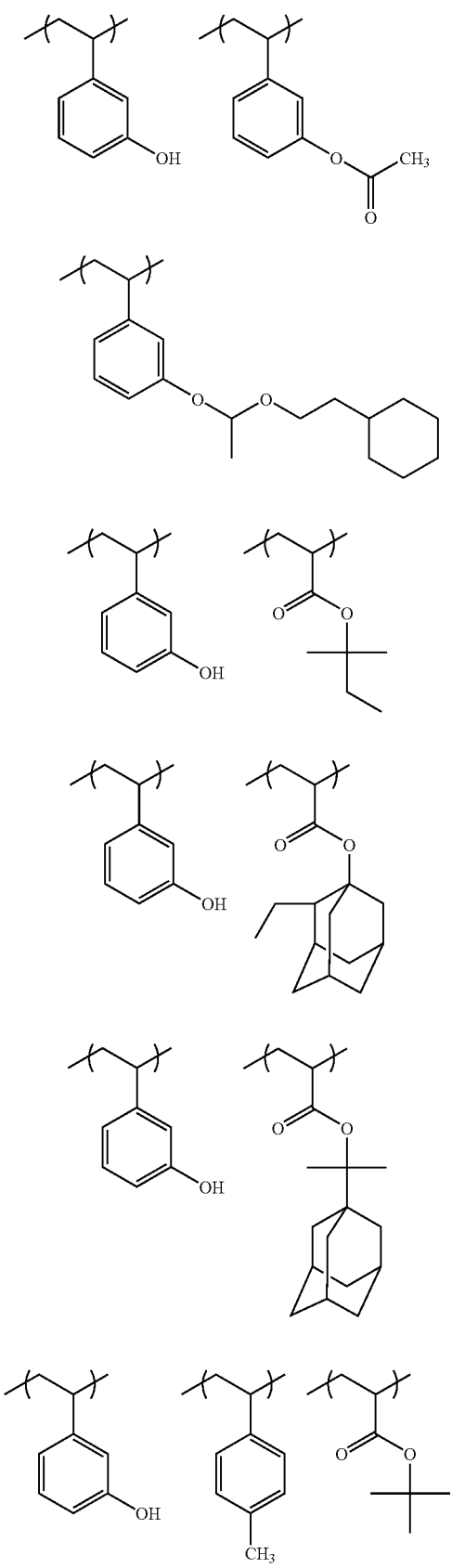
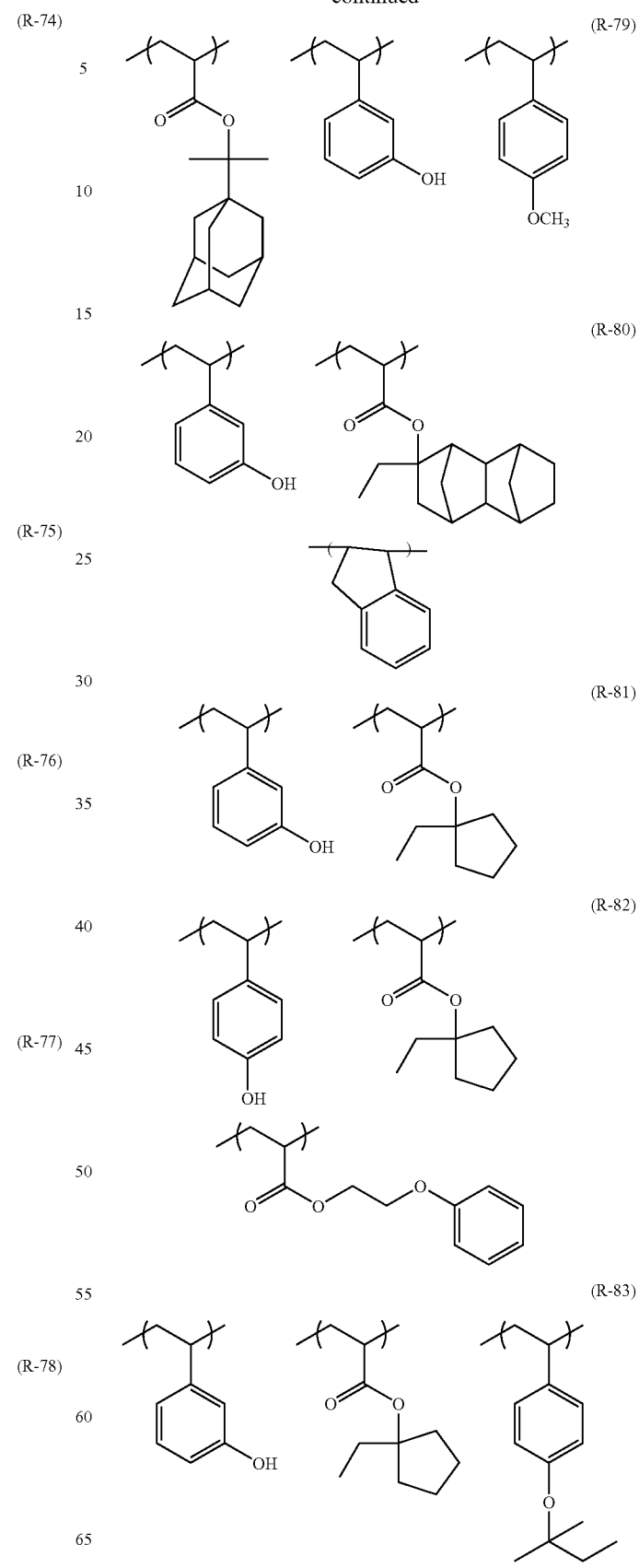

-continued

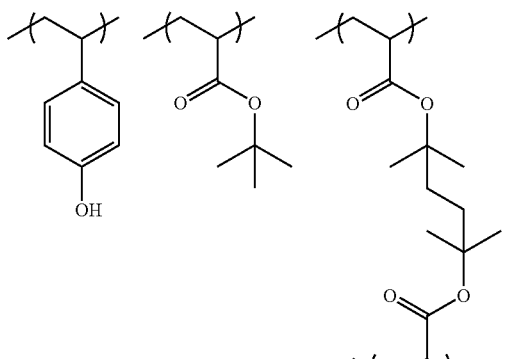
(R-84)

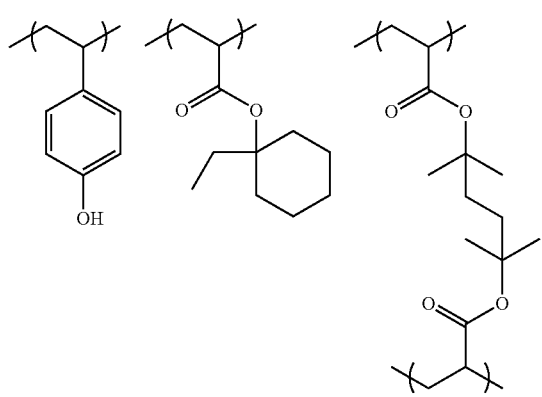
(R-85)

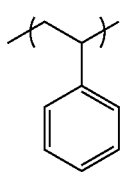

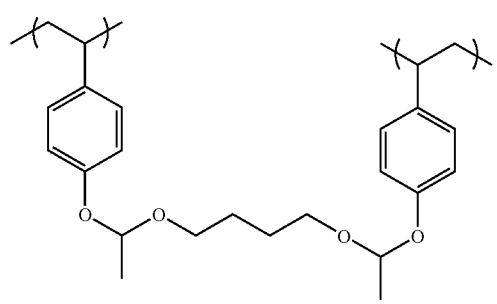
(R-86)

The polymer compound manufactured according to the manufacturing method in the invention is preferably used in a positive photosensitive composition.

The components other than the polymer compound of the invention for use in a positive photosensitive composition are described below.

A Compound Capable of Generating an Acid Upon Irradiation with Actinic Ray or Radiation:

The positive photosensitive composition in the invention contains a compound capable of generating an acid upon irradiation with actinic ray or radiation (hereinafter also referred to as "a light-acid generator").

As such light-acid generators, photoinitiators of photocationic polymerization, photoinitiators of photoradical polymerization, photo-decoloring agents and photo-discoloring agents of dyestuffs, and known compounds capable of generating an acid upon irradiation with actinic ray or radiation that are used in micro-resists and the like, and the mixtures of these compounds can be optionally selected and used.

For example, diazonium salt, phosphonium salt, sulfonium salt, iodonium salt, imidosulfonate, oximesulfonate, diazodisulfone, disulfone, and o-nitrobenzylsulfonate are exemplified.

Further, compounds obtained by introducing a group or a compound capable of generating an acid upon irradiation with actinic ray or radiation into the main chain or side chain of polymers, for example, the compounds disclosed in U.S. Pat. No. 3,849,137, German Patent 3,914,407, JP-A-63-26653, JP-A-55-164824, JP-A-62-69263, JP-A-63-146038, JP-A-63-163452, JP-A-62-153853, JP-A-63-146029, etc., can be used.

The compounds generating an acid by the action of lights as disclosed in U.S. Pat. No. 3,779,778, EP 126,712, etc., can also be used.

Of the compounds capable of generating an acid upon irradiation with actinic ray or radiation, the compounds represented by any of the following formulae (ZI), (ZII) and (ZIII) can be exemplified as preferred compounds.

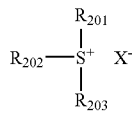
ZI

ZII

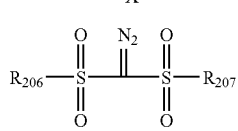
ZIII

In formula (ZI), $R_{201}$, $R_{202}$ and $R_{203}$ each independently represents an organic group.

$X^-$ represents a non-nucleophilic anion, preferably a sulfonate anion, a carboxylate anion, a bis(alkylsulfonyl)-amide anion, a tris(alkylsulfonyl)methide anion, $BF_4^-$, $PF_6^-$, $SbF_6^-$, etc., are exemplified, and preferably an organic anion having a carbon atom.

As preferred organic anions, organic anions represented by any of the following formulae (AN1) to (AN4) are exemplified.

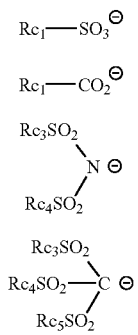

In formulae (AN1) and (AN2), $Rc_1$ represents an organic group.

As the organic group represented by $Rc_1$ in formulae (AN1) and (AN2), an organic group having from 1 to 30 carbon atoms is exemplified, preferably an alkyl group, a cycloalkyl group, an aryl group, each of which groups may be substituted, or a group obtained by linking a plurality of these groups with a linking group such as a single bond, —O—, —$CO_2$—, —S—, —$SO_3$— or —$SO_2N(Rd_1)$— can be exemplified. $Rd_1$ represents a hydrogen atom or an alkyl group, and $Rd_1$ may form a cyclic structure together with the bonding alkyl group, cycloalkyl group, or aryl group.

The more preferred organic groups represented by $Rc_1$ are an alkyl group substituted with a fluorine atom or a fluoroalkyl group on the 1-position, and a phenyl group substituted with a fluorine atom or a fluoroalkyl group. By the presence of a fluorine atom or a fluoroalkyl group, the acidity of the acid generated with light irradiation increases to enhance sensitivity. When $Rc_1$ has 5 or more carbon atoms, it is preferred that at least one carbon atom has a hydrogen atom, such that not all the hydrogen atoms are substituted with fluorine atoms, and it is more preferred that the number of hydrogen atoms is larger than the number of fluorine atoms. Not containing a perfluoroalkyl group having 5 or more carbon atoms contributes to the reduction of toxicity to ecosystem.

As an especially preferred embodiment of $Rc_1$, a group represented by the following formula can be exemplified.

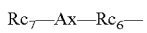

$$Rc_7\text{—}Ax\text{—}Rc_6\text{—}$$

In the above formula, $Rc_6$ represents a perfluoroalkylene group having preferably 4 or less carbon atoms, more preferably from 2 to 4, and still more preferably from 2 to 3 carbon atoms, or a phenylene group substituted with from 1 to 4 fluorine atoms and/or from 1 to 3 fluoroalkyl groups.

Ax represents a single bond, or a divalent linking group (preferably —O—, —$CO_2$—, —S—, —$SO_3$— or —$SO_2N(Rd_1)$—). $Rd_1$ represents a hydrogen atom or an alkyl group, and may be bonded to $Rc_7$ to form a cyclic structure.

$Rc_7$ represents a hydrogen atom, a fluorine atom, a straight chain or branched, monocyclic or polycyclic cycloalkyl group or an aryl group, which groups may be substituted. It is preferred that the alkyl group, cycloalkyl group and aryl group that may be substituted do not have a fluorine atom as the substituent.

In formulae (AN3) and (AN4), $Rc_3$, $Rc_4$ and $Rc_5$ each independently represents an organic group.

$Rc_3$ and $Rc_4$ may be bonded to each other to form a ring.

As preferred organic groups represented by $Rc_3$, $Rc_4$ and $Rc_5$ in formulae (AN3) and (AN4), the same organic groups as preferred organic groups in $Rc_1$ can be exemplified.

When $Rc_3$ and $Rc_4$ are bonded to each other to form a ring, as the group formed by bonding $Rc_3$ and $Rc_4$, an alkylene group and an arylene group are exemplified, and preferably a perfluoroalkylene group having from 2 to 4 carbon atoms is exemplified. By bonding $Rc_3$ and $Rc_4$ and forming a ring, the acidity of the acid generated with light irradiation increases to improve sensitivity.

In formula (ZI), the number of carbon atoms of the organic groups represented by $R_{201}$, $R_{202}$ and $R_{203}$ is generally from 1 to 30, and preferably from 1 to 20.

Any two of $R_{201}$, $R_{202}$ and $R_{203}$ may be bonded to each other to form a cyclic structure, and an oxygen atom, a sulfur atom, an ester bond, an amido bond or a carbonyl group may be contained in the ring. As the group formed by any two of $R_{201}$, $R_{202}$ and $R_{203}$ by bonding, an alkylene group (e.g., a butylene group and a pentylene group) can be exemplified.

As the specific examples of the organic groups represented by $R_{201}$, $R_{202}$ and $R_{203}$, the corresponding groups in compounds (ZI-1), (ZI-2) and (ZI-3) described later can be exemplified.

The compound represented by formula (ZI) may be a compound having a plurality of structures represented by formula (ZI). For instance, compound (ZI) may be a compound having a structure that at least one of $R_{201}$, $R_{202}$ and $R_{203}$ of the compound represented by formula (ZI) is bonded to at least one of $R_{201}$, $R_{202}$ and $R_{203}$ of another compound represented by formula (ZI).

As further preferred component (ZI), the following compounds (ZI-1), (ZI-2) and (ZI-3) can be exemplified.

Compound (ZI-1) is an arylsulfonium compound in the case where at least one of $R_{201}$, $R_{202}$ and $R_{203}$ in formula (ZI) represents an aryl group, that is, a compound having arylsulfonium as the cation.

All of $R_{201}$, $R_{202}$ and $R_{203}$ of the arylsulfonium compound may be aryl groups, or a part of $R_{201}$, $R_{202}$ and $R_{203}$ may be an aryl group and the remainder may be an alkyl group or a cycloalkyl group.

As the arylsulfonium compound, e.g., a triarylsulfonium compound, a diarylalkylsulfonium compound, an aryldialkyl-sulfonium compound, a diarylcycloalkylsulfonium compound, and an aryldicycloalkylsulfonium compound can be exemplified.

As the aryl group of the arylsulfonium compound, an aryl group, e.g., a phenyl group and a naphthyl group, and a hetero-aryl group, e.g., an indole residue and a pyrrole residue are preferred, and a phenyl group and an indole residue are more preferred. When the arylsulfonium compound has two or more aryl groups, these two or more aryl groups may be the same or different.

The alkyl group incorporated into the arylsulfonium compound according to necessity is preferably a straight chain or branched alkyl group having from 1 to 15 carbon atoms, e.g., a methyl group, an ethyl group, a propyl group, an n-butyl group, a sec-butyl group, a t-butyl group, etc., can be exemplified.

The cycloalkyl group incorporated into the arylsulfonium compound according to necessity is preferably a cycloalkyl group having from 3 to 15 carbon atoms, e.g., a cyclopropyl group, a cyclobutyl group, a cyclohexyl group, etc., can be exemplified.

The aryl group, alkyl group and cycloalkyl group represented by $R_{201}$, $R_{202}$ and $R_{203}$ may have a substituent, e.g., an alkyl group (e.g., having from 1 to 15 carbon atoms), a cycloalkyl group (e.g., having from 3 to 15 carbon atoms), an aryl group (e.g., having from 6 to 14 carbon atoms), an alkoxyl group (e.g., having from 1 to 15 carbon atoms), a halogen atom, a hydroxyl group, and a phenylthio group are exemplified as the substituents. The preferred substituents are a straight chain or branched alkyl group having from 1 to 12 carbon atoms, a cycloalkyl group having from 3 to 12 carbon atoms, and a straight chain, branched, or cyclic alkoxyl group having from 1 to 12 carbon atoms, and the most preferred substituents are an alkyl group having from 1 to 4 carbon atoms, and an alkoxyl group having from 1 to 4 carbon atoms. The substituent may be substituted on any one of three of $R_{201}$, $R_{202}$ and $R_{203}$, or may be substituted on all of the three. When $R_{201}$, $R_{202}$ and $R_{203}$ each independently represents an aryl group, it is preferred that the substituent is substituted on the p-position of the aryl group.

Compound (ZI-2) is described below.

Compound (ZI-2) is a compound in the case where $R_{201}$, $R_{202}$ and $R_{203}$ in formula (ZI) each independently represents an organic group not having an aromatic ring. The aromatic ring here also includes an aromatic ring containing a hetero atom.

The organic group not having an aromatic ring represented by $R_{201}$, $R_{202}$ and $R_{203}$ generally has from 1 to 30 carbon atoms, and preferably from 1 to 20 carbon atoms.

$R_{201}$, $R_{202}$ and $R_{203}$ each preferably represents an alkyl group, a cycloalkyl group, an allyl group, or a vinyl group, more preferably a straight chain, branched or cyclic 2-oxoalkyl group, or an alkoxycarbonylmethyl group, and most preferably a straight chain or branched 2-oxoalkyl group.

The alkyl group represented by $R_{201}$, $R_{202}$ and $R_{203}$ may be either straight chain or branched, preferably a straight chain or branched alkyl group having from 1 to 10 carbon atoms, e.g., a methyl group, an ethyl group, a propyl group, a butyl group, and a pentyl group can be exemplified. The alkyl group represented by $R_{201}$, $R_{202}$ and $R_{203}$ is more preferably a straight chain or branched 2-oxoalkyl group or an alkoxymethyl group.

The cycloalkyl group represented by $R_{201}$, $R_{202}$ and $R_{203}$ is preferably a cycloalkyl group having from 3 to 10 carbon atoms, e.g., a cyclopentyl group, a cyclohexyl group, and a norbornyl group can be exemplified.

The 2-oxoalkyl group represented by $R_{201}$, $R_{202}$ and $R_{203}$ may be any of straight chain, branched or cyclic, and preferably a group having >C=O on the 2-position of the above alkyl group and cycloalkyl group can be exemplified.

As the alkoxyl group in the alkoxycarbonylmethyl group represented by $R_{201}$, $R_{202}$ and $R_{203}$, preferably an alkoxyl group having from 1 to 5 carbon atoms, e.g., a methoxy group, an ethoxy group, a propoxy group, a butoxy group, and a pentoxy group can be exemplified.

$R_{201}$, $R_{202}$ and $R_{203}$ may further be substituted with a halogen atom, an alkoxyl group (e.g., having from 1 to 5 carbon atoms), a hydroxyl group, a cyano group, or a nitro group.

Compound (ZI-3) is a compound represented by the following formula (ZI-3) and has a phenacylsulfonium salt structure.

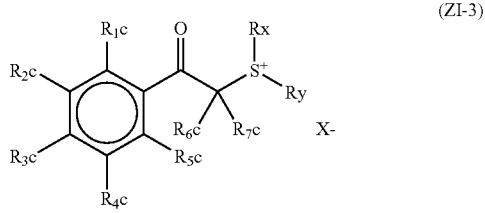

(ZI-3)

In formula (ZI-3), $R_{1c}$, $R_{2c}$, $R_{3c}$, $R_{4c}$ and $R_{5c}$ each independently represents a hydrogen atom, an alkyl group, a cycloalkyl group, an alkoxyl group, or a halogen atom.

$R_{6c}$ and $R_{7c}$ each independently represents a hydrogen atom, an alkyl group or a cycloalkyl group.

$R_x$ and $R_y$ each independently represents an alkyl group, a cycloalkyl group, an allyl group, or a vinyl group.

Any two or more of $R_{1c}$ to $R_{7c}$, and $R_x$ and $R_y$ may be bonded to each other to form cyclic structures, respectively, and the cyclic structures may contain an oxygen atom, a sulfur atom, an ester bond, or an amido bond. As the groups formed by any two or more of $R_{1c}$ to $R_{7c}$, and $R_x$ and $R_y$, by bonding, a butylene group, a pentylene group, etc., can be exemplified.

$X^-$ represents a non-nucleophilic anion, and has the same meaning as $X^-$ in formula (ZI).

The alkyl group represented by $R_{1c}$ to $R_{7c}$ may be either straight chain or branched, e.g., an alkyl group having from 1 to 20 carbon atoms, preferably a straight chain or branched alkyl group having from 1 to 12 carbon atoms, e.g., a methyl group, an ethyl group, a straight chain or branched propyl group, a straight chain or branched butyl group, and a straight chain or branched pentyl group can be exemplified.

As the cycloalkyl group represented by $R_{1c}$ to $R_{7c}$, preferably a cycloalkyl group having from 3 to 8 carbon atoms, e.g., a cyclopentyl group and a cyclohexyl group can be exemplified.

The alkoxyl group represented by $R_{1c}$ to $R_{5c}$ may be any of straight chain, branched, or cyclic, e.g., an alkoxyl group having from 1 to 10 carbon atoms, preferably a straight chain or branched alkoxyl group having from 1 to 5 carbon atoms (e.g., a methoxy group, an ethoxy group, a straight chain or branched propoxy group, a straight chain or branched butoxy group, and a straight chain or branched pentoxy group), a cyclic alkoxyl group having from 3 to 8 carbon atoms (e.g., a cyclopentyloxy group, and a cyclohexyloxy group) can be exemplified.

It is preferred that any of $R_{1c}$ to $R_{5c}$ represents a straight chain or branched alkyl group, a cycloalkyl group, or a straight chain, branched, or cyclic alkoxyl group, and more preferably the sum total of the carbon atoms of $R_{1c}$ to $R_{5c}$ is from 2 to 15, by which the solubility in a solvent is bettered and the generation of particles during preservation can be restrained.

As the alkyl group represented by $R_x$ and $R_y$, the same alkyl groups as represented by $R_{1c}$ to $R_{7c}$ can be exemplified. The alkyl group represented by $R_x$ and $R_y$ is more preferably a straight chain or branched 2-oxoalkyl group or an alkoxycarbonylmethyl group.

As the cycloalkyl group represented by $R_x$ and $R_y$, the same cycloalkyl groups as represented by $R_{1c}$ to $R_{7c}$ can be exemplified. The cycloalkyl group represented by $R_x$ and $R_y$ is more preferably a cyclic 2-oxoalkyl group.

As the straight chain, branched, or cyclic 2-oxoalkyl group, a group having >C=O on the 2-position of the alkyl group or the cycloalkyl group represented by $R_{1c}$ to $R_{7c}$ can be exemplified.

As the alkoxyl group in the alkoxycarbonylmethyl group, the same alkoxyl groups as represented by $R_{1c}$ to $R_{5c}$ can be exemplified.

$R_x$ and $R_y$ each preferably represents an alkyl group having 4 or more carbon atoms, more preferably 6 or more carbon atoms, and still more preferably an alkyl group having 8 or more carbon atoms.

In formulae (ZII) and (ZIII), $R_{204}$, $R_{205}$, $R_{206}$ and $R_{207}$ each independently represents an aryl group, an alkyl group, or a cycloalkyl group.

The aryl group represented by $R_{204}$ to $R_{207}$ is preferably a phenyl group or a naphthyl group, and more preferably a phenyl group.

The alkyl group represented by $R_{204}$ to $R_{207}$ may be either straight chain or branched, and preferably a straight chain or branched alkyl group having from 1 to 10 carbon atoms, e.g., a methyl group, an ethyl group, a propyl group, a butyl group, and a pentyl group can be exemplified.

The cycloalkyl group represented by $R_{204}$ to $R_{207}$ is preferably a cycloalkyl group having from 3 to 10 carbon atoms, e.g., a cyclopentyl group, a cyclohexyl group, and a norbornyl group can be exemplified.

$R_{204}$ to $R_{207}$ may each have a substituent. As the examples of the substituents that $R_{204}$ to $R_{207}$ may have, e.g., an alkyl group (e.g., having from 1 to 15 carbon atoms), a cycloalkyl group (e.g., having from 3 to 15 carbon atoms), an aryl group (e.g., having from 6 to 15 carbon atoms), an alkoxyl group (e.g., having from 1 to 15 carbon atoms), a halogen atom, a hydroxyl group, a phenylthio group, etc., can be exemplified.

$X^-$ represents a non-nucleophilic anion, and the same anion as the non-nucleophilic anion represented by $X^-$ in formula (ZI) can be exemplified.

Of the compounds capable of generating an acid upon irradiation with actinic ray or radiation, the compounds represented by the following formula (ZIV), (ZV) or (ZVI) can further be exemplified as preferred compounds.

$$Ar_3\text{---}SO_2\text{---}SO_2\text{---}Ar_4 \quad \text{ZIV}$$

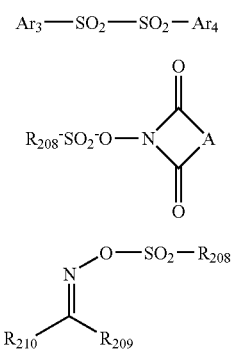

ZV

ZVI

In formulae (ZIV) to (ZVI), $Ar_3$ and $Ar_4$ each independently represents an aryl group.

$R_{208}$ represents an alkyl group, a cycloalkyl group, or an aryl group.

$R_{209}$ and $R_{210}$ each independently represents an alkyl group, a cycloalkyl group, an aryl group, or an electron attractive group. $R_{209}$ preferably represents an aryl group. $R_{210}$ preferably represents an electron attractive group, and more preferably a cyano group or a fluoroalkyl group.

A represents an alkylene group, a cycloalkylene group, an alkenylene group, or an arylene group.

As the compound capable of generating an acid upon irradiation with actinic ray or radiation, a compound represented by any of formulae (ZI), (ZII) and (ZIII) is more preferred, a compound represented by formula (ZI) is still more preferred, and a compound represented by any of formulae (ZI-1) to (ZI-3) is still yet preferred.

Further, a compound capable of generating an acid upon irradiation with actinic ray or radiation represented by any of the following formulae (AC1) to (AC3) is preferred.

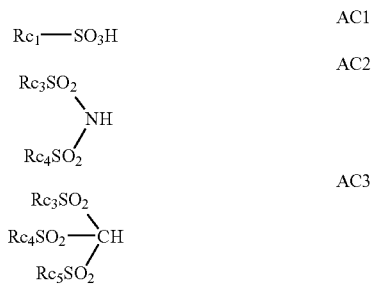

That is, as an especially preferred embodiment of a light-acid generator, a compound having a structure represented by formula (ZI) wherein $X^-$ represents an anion selected from formulae (AN1), (AN2) and (AN3) can be exemplified.

Of the compounds capable of decomposing upon irradiation with actinic ray or radiation to generate an acid, especially preferred examples are shown below.

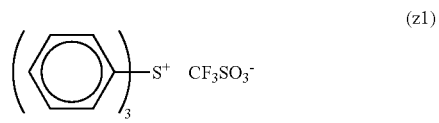
(z1)

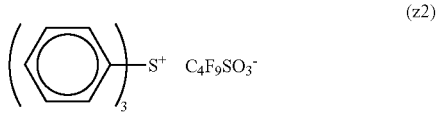
(z2)

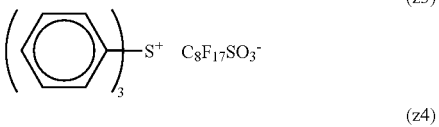
(z3)

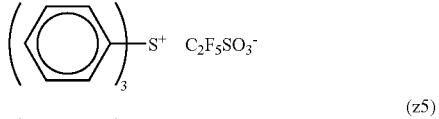
(z4)

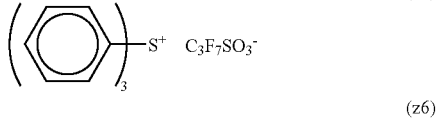
(z5)

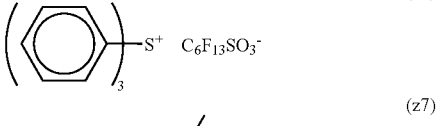
(z6)

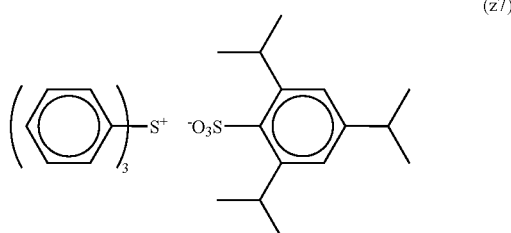
(z7)

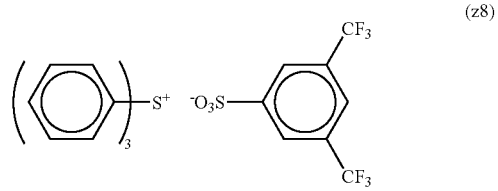
(z8)

-continued
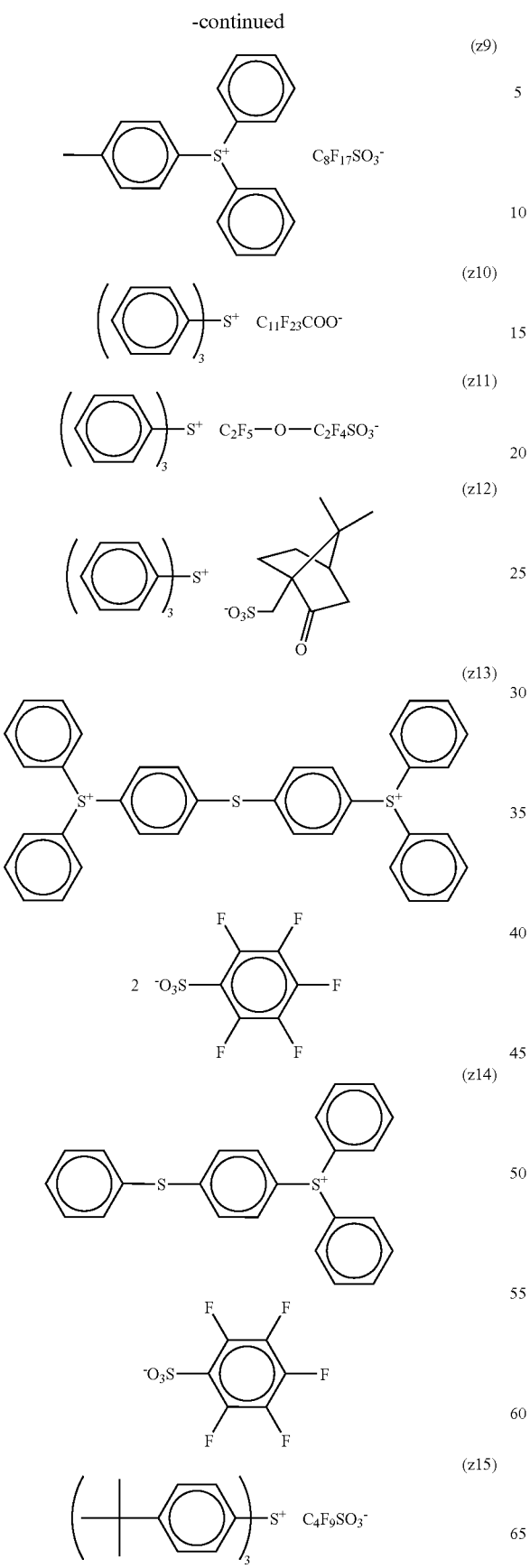
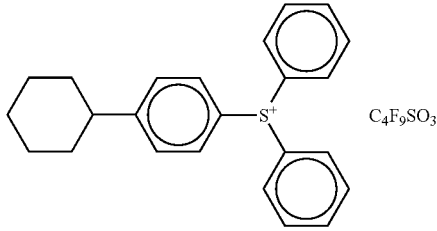
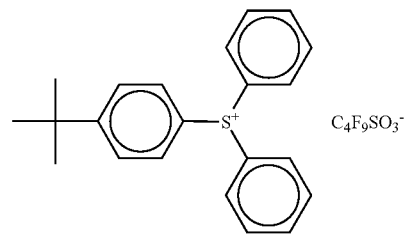
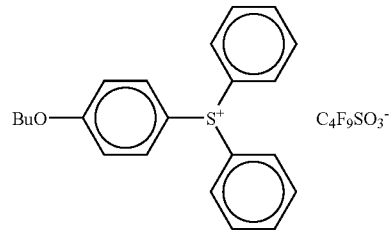
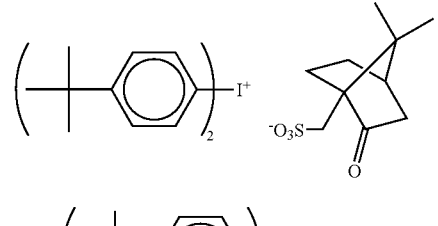
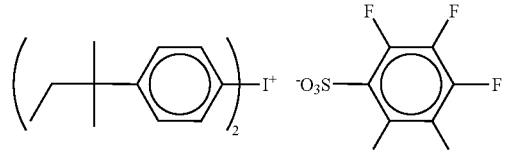
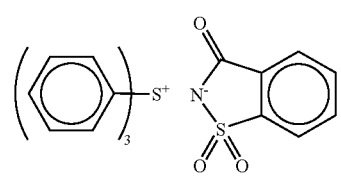
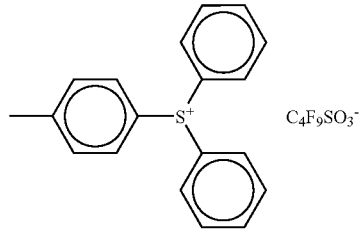

-continued
(z24) 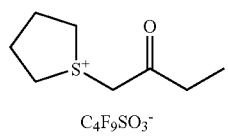
(z25) 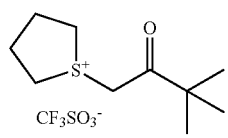
(z26) 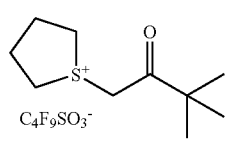
(z27) 
(z28) 
(z29) 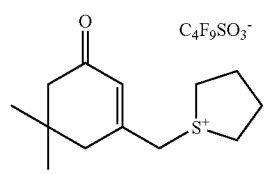
(z30) 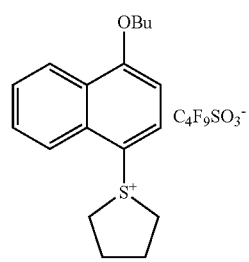
(z31) 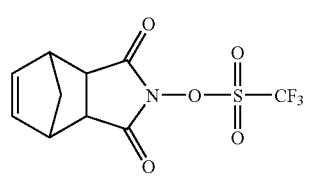
(z32) 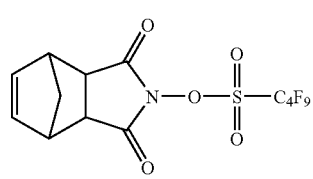
-continued
(z33) 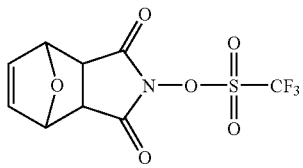
(z34) 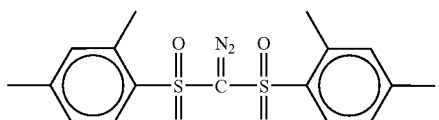
(z35) 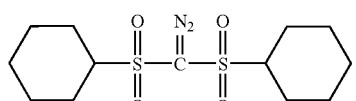
(z36) 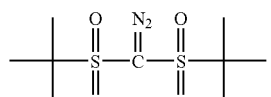
(z37) 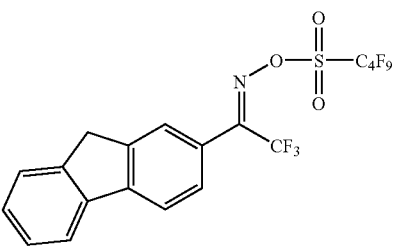
(z38) 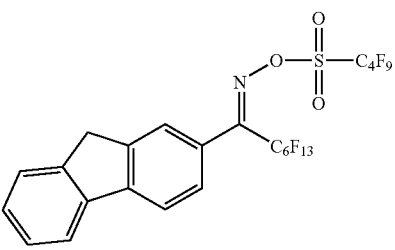
(z39) 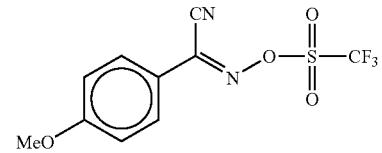
(z40) 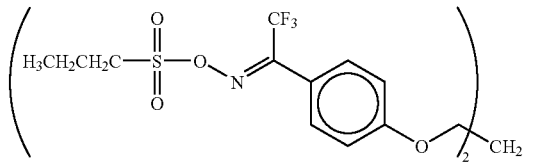
(z41) 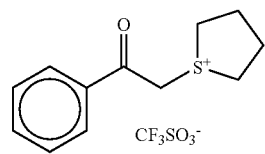

-continued
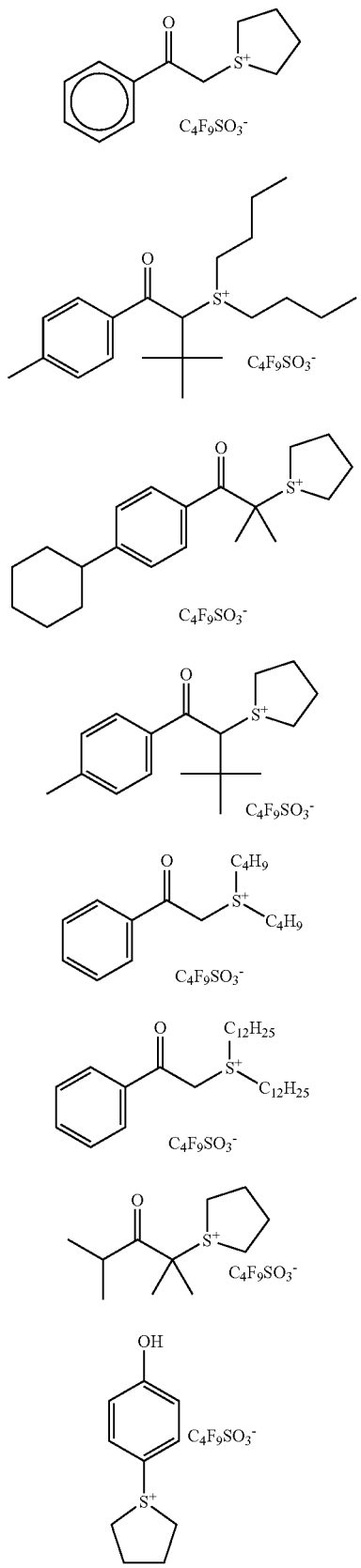
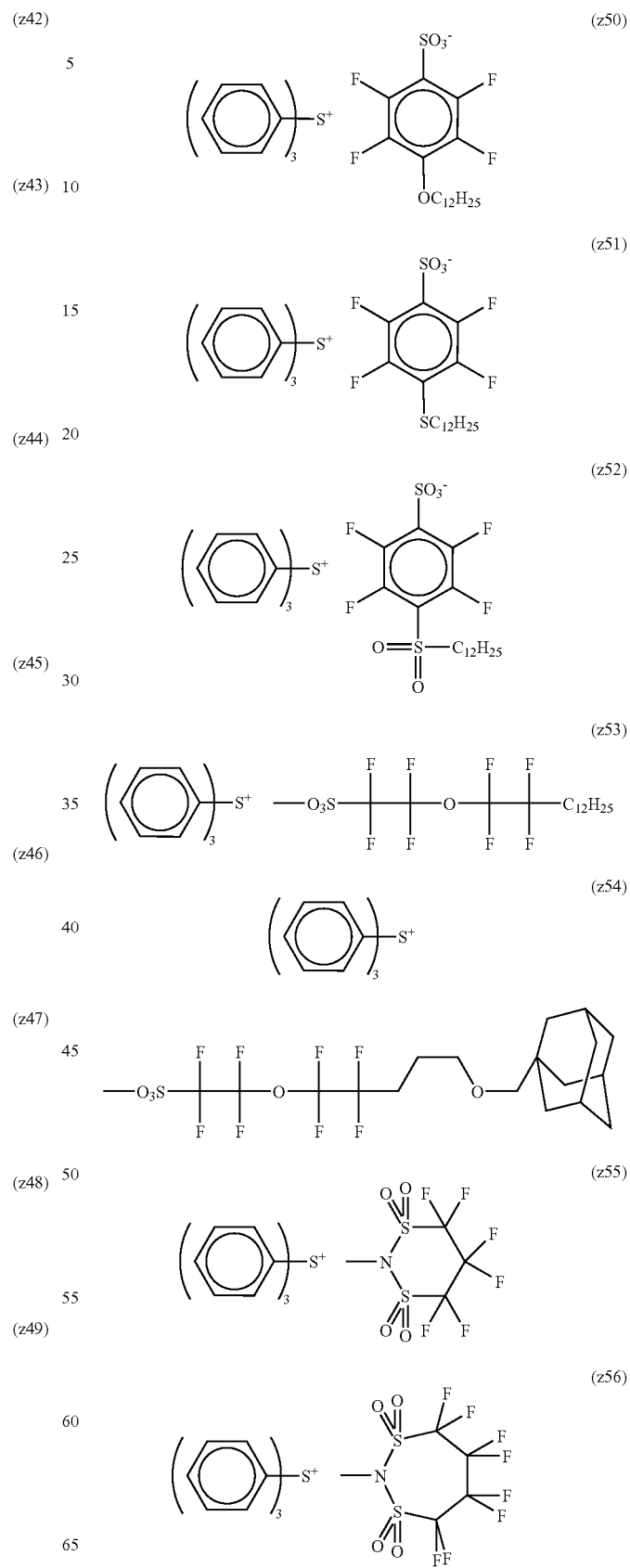

-continued
(z57)
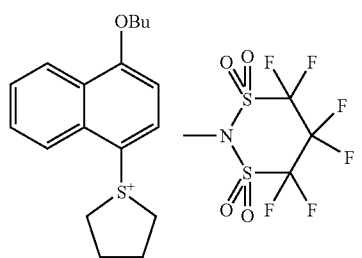
(z58)
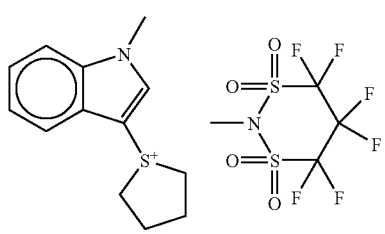
(z59)
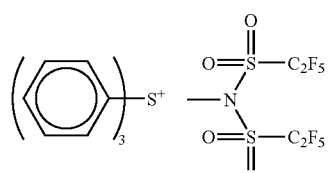
(z60)
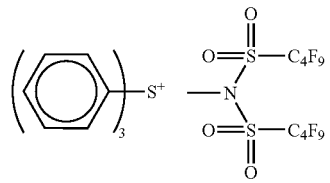
(z61)
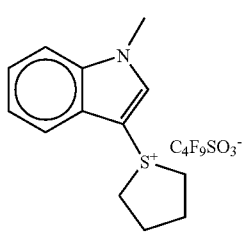
(z62)
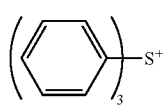
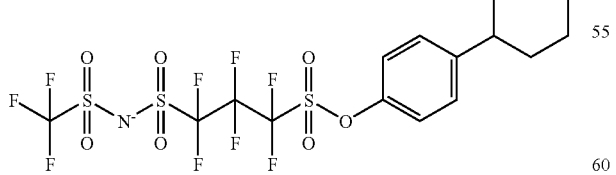
(z63)
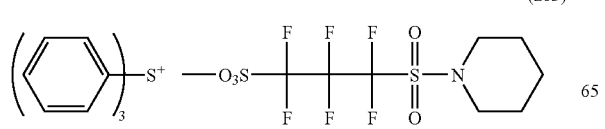
-continued
(z64)
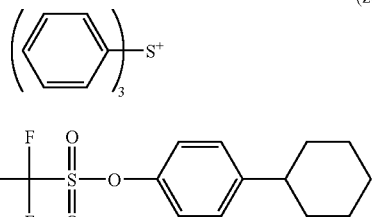
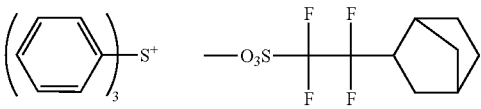
(z65)
(z66)
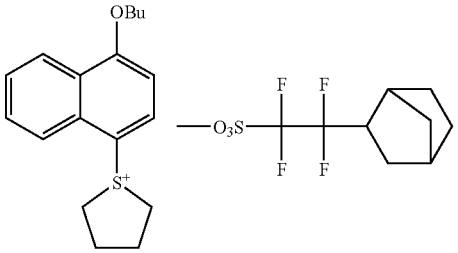
(z67)
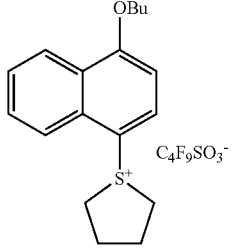
(z68)
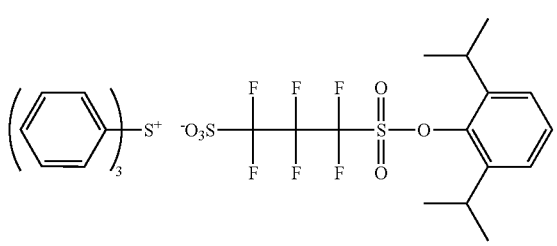
(z69)
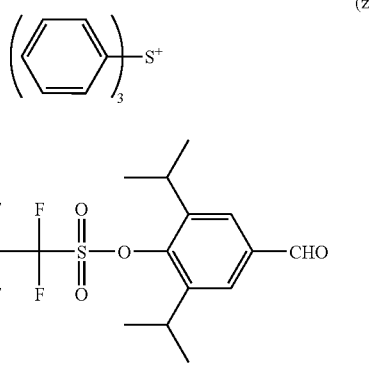

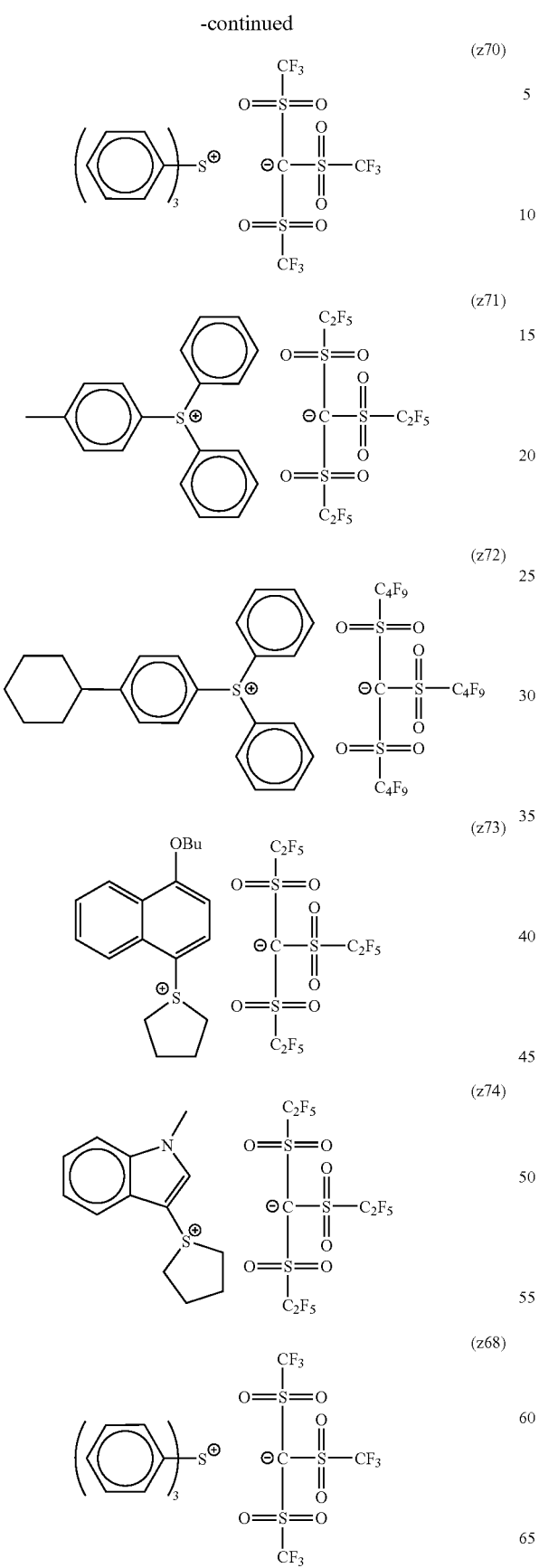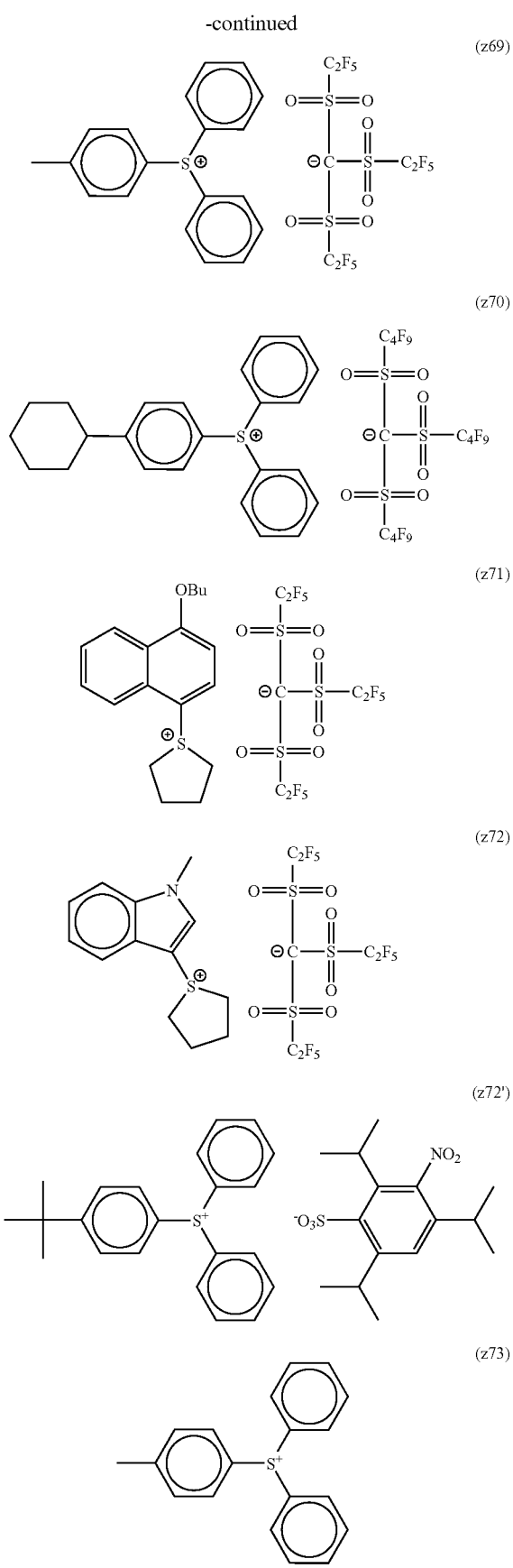

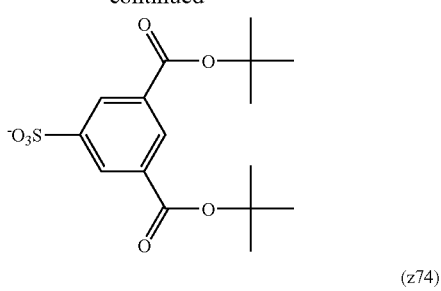

(z74)

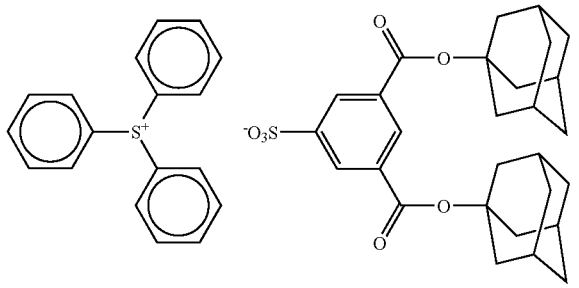

(z75)

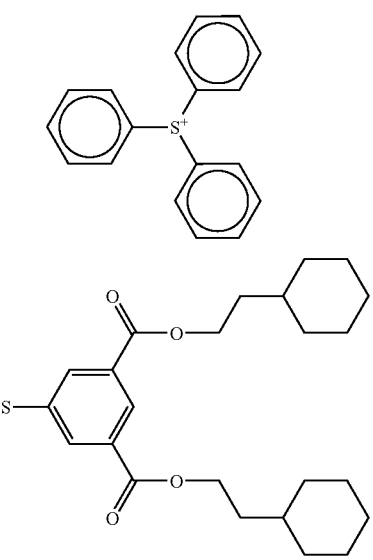

(z76)

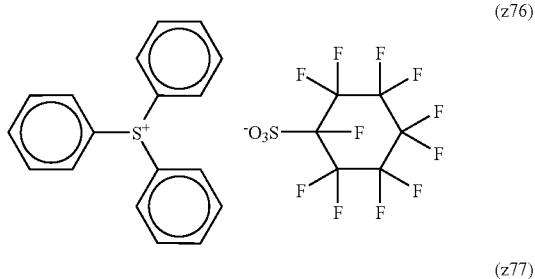

(z77)

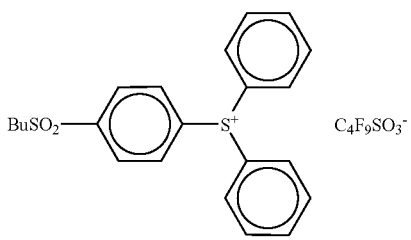

Light-acid generators can be used by one kind alone, or two or more kinds can be used in combination. When two or more compounds are used in combination, it is preferred to combine compounds capable of generating two kinds of organic acids in which the total atom number exclusive of hydrogen atoms differs by 2 or more.

The content of a light-acid generator in a composition is preferably from 0.1 to 20 mass % based on all the solids content of the positive photosensitive composition, more preferably from 0.5 to 10 mass %, and still more preferably from 1 to 7 mass %.

A Resin not Having a Group Decomposing by the Action of an Acid:

The positive photosensitive composition in the invention may contain a resin not having a group capable of decomposing by the action of an acid.

The terminology "not having a group capable of decomposing by the action of an acid" means that the positive photosensitive composition of the invention does not show decomposability to the action of an acid in generally used image forming process, or hardly decomposes, and does not substantially have a group that contributes to image formation by acid decomposition. As such resins, a resin having an alkali-soluble group, and a resin having a group capable of decomposing by the action of an alkali to increase solubility in an alkali developing solution are exemplified.

As resins not having a group decomposing by the action of an acid, e.g., resins having at least one kind of constituent unit derived from (meth)acrylic acid derivatives and/or alicyclic olefin derivatives are preferred.

As alkali-soluble groups contained in resins not having a group decomposing by the action of an acid, e.g., a carboxyl group, a phenolic hydroxyl group, an aliphatic hydroxyl group substituted with an electron attractive group on the 1- or 2-position, an amino group substituted with an electron attractive group (e.g., a sulfonamido group, a sulfonimido group, and a bissulfonylimido group), and a methylene group or a methine group substituted with an electron attractive group (e.g., a methylene group or a methine group substituted with at least two groups selected from a ketone group and an ester group) are preferred.

As a group capable of decomposing by the action of an alkali to increase solubility in an alkali developing solution contained in a resin not having a group decomposing by the action of an acid, e.g., a lactone group and an acid anhydride group are preferred, and a lactone group is more preferred.

A resin not having a group decomposing by the action of an acid may further have a constituent unit having functional groups besides the above. The constituent unit having other functional groups can introduce appropriate functional groups considering dry etching resistance, hydrophilic/hydrophobic property, mutual action and the like. The constituent units having other functional groups include, e.g., a constituent unit having a polar functional group, e.g., a hydroxyl group, a cyano group, a carbonyl group, or an ester group, a constituent unit having a monocyclic or polycyclic hydrocarbon structure, a constituent unit having a silicon atom, a halogen atom, or a fluoroalkyl group, and a constituent unit having two or more of these functional groups.

The specific examples of preferred resins not having a group decomposing by the action of an acid are shown below.
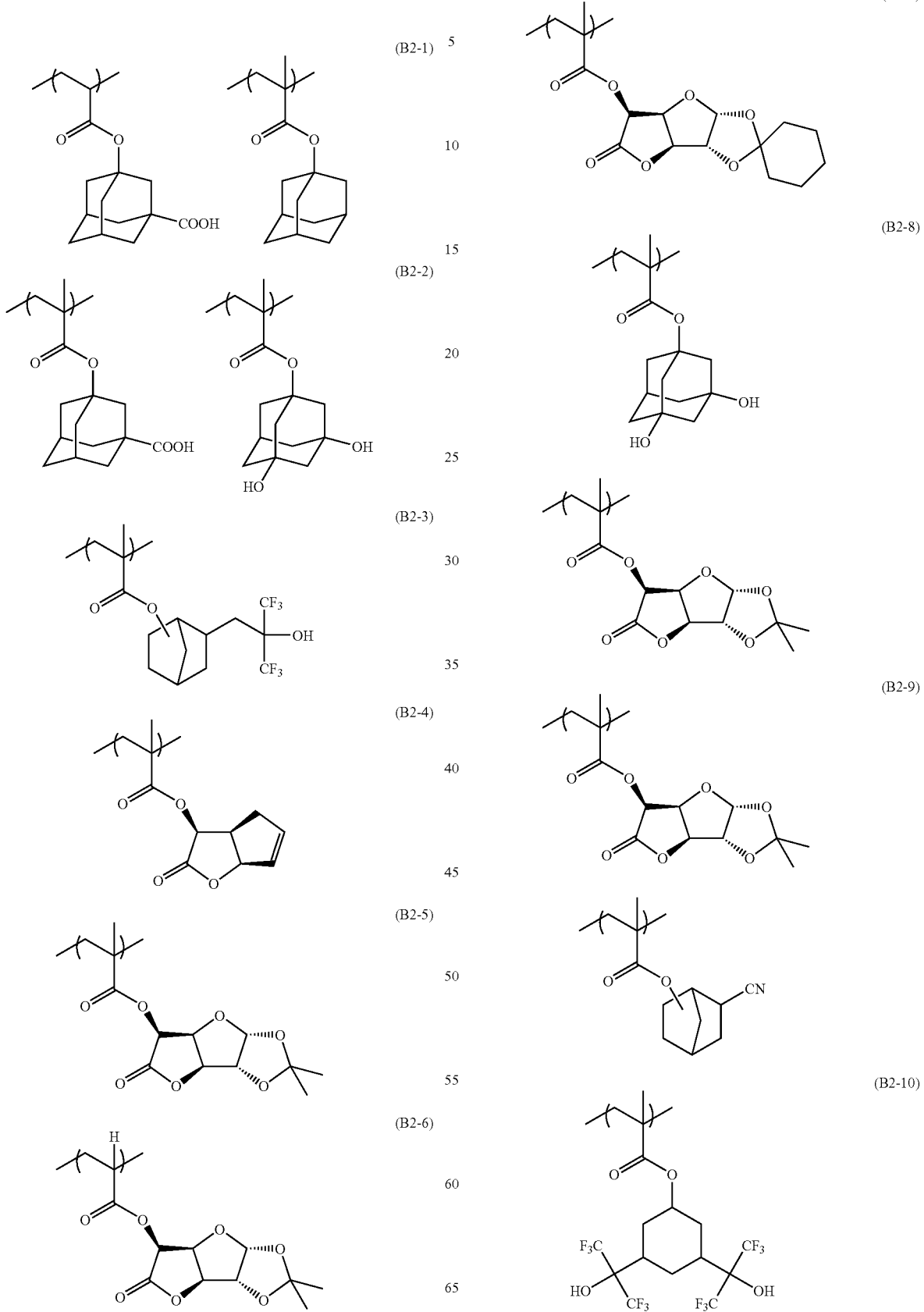

-continued (B2-11)

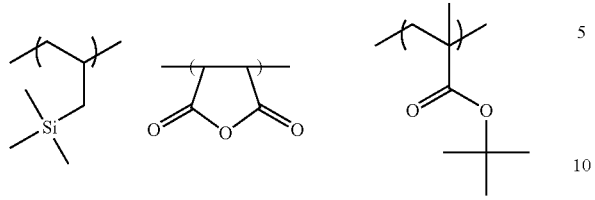

The addition amount of a resin not having a group decomposing by the action of an acid is in the proportion of from 0 to 30 mass % based on the polymer compound, preferably from 0 to 20 mass %, and more preferably from 0 to 15 mass %.

A Dissolution-Controlling Compound Having a Molecular Weight of 3,000 or Less Containing at Least One Group Selected from an Alkali-Soluble Group a Hydrophilic Group and an Acid-Decomposable Group:

The positive photosensitive composition in the invention may contain a dissolution-controlling compound having a molecular weight of 3,000 or less containing at least one group selected from an alkali-soluble group, a hydrophilic group, and an acid-decomposable group (hereinafter also referred to as "a dissolution-controlling compound").

As the dissolution-controlling compound, a compound having an alkali-soluble group, e.g., a carboxyl group, a sulfonylimido group, or a hydroxyl group substituted with a fluoroalkyl group on the α-position, a compound having a hydrophilic group, e.g., a hydroxyl group, a lactone group, a cyano group, an amido group, a pyrrolidone group, or a sulfonamido group, and a compound containing a group capable of decomposing by the action of an acid to release an alkali-soluble group or a hydrophilic group are preferably used. As the group capable of decomposing by the action of an acid to release an alkali-soluble group or a hydrophilic group, a carboxyl group or a hydroxyl group protected with an acid-decomposable group is preferred. So as not to reduce transmission of 220 nm or less, it is preferred that the dissolution-controlling compound contains a compound not containing an aromatic ring, or a compound containing an aromatic ring in addition amount of 20 wt % or less of the solids content of the composition.

Preferred dissolution-controlling compounds are a carboxylic acid compound having an alicyclic hydrocarbon structure such as adamantane(di)carboxylic acid, norbornane-carboxylic acid, or cholic acid, a compound having any of these carboxylic acids protected with an acid-decomposable group, and a compound having saccharides such as polyol protected with an acid-decomposable group, or the hydroxyl groups thereof protected with an acid-decomposable group.

The molecular weight of the dissolution-controlling compound in the invention is 3,000 or less, preferably from 300 to 3,000, and more preferably from 500 to 2,500.

The addition amount of the dissolution-controlling compound is preferably from 3 to 40 mass % based on the solids content of the positive photosensitive composition, and more preferably from 5 to 20 mass %.

The specific examples of the dissolution-controlling compounds are shown below, but the invention is not restricted to these compounds.

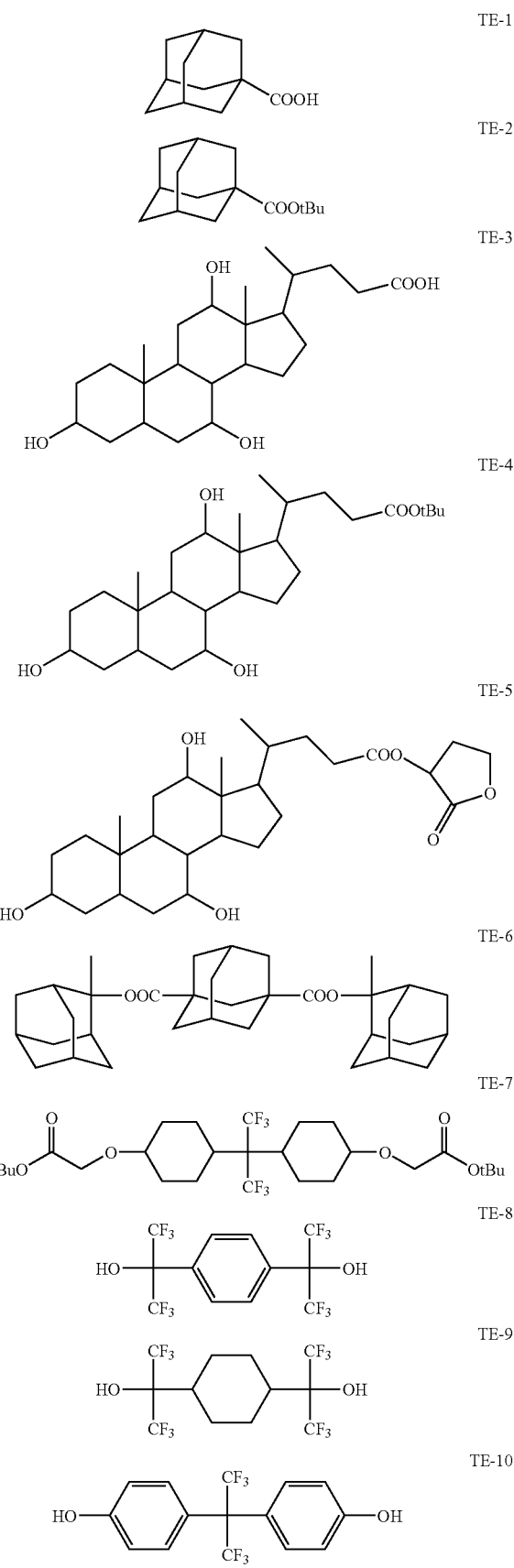

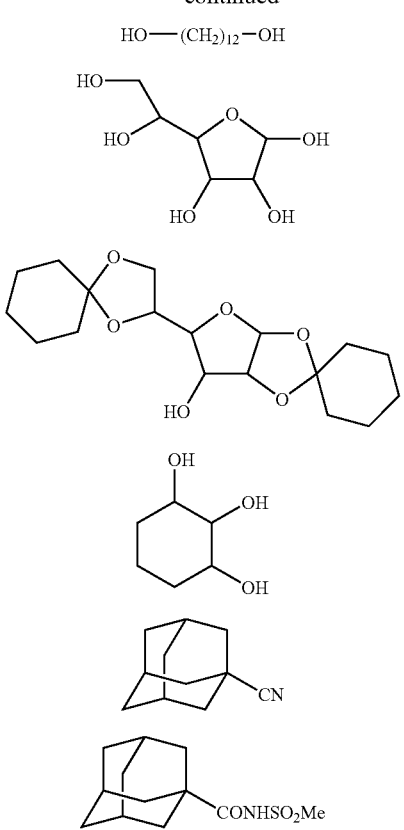

TE-11
TE-12
TE-13
TE-14
TE-15
TE-16

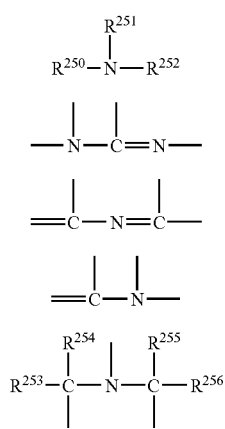

Basic Compounds:

For reducing the fluctuation of performances due to aging from exposure to heating, or restraining the diffusibility of an acid generated by exposure into the film, it is preferred for the positive photosensitive composition of the invention to contain a basic compound.

As basic compounds, nitrogen-containing basic compounds and onium salt compounds can be exemplified. As preferred structure of nitrogen-containing basic compounds, compounds having a partial structure represented be any of the following formulae (A) to (E) can be exemplified.

$$R^{250}-\underset{\underset{R^{252}}{|}}{\overset{\overset{R^{251}}{|}}{N}}-R^{252}$$ (A)

$$-N-C=N-$$ (B)

$$=C-N=C-$$ (C)

$$=C-N-$$ (D)

$$R^{253}-\underset{\underset{}{|}}{\overset{\overset{R^{254}}{|}}{C}}-\underset{\underset{}{|}}{\overset{}{N}}-\underset{\underset{}{|}}{\overset{\overset{R^{255}}{|}}{C}}-R^{256}$$ (E)

In formula (A), $R^{250}$, $R^{251}$ and $R^{252}$ each independently represents a hydrogen atom, an alkyl group having from 1 to 20 carbon atoms, a cycloalkyl group having from 3 to 20 carbon atoms, or an aryl group having from 6 to 20 carbon atoms, and $R^{250}$ and $R^{251}$ may be bonded to each other to form a ring. These groups may have a substituent, and as the alkyl group and the cycloalkyl group having a substituent, an aminoalkyl group having from 1 to 20 carbon atoms, an aminocycloalkyl group having from 3 to 20 carbon atoms, a hydroxyalkyl group having from 1 to 20 carbon atoms, and a hydroxycycloalkyl group having from 3 to 20 carbon atoms are preferred. These groups may contain an oxygen atom, a sulfur atom or a nitrogen atom in the alkyl chain.

In formula (E), $R^{253}$, $R^{254}$, $R^{255}$ and $R^{256}$ each independently represents an alkyl group having from 1 to 6 carbon atoms, or a cycloalkyl group having from 3 to 6 carbon atoms.

As preferred examples of basic compounds, guanidine, aminopyrrolidine, pyrazole, pyrazoline, piperazine, aminomorpholine, aminoalkylmorpholine, and piperidine can be exemplified, and these compounds may have a substituent. As further preferred compounds, compounds having an imidazole structure, a diazabicyclo structure, an onium hydroxide structure, an onium carboxylate structure, a trialkylamine structure, an aniline structure, or a pyridine structure, alkylamine derivatives having a hydroxyl group and/or an ether bond, aniline derivatives having a hydroxyl group and/or an ether bond, etc., can be exemplified.

As the compound having an imidazole structure, 2,4,5-triphenylimidazole and benzimidazole can be exemplified. As the compounds having a diazabicyclo structure, 1,4-diazabicyclo[2,2,2]octane, 1,5-diazabicyclo[4,3,0]nona-5-ene, and 1,8-diazabicyclo[5,4,0]undeca-7-ene can be exemplified. As the compounds having an onium hydroxide structure, triaryl-sulfonium hydroxide, phenacylsulfonium hydroxide, sulfonium hydroxide having a 2-oxoalkyl group, specifically triphenyl-sulfonium hydroxide, tris(t-butylphenyl)sulfonium hydroxide, bis(t-butylphenyl)iodonium hydroxide, phenacylthiophenium hydroxide, and 2-oxopropylthiophenium hydroxide can be exemplified. The compounds having an onium carboxylate structure are compounds having an onium hydroxide structure in which the anionic part is carboxylated, e.g., acetate, adamantane-1-carboxylate and perfluoroalkyl carboxylate are exemplified. As the compounds having a trialkylamine structure, tri(n-butyl)amine and tri(n-octyl) amine are exemplified. As the aniline compounds, 2,6-diisopropyl-aniline and N,N-dimethylaniline are exemplified. As the alkylamine derivatives having a hydroxyl group and/or an ether bond, ethanolamine, diethanolamine, triethanolamine, and tris(methoxyethoxyethyl)amine are exemplified. As the aniline derivatives having a hydroxyl group and/or an ether bond, N,N-bis(hydroxyethyl)aniline is exemplified.

These basic compounds are used alone or in combination of two or more. The use amount of basic compounds is generally from 0.001 to 10 mass % based on the solids content of the positive photosensitive composition, and preferably from 0.01 to 5 mass %. For obtaining a sufficient addition effect, the addition amount is preferably 0.001 mass % or more, and in view of sensitivity and the developability of a non-exposed part, it is preferably 10 mass % or less.

Fluorine and/or Silicon Surfactant:

It is preferred for the positive photosensitive composition in the invention to further contain either one, or two or more, of fluorine and/or silicon surfactants (a fluorine surfactant, a silicon surfactant, a surfactant containing both a fluorine atom and a silicon atom).

By containing fluorine and/or silicon surfactants, it becomes possible for the positive photosensitive composition in the invention to provide a resist pattern excellent in sensitivity and resolution, and low in adhesion and development defects in using an exposure light source of 250 nm or lower, in particular, 220 nm or lower.

These fluorine and/or silicon surfactants are disclosed, e.g., in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, U.S. Pat. Nos. 5,405,720, 5,360,692, 5,529,881, 5,296,330, 5,436,098, 5,576,143, 5,294,511 and 5,824,451. The commercially available surfactants shown below can also be used as they are.

As commercially available fluorine or silicon surfactants usable in the invention, Eftop EF301 and EF303 (manufactured by Shin-Akita Kasei Co., Ltd.), Fluorad FC 430 and 431 (manufactured by Sumitomo 3M Limited), Megafac F171, F173, F176, F189 and R08 (manufactured by Dainippon Ink and Chemicals Inc.), Sarfron S-382, SC101, 102, 103, 104, 105 and 106 (manufactured by ASAHI GLASS CO., LTD.), and Troy Sol S-366 (Troy Chemical Co., Ltd.) are exemplified. In addition, polysiloxane polymer KP-341 (manufactured by Shin-Etsu Chemical Co., Ltd.) can also be used as silicon surfactant.

In addition to these known surfactants as exemplified above, surfactants using polymers having fluoro-aliphatic groups derived from fluoro-aliphatic compounds manufactured by a telomerization method (also called a telomer method) or an oligomerization method (also called an oligomer method) can be used. The fluoro-aliphatic compounds can be synthesized according to the method disclosed in JP-A-2002-90991.

As the polymers having fluoro-aliphatic groups, copolymers of monomers having fluoro-aliphatic groups and (poly(oxyalkylene)) acrylate and/or (poly(oxyalkylene)) methacrylate are preferred, and the monomers may be distributed at random or block copolymerized. As the poly(oxyalkylene) groups, a poly(oxyethylene) group, a poly(oxypropylene) group, and a poly(oxybutylene) group are exemplified. Further, the polymers may be units having alkylenes different in chain length in the same chain length, such as a block combination of poly(oxyethylene and oxypropylene and oxyethylene), and a block combination of poly(oxyethylene and oxypropylene). In addition, copolymers of monomers having fluoro-aliphatic groups and poly(oxyalkylene)acrylate (or methacrylate) may be not only bipolymers but also terpolymers or higher polymers obtained by copolymerization of monomers having different two or more kinds of fluoro-aliphatic groups or different two or more kinds of poly(oxyalkylene)acrylates (or methacrylates) at the same time.

For example, as commercially available surfactants, Megafac F178, F470, F473, F475, F476 and F472 (manufactured by Dainippon Ink and Chemicals Inc.) can be exemplified. Further, copolymers of acrylate (or methacrylate) having a $C_6F_{13}$ group and (poly(oxyalkylene)) acrylate (or methacrylate), copolymers of acrylate (or methacrylate) having a $C_6F_{13}$ group, (poly(oxyethylene)) acrylate (or methacrylate), and (poly-(oxypropylene)) acrylate (or methacrylate), copolymers of acrylate (or methacrylate) having a $C_8F_{17}$ group and (poly-(oxyethylene)) acrylate (or methacrylate), copolymers of acrylate (or methacrylate) having a $C_8F_{17}$ group, (poly(oxy-ethylene)) acrylate (or methacrylate), and (poly(oxy-propylene)) acrylate (or methacrylate), etc., can be exemplified.

The use amount of fluorine and/or silicon surfactants is preferably from 0.0001 to 2 mass % based on all the amount of the positive photosensitive composition (exclusive of a solvent), and more preferably from 0.001 to 1 mass %.

Surface Hydrophobitized Resin:

The positive photosensitive composition in the invention can contain a surface hydrophobitized resin. When a resist film comprising the positive photosensitive composition of the invention is subjected to exposure via an immersion liquid, a surface hydrophobitized resin can further be added to the positive photosensitive composition, if necessary. By the addition of the surface hydrophobitized resin, the sweepback contact angle of resist film surface can be improved and following ability of the immersion liquid can be bettered. Any resins can be used as the surface hydrophobitized resin so long as they can improve the sweepback contact angle of resist film surface by the addition, but resins having at least either a fluorine atom or a silicon atom are preferably used. The addition amount can be arbitrarily adjusted so as to reach the sweepback contact angle of resist film of from 60° to 80°, and is preferably from 0.1 to 5 mass %.

Organic Solvent:

The above components of the positive photosensitive composition of the invention are dissolved in a prescribed organic solvent and used.

As the organic solvents usable in the invention, ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, and tetrahydrofuran are exemplified.

In the invention, organic solvents may be used alone or as mixture, but it is preferred to use a mixed solvent containing two or more kinds of solvents having different functional groups. By the use of such a mixed solvent, not only the solubility of materials is heightened and the generation of particles by aging can be restrained, but also a good pattern profile can be obtained. As the preferred functional groups for solvents, an ester group, a lactone group, a hydroxyl group, a ketone group, and a carbonate group are exemplified. As the mixed solvents having different functional groups, the following mixed solvents (S1) to (S5) are preferred.

(S1): A mixed solvent containing a solvent having a hydroxyl group and a solvent not having a hydroxyl group;

(S2): A mixed solvent containing a solvent having an ester structure and a solvent having a ketone structure;

(S3): A mixed solvent containing a solvent having an ester structure and a solvent having a lactone structure;

(S4): A mixed solvent containing a solvent having an ester structure, a solvent having a lactone structure, and a solvent having a hydroxyl group; and (S5): A mixed solvent containing a solvent having an ester structure, a solvent having a carbonate structure, and a solvent having a hydroxyl group.

By the use of these mixed solvents, the generation of particles during preservation of a resist solution can be reduced and the generation of coating defects can be restrained.

As the solvents having a hydroxyl group, e.g., ethylene glycol, ethylene glycol monomethyl ether, ethylene glycol monoethyl ether, propylene glycol, propylene glycol monomethyl ether, propylene glycol monoethyl ether, ethyl lactate, etc., can be exemplified, and of these solvents, propylene glycol monomethyl ether and ethyl lactate are more preferred.

As the solvents not having a hydroxyl group, e.g., propylene glycol monomethyl ether acetate, ethylethoxy-propionate, 2-heptanone, γ-butyrolactone, cyclohexanone, butyl acetate, N-methylpyrrolidone, N,N-dimethylacetamide, dimethyl sulfoxide, etc., can be exemplified, and of these solvents, propylene glycol monomethyl ether acetate, ethylethoxypropionate, 2-heptanone, γ-butyrolactone, cyclohexanone, butyl acetate are more preferred, and propylene glycol monomethyl ether acetate, ethylethoxypropionate, 2-heptanone, and cyclohexanone are especially preferred.

As the solvents having a ketone structure, cyclohexanone, 2-heptanone, etc., are exemplified, and cyclohexanone is preferred.

As the solvents having an ester structure, propylene glycol monomethyl ether acetate, ethylethoxypropionate, butyl acetate, etc., are exemplified, and propylene glycol monomethyl ether acetate is preferred.

As the solvent having a lactone structure, γ-butyrolactone is exemplified.

As the solvents having a carbonate structure, propylene carbonate and ethylene carbonate are exemplified, and propylene carbonate is preferred.

The mixing ratio (by mass) of the solvent having a hydroxyl group and the solvent not having a hydroxyl group is from 1/99 to 99/1, preferably from 10/90 to 90/10, and more preferably from 20/80 to 60/40. Mixed solvents containing in the proportion of 50 mass % or more of the solvents not having a hydroxyl group are especially preferred in the point of capable of obtaining coating uniformity.

The mixing ratio (by mass) of the solvent having an ester structure and the solvent having a ketone structure is from 1/99 to 99/1, preferably from 10/90 to 90/10, and more preferably from 40/60 to 80/20. Mixed solvents containing in the proportion of 50 mass % or more of the solvents having an ester structure are especially preferred in the point of capable of obtaining coating uniformity.

The mixing ratio (by mass) of the solvent having an ester structure and the solvent having a lactone structure is from 70/30 to 99/1, preferably from 80/20 to 99/1, and more preferably from 90/10 to 99/1. Mixed solvents containing in the proportion of 70 mass % or more of the solvents having an ester structure are especially preferred in the light of aging stability.

When the solvent having an ester structure, the solvent having a lactone structure and the solvent having a hydroxyl group are mixed, it is preferred to contain the solvent having an ester structure in the proportion of from 30 to 80 mass %, the solvent having a lactone structure in the proportion of from 1 to 20 mass %, and the solvent having a hydroxyl group from 10 to 60 mass %.

When the solvent having an ester structure, the solvent having a carbonate structure and the solvent having a hydroxyl group are mixed, it is preferred to contain the solvent having an ester structure in the proportion of from 30 to 80 mass %, the solvent having a carbonate structure in the proportion of from 1 to 20 mass %, and the solvent having a hydroxyl group from 10 to 60 mass %.

As preferred embodiments of these solvents, solvents containing alkylene glycol monoalkyl ether carboxylate (preferably propylene glycol monomethyl ether acetate) are preferred, and mixed solvents of alkylene glycol monoalkyl ether carboxylate and other solvents are more preferred, and other solvent is at least a solvent selected from the solvents having a functional group selected from a hydroxyl group, a ketone group, a lactone group, an ester group, an ether group, a carbonate group, and a plurality of these functional groups. Especially preferred solvents are mixed solvents of at least one solvent selected from among ethyl lactate, γ-butyrolactone, propylene glycol monomethyl ether, butyl acetate, and cyclohexanone, with propylene glycol monomethyl ether acetate.

By selecting optimal solvents, the performance of reducing development defects can be improved.

Other Additives:

If necessary, the positive photosensitive composition of the invention can further contain dyes, plasticizers other than the above fluorine and/or silicon surfactants, photosensitizers, and compounds for accelerating solubility in a developing solution.

Compounds for accelerating solubility in a developing solution usable in the invention are low molecular weight compounds having two or more phenolic OH groups or one or more carboxyl groups and a molecular weight of 1,000 or less. When the solubility accelerating compounds have carboxyl groups, alicyclic or aliphatic compounds are preferred.

A preferred addition amount of these dissolution accelerating compounds is preferably in the proportion of from 2 to 50 mass % based on the polymer compound, and more preferably from 5 to 30 mass %. The amount is preferably 50 mass % or less in the point of restraint of development residue and prevention of pattern deformation at development.

These phenolic compounds having a molecular weight of 1,000 or less can be easily synthesized with referring to the methods disclosed, e.g., in JP-A-4-122938, JP-A-2-28531, U.S. Pat. No. 4,916,210, and EP 219294.

As the specific examples of the alicyclic or aliphatic compounds having a carboxyl group, carboxylic acid derivatives having a steroid structure, e.g., cholic acid, deoxycholic acid, and lithocholic acid, adamantanecarboxylic acid derivatives, adamantanedicarboxylic acid, cyclohexanecarboxylic acid, and cyclohexanedicarboxylic acid are exemplified, but the invention is by no means restricted to these compounds.

Solvents other than the above fluorine and/or silicon surfactants can be used in the invention. As specific examples of other solvents, nonionic surfactants, such as polyoxyethylene alkyl ethers, polyoxyethylene alkylallyl ethers, polyoxyethylene/polyoxypropylene block copolymers, sorbitan aliphatic esters, polyoxyethylene sorbitan aliphatic esters, etc., can be exemplified.

These surfactants can be used alone, or a couple of surfactants can be used in combination.

Pattern-Forming Method:

The positive photosensitive composition in the invention is used by dissolving the above components in a prescribed solvent, preferably in the mixed solvent as described above, filtering through a filter, and coating the solution on a prescribed support as follows. The filter for use in filtration is preferably made of polytetrafluoroethylene, polyethylene or nylon having a pore diameter of 0.1 μm or less, more preferably 0.05 μm or less, and more preferably 0.03 μm or less.

For example, the positive photosensitive composition is coated on a substrate such as the one used in the manufacture of fine integrated circuit element (e.g., silicon/silicon dioxide coating) by an appropriate coating method with a spinner or a coater, and dried, to thereby form a photosensitive film.

The photosensitive film is irradiated with actinic ray or radiation through a prescribed mask, preferably subjected to baking (heating), and then development and rinsing. Thus, a good pattern can be obtained.

At the time of irradiation with actinic ray or radiation, exposure (immersion exposure) may be performed by filling a liquid (an immersion medium) having a higher refractive index than that of air between a photosensitive film and a lens, by which resolution can be raised. As the immersion medium, any liquids can be used so long as they are liquids higher in refractive index than air, but pure water is preferred. An overcoat layer may further be provided on a photosensitive film so that an immersion medium and the photosensitive film are not directly touched in performing immersion exposure, by which the elution of the photosensitive composition from the photosensitive film to the immersion medium is restrained and development defect is reduced.

Before forming a photosensitive film, an antireflection film may be coated previously on a substrate.

As the antireflection film, any of an inorganic film type, e.g., titanium, titanium dioxide, titanium nitride, chromium oxide, carbon, amorphous silicon, etc., and an organic film type comprising a light absorber and a polymer material can be used. Further, commercially available organic antireflection films such as DUV-30 series and DUV-40 series (manufactured by Brewer Science), and AR-2, AR-3 and AR-5 (manufactured by Shipley Company LLC) can also be used.

As actinic rays or radiation, infrared rays, visible rays, ultraviolet rays, far ultraviolet rays, X-rays and electron beams can be exemplified, and preferably far ultraviolet rays of wavelengths of 250 nm or less, and more preferably 220 nm or less are used. Specifically, a KrF excimer laser (248 nm), an ArF excimer laser (193 nm), an $F_2$ excimer laser (157 nm), X-rays and electron beams are exemplified, and ArF excimer lasers, $F_2$ excimer lasers, EUV (13 nm), and electron beams are preferred.

In a development process, an alkali developing solution is used as follows. As the alkali developing solution for the resist composition, alkaline aqueous solutions of inorganic alkalis, e.g., sodium hydroxide, potassium hydroxide, sodium carbonate, sodium silicate, sodium metasilicate, aqueous ammonia, etc., primary amines, e.g., ethylamine, n-propylamine, etc., secondary amines, e.g., diethylamine, di-n-butylamine, etc., tertiary amines, e.g., triethylamine, methyldiethylamine, etc., alcohol amines, e.g., dimethylethanolamine, triethanolamine, etc., quaternary ammonium salts, e.g., tetramethylammonium hydroxide, tetraethylammonium hydroxide, etc., and cyclic amines, e.g., pyrrole, piperidine, etc., can be used.

An appropriate amount of alcohols and surfactants may be added to these alkali developing solutions.

The alkali concentration of the alkali developing solutions is generally from 0.1 to 20 mass %.

The pH of the alkali developing solutions is generally from 10.0 to 15.0.

EXAMPLE

The invention will be described in detail with reference to specific examples, but the invention should not be construed as being restricted thereto. The weight average molecular weight (Mw) and the degree of dispersion (Mw/Mn) of obtained polymer compounds are found from the results of measurement by gel permeation chromatography.

Synthesis Example 1

Synthesis of Compound (S1-X)

Methanol (20 ml) and 0.02 g of vanadium acetylacetonate (VO(acac)$_2$) are put into a four-neck flask equipped with a stirrer, a reflux condenser and dropping apparatus, and the flask is immersed in an oil bath of 80° C. and stirred. Separately, 5.0 g of 1,1,4,4-trimethyl-1,4-butanediol diacrylate and 20 ml of methanol are put into a conical flask and stirred for 30 minutes and thoroughly dissolved. This is taken as dropping solution 1. Further, 2.3 g of thioacetic acid and 20 ml of methanol are put into another conical flask and stirred for 30 minutes. This is taken as dropping solution 2. Dropping solutions 1 and 2 are simultaneously dropped into the four-neck flask immersed in the oil bath over 2 hours, and stirred for 7 hours at 80° C. After termination of the reaction, the light content is removed under reduced pressure to obtain crude crystal. The crude crystal is recrystallized with hexane to obtain 4.6 g of the following shown colorless liquid compound (S1-X). Yield: 70%.

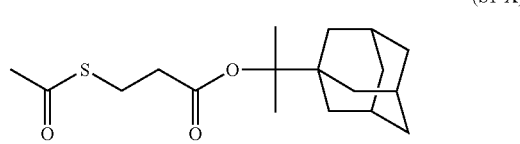

(S1-X)

$^1$H-NMR spectrum (CDCl$_3$ solvent)
δ (ppm): 3.08 (t, 4H), 2.56 (t, 4H), 2.33 (s, 6H), 2.01 (br, 3H), 1.75-1.55 (m, 12H), 1.46 (s, 6H)

Synthesis Example 2

Synthesis of Compound (S1)

Compound (S1-X) (3.8 g) and 100 g of methanol are cooled with ice in a test tube having a capacity of 20 ml, and 3 ml of a 28% sodium methoxide methanol solution is dropped thereto. After 5 minutes, the temperature of the reaction solution is increased to room temperature. The reaction solution, 100 ml of ethyl acetate, and 50 ml of pure water are put into a separating funnel, and the water layer is separated. In the next place, 100 ml of pure water is put into the oil layer and washed to separate the water layer. After repeating the above procedure four times, the ethyl acetate in the oil layer is distilled off to obtain 2.6 g of the following shown white solid state compound (S1). As a result of liquid chromatographic analysis, the purity of the compound is 97 area %. Yield: 80%.

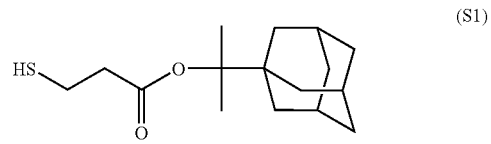

(S1)

$^1$H-NMR spectrum (CDCl$_3$ solvent)
δ (ppm): 2.75 (q, 2H, —CH$_2$—), 2.58 (t, 2H, —CH$_2$—), 2.01 (br, 3H), 1.75-1.55 (m, 12H), 1.47 (s, 6H, —CH$_3$)

$^1$H-NMR spectrum of compound (S1) is shown in FIG. 1.

Synthesis Example 3

Synthesis of Polymer Compound (P1)

Under nitrogen current, 4.8 g of cyclohexanone is put into a three-neck flask and heated at 80° C. A solution obtained by dissolving 4.49 g of the following monomer A, 2.52 g of the following monomer B, 4.95 g of the following monomer C, 0.0985 g of a polymerization initiator (azobisisobutyronitrile (AIBN), manufactured by Wako Pure Chemical Industries), and 0.847 g of compound (S1) shown below in 43.0 g of cyclohexanone is dropped into the above heated cyclohexanone in the three-neck flask over 6 hours. After termination of dropping, the solution is further reacted at 80° C. for 2 hours. After allowing to cool, the reaction solution is dropped into 500 ml of methanol over 20 minutes, and the precipitated powder is filtered out and dried to obtain 7.7 g of polymer compound (P1). The weight average molecular weight of the obtained compound (P1) is 7,300 as standard polystyrene equivalent, and the degree of dispersion (Mw/Mn) is 1.4.

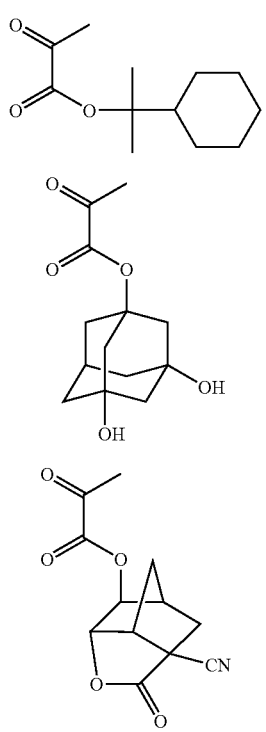

Monomer A

Monomer B

Monomer C

-continued

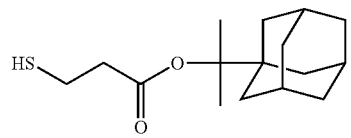
(S1)

Polymer compounds (P2) to (P23) are synthesized in the same manner as above.

Synthesis Example 4

Synthesis of Comparative Polymer Compound (CP1)

Under nitrogen current, 4.8 g of cyclohexanone is put into a three-neck flask and heated at 80° C. A solution obtained by dissolving 4.49 g of the above monomer A, 2.52 g of the above monomer B, 4.95 g of the above monomer C, and 0.657 g of a polymerization initiator (azobisisobutyronitrile (AIBN), manufactured by Wako Pure Chemical Industries) in 43.0 g of cyclohexanone is dropped into the above heated cyclohexanone in the three-neck flask over 6 hours. After termination of dropping, the solution is further reacted at 80° C. for 2 hours. After allowing to cool, the reaction solution is dropped into 500 ml of methanol over 20 minutes, and the precipitated powder is filtered out and dried to obtain 8.2 g of comparative polymer compound (CP1). The weight average molecular weight of the obtained comparative compound (CP1) is 7,700 as standard polystyrene equivalent, and the degree of dispersion (Mw/Mn) is 1.8.

Compound (S) represented by formula (2) used and the content thereof, terminal structure of the polymer, polymerization initiator (I) and the content thereof, addition molar ratio (I/S value), repeating unit and composition, weight average molecular weight (Mw), and the degree of dispersion (Mw/Mn) in polymer compounds (P1) to (P23) and (CP1) are shown in the following Table 1. In Table 1, the contents of compound (S) and polymerization initiator (I) are respectively the values in mol % to all the monomer mol numbers.

TABLE 1

| Polymer Compound | Compound (S) of Formula (2) and Content (mol %) | Terminal Structure of Polymer | Polymerization Initiator (I) and Content (mol %) | Addition Molar Ratio (I/S value) | Repeating Unit and Compositional Ratio | Molecular Weight | Degree of Dispersion |
|---|---|---|---|---|---|---|---|
| P1 | S1 (6.0) | Poly—S—...—O—adamantyl | AIBN (1.0) | 0.17 | A-6 | 7300 | 1.4 |
| P2 | S4 (6.0) | Poly—S—...—O—cyclohexyl | AIBN (1.0) | 0.17 | A-6 | 7800 | 1.5 |

TABLE 1-continued

| Polymer Compound | Compound (S) of Formula (2) and Content (mol %) | Terminal Structure of Polymer | Polymerization Initiator (I) and Content (mol %) | Addition Molar Ratio (I/S value) | Repeating Unit and Compositional Ratio | Molecular Weight | Degree of Dispersion |
|---|---|---|---|---|---|---|---|
| P3 | S6 (6.0) | | AIBN (1.0) | 0.17 | A-6 | 8000 | 1.5 |
| P4 | S5 (6.0) | | AIBN (1.0) | 0.17 | A-6 | 7200 | 1.4 |
| P5 | S3 (6.0) | | AIBN (1.0) | 0.17 | A-6 | 7500 | 1.5 |
| P6 | S11 (6.0) | | AIBN (1.0) | 0.17 | A-6 | 7700 | 1.4 |
| P7 | S18 (4.5) | | AIBN (1.05) | 0.23 | A-2 | 7900 | 1.4 |
| P8 | S10 (5.5) | | AIBN (0.8) | 0.15 | A-3 | 8600 | 1.5 |
| P9 | S13 (5.0) | | AIBN (1.0) | 0.20 | A-4 | 7000 | 1.4 |
| P10 | S12 (2.5) | | V-601 (2.0) | 0.80 | A-5 | 8400 | 1.5 |

TABLE 1-continued

| Polymer Compound | Compound (S) of Formula (2) and Content (mol %) | Terminal Structure of Polymer | Polymerization Initiator (I) and Content (mol %) | Addition Molar Ratio (I/S value) | Repeating Unit and Compositional Ratio | Molecular Weight | Degree of Dispersion |
|---|---|---|---|---|---|---|---|
| P11 | S17 (6.5) | Poly—S—CH₂—C(=O)—O—C(CH₃)(C₂H₅)-adamantyl | AIBN (1.125) | 0.17 | A-1 | 7200 | 1.5 |
| P12 | S24 (5.5) | Poly—S—CH₂CH₂—C(=O)—O—C(CH₃)-cyclohexyl | AIBN (0.8) | 0.15 | A-7 | 7600 | 1.5 |
| P13 | S2 (6.0) | Poly—S—CH₂CH₂—C(=O)—O—C(CH₃)₂-cyclohexyl | V-601 (1.0) | 0.17 | A-8 | 7300 | 1.4 |
| P14 | S7 (5.0) | Poly—S—CH₂CH₂—C(=O)—O—C(C₂H₅)-decahydronaphthyl | AIBN (0.65) | 0.13 | A-9 | 8000 | 1.5 |
| P15 | S13 (5.0) | Poly—S—CH₂CH₂—C(=O)—O—C(CH₃)(C₂H₅)-adamantyl | AIBN (1.0) | 0.20 | A-10 | 7500 | 1.4 |
| P16 | S2 (3.0) | Poly—S—CH₂CH₂—C(=O)—O—C(CH₃)₂-cyclohexyl | V-601 (2.0) | 0.67 | A-11 | 8800 | 1.5 |
| P17 | S13 (6.0) | Poly—S—CH₂CH₂—C(=O)—O—C(CH₃)(C₂H₅)-adamantyl | AIBN (1.0) | 0.17 | A-6 | 8100 | 1.4 |
| P18 | S27 (6.0) | Poly—S—CH₂CH₂—C(=O)—O—C(CH₃)₂-C₆H₁₀—C(CH₃)₂—OH | AIBN (1.0) | 0.17 | A-1 | 7500 | 1.4 |
| P19 | S28 (6.0) | Poly—S—CH₂CH₂—C(=O)—O—C(CH₃)₂-adamantyl-C(CH₃)₂—OH | AIBN (1.0) | 0.17 | A-1 | 8300 | 1.5 |

TABLE 1-continued

| Polymer Compound | Compound (S) of Formula (2) and Content (mol %) | Terminal Structure of Polymer | Polymerization Initiator (I) and Content (mol %) | Addition Molar Ratio (I/S value) | Repeating Unit and Compositional Ratio | Molecular Weight | Degree of Dispersion |
|---|---|---|---|---|---|---|---|
| P20 | S30 (6.0) | 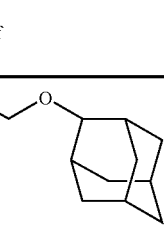 | AIBN (1.0) | 0.17 | A-1 | 8200 | 1.5 |
| P21 | S31 (6.0) | 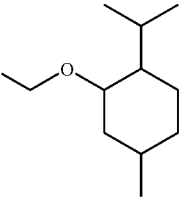 | V-601 (1.0) | 0.17 | A-1 | 7800 | 1.5 |
| P22 | S32 (6.0) | 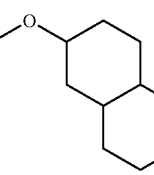 | AIBN (1.0) | 0.17 | A-1 | 8100 | 1.4 |
| P23 | S33 (6.0) | 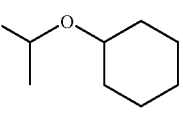 | AIBN (1.0) | 0.17 | A-1 | 7700 | 1.4 |
| CP1 | — | — | AIBN (8.0) | — | A-6 | 7700 | 1.8 |

The repeating units and compositional ratios in Table 1 are shown below.

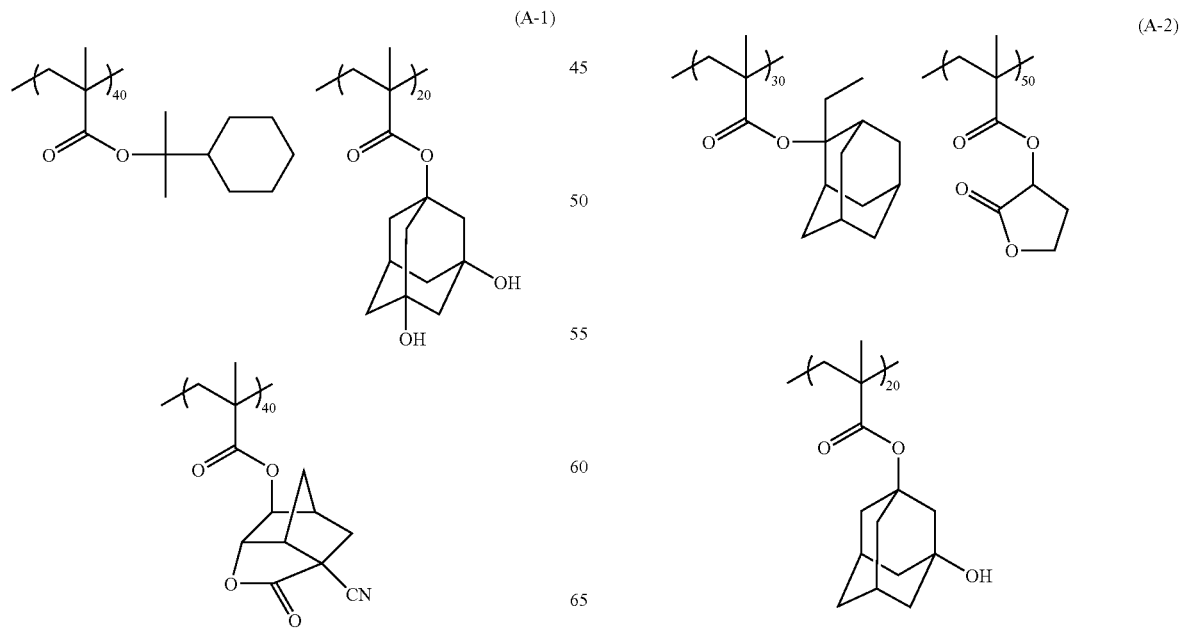

(A-3)
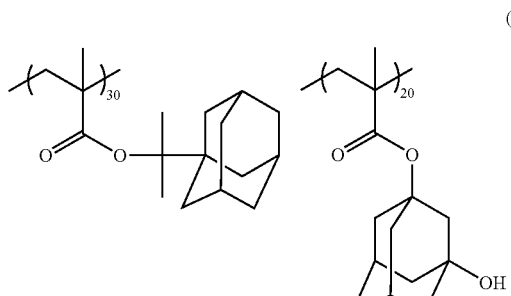
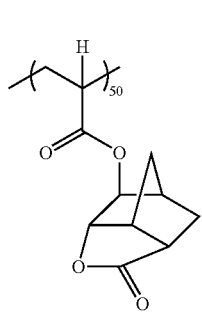
(A-4)
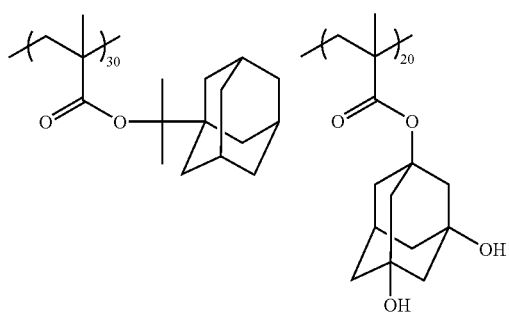
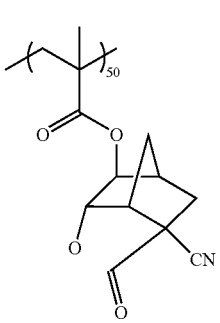
(A-5)
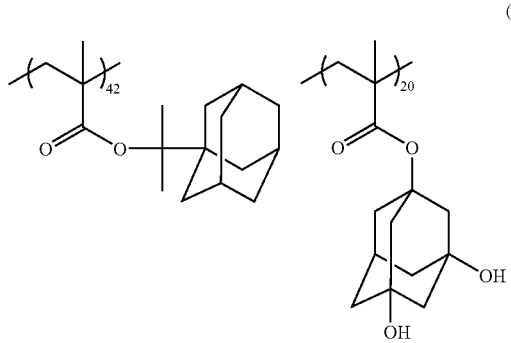
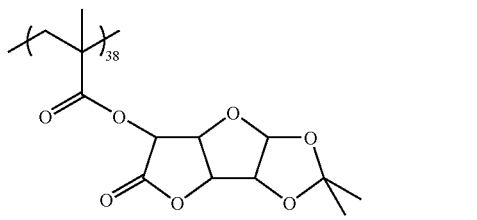
(A-6)
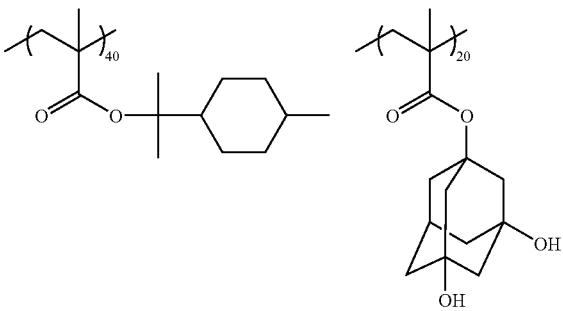
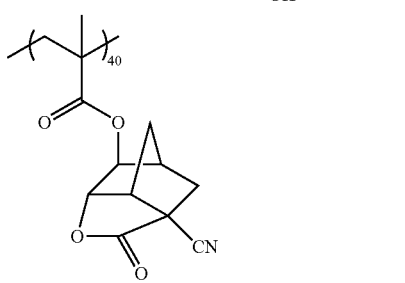
(A-7)
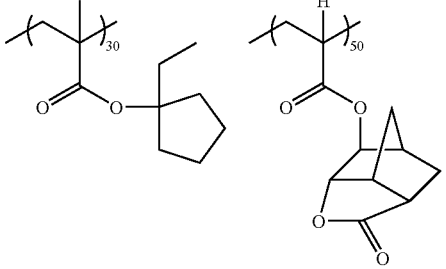
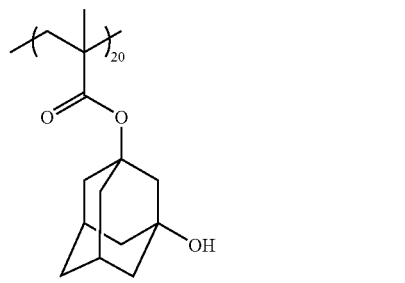
(A-8)
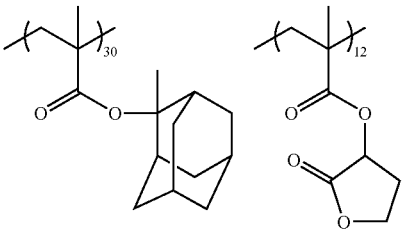

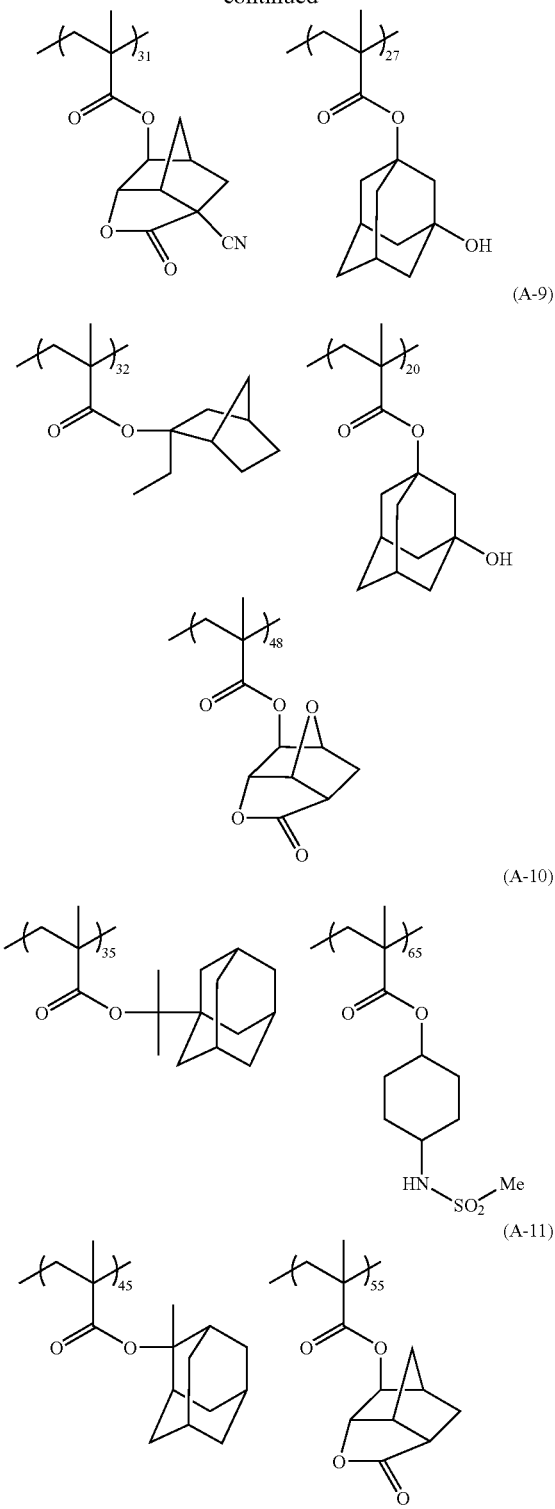

proportion of 6/4 to prepare a solution having solid concentration of 8 mass %. The obtained solution is filtered through a polyethylene filter having a pore diameter of 0.03 μm to prepare a positive resist solution. The prepared positive resist solution is evaluated according to the following method. The results obtained are also shown in Table 3.

An antireflection film DUV-42 (manufactured by Brewer Science) is uniformly coated on a silicone substrate subjected to hexamethyldisilazane treatment in a thickness of 600 Å by a spin coater, and dried on a hot plate at 100° C. for 90 seconds, and then dried by heating at 190° C. for 240 seconds. After that, each positive resist solution is coated thereon by a spin coater and dried at 120° C. for 60 seconds to form a resist film having a thickness of 150 nm.

The resist film is subjected to exposure through a mask with an ArF excimer laser stepper (NA: 0.75, zonal ray of ⅔, manufactured by ASML Co.), and heated on a hot plate at 120° C. for 60 seconds just after exposure. Further, the resist film is developed with a 2.38 mass % tetramethylammonium hydroxide aqueous solution at 23° C. for 60 seconds, rinsed with pure water for 30 seconds, and then dried to obtain a line pattern.

Sensitivity:

The minimum exposure amount capable of forming a line pattern is taken as sensitivity.

Evaluation of Falling Down of Pattern:

The exposure amount required to reproduce a mask pattern of line 75 nm/space 90 nm is taken as the optimal exposure amount. When line width of the line pattern formed by increasing the exposure amount from the optimal exposure amount is thinned, the line width resolved without causing falling of the pattern is evaluated. The smaller the value, the more finer is the pattern resolved without falling down, the more difficult is the falling down of the pattern to occur, and the higher is the resolution.

Examples 1 to 38 and Comparative Example 1

The components shown in Table 2 below and a surfactant (0.01 g of Troy Sol S-366, manufactured by Troy Chemical Co., Ltd.) are dissolved in a mixed solvent of propylene glycol methyl ether acetate/propylene glycol methyl ether in

TABLE 2

| Example No. | Polymer Compound (10 g) | Photo-Acid Generator (0.3 g) | Basic Compound (0.03 g) | Sensitivity (mJ/cm²) | Falling down of pattern (nm) |
|---|---|---|---|---|---|
| Example 1 | P1 | z23 | DIA | 10 | 50 |
| Example 2 | P2 | z23 | DIA | 10 | 50 |
| Example 3 | P3 | z23 | DIA | 10 | 50 |
| Example 4 | P4 | z23 | DIA | 10 | 50 |
| Example 5 | P5 | z23 | DIA | 10 | 50 |
| Example 6 | P6 | z23 | DIA | 10 | 50 |
| Example 7 | P7 | z23 | DIA | 5 | 48 |
| Example 8 | P8 | z23 | DIA | 10 | 50 |
| Example 9 | P9 | z23 | DIA | 5 | 46 |
| Example 10 | P10 | z23 | DIA | 10 | 50 |
| Example 11 | P11 | z23 | DIA | 5 | 48 |
| Example 12 | P12 | z23 | DIA (0.015 g) POA (0.015 g) | 5 | 46 |
| Example 13 | P13 | z23 | DIA | 10 | 50 |
| Example 14 | P14 | z23 | DIA | 10 | 50 |
| Example 15 | P15 | z23 | DIA | 5 | 48 |
| Example 16 | P16 | z23 | DIA | 10 | 50 |
| Example 17 | P17 | z23 | DIA | 10 | 50 |
| Example 18 | P18 | z23 | DIA | 10 | 45 |
| Example 19 | P19 | z23 | DIA (0.015 g) POA (0.015 g) | 10 | 45 |
| Example 20 | P20 | z23 | DIA (0.015 g) POA (0.015 g) | 5 | 48 |
| Example 21 | P21 | z23 | DIA | 5 | 48 |
| Example 22 | P22 | z23 | DIA | 5 | 50 |
| Example 23 | P23 | z23 | DIA | 5 | 50 |
| Example 24 | P1 | z23 (0.2 g) z55 (0.1 g) | PEA | 10 | 50 |

TABLE 2-continued

| Example No. | Polymer Compound (10 g) | Photo-Acid Generator (0.3 g) | Basic Compound (0.03 g) | Sensitivity (mJ/cm$^2$) | Falling down of pattern (nm) |
|---|---|---|---|---|---|
| Example 25 | P2 | z2 | TEA | 10 | 50 |
| Example 26 | P3 | z5 | DIA | 10 | 50 |
| Example 27 | P4 | z63 | DIA | 10 | 50 |
| Example 28 | P5 | z15 | DIA | 10 | 50 |
| Example 29 | P6 | z1 | DIA | 10 | 50 |
| Example 30 | P7 | z62 | PBI | 5 | 50 |
| Example 31 | P14 | z4 (0.2 g) z66 (0.1 g) | TMEA | 10 | 50 |
| Example 32 | P1 | z55 (0.2 g) z51 (0.1 g) | PEA | 10 | 50 |
| Example 33 | P1 | z64 | DBA | 10 | 50 |
| Example 34 | P6 | z67 | DIA | 10 | 50 |
| Example 35 | P6 | z23 (0.2 g) z63 (0.1 g) | TMEA | 10 | 50 |
| Example 36 | P13 | z5 | TEA | 10 | 50 |
| Example 37 | P14 | z64 | TEA | 10 | 50 |
| Example 38 | P15 | z51 | TMEA | 5 | 50 |
| Comparative Example 1 | CP1 | z23 | DIA | 30 | 60 |

The compounds corresponding to the abbreviations in Table 2 are the compounds as shown below.

Light-Acid Generator:

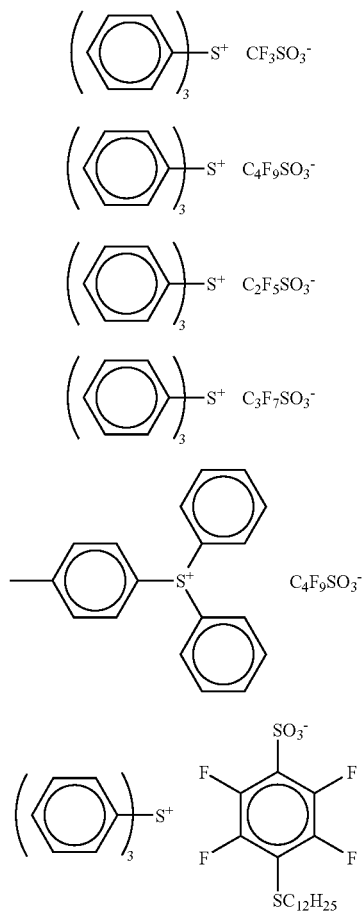

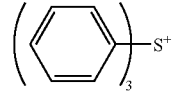
(z62)

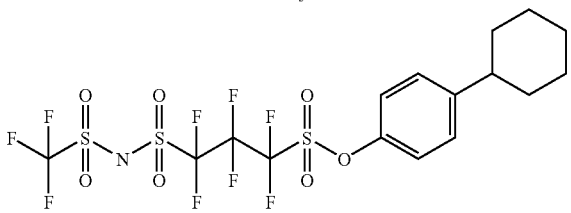

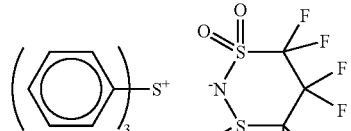
(z55)

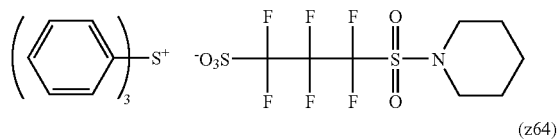
(z63)

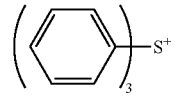
(z64)

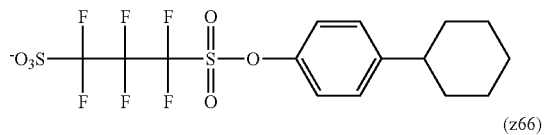

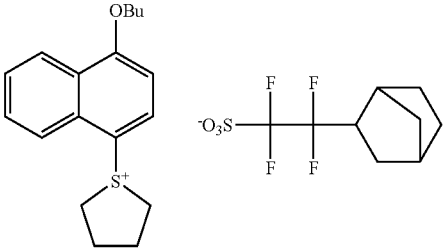
(z66)

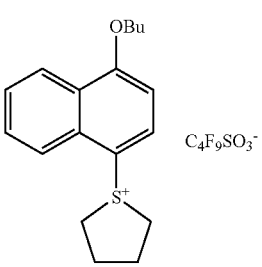
(z67)

Basic compound:

TPSA: Triphenylsulfonium acetate

DIA: 2,6-Diisopropylaniline

TEA: Triethanolamine

DBA: N,N-Dibutylaniline

PBI: 2-Phenylbenzimidazole

TMEA: Tris(methoxyethoxyethyl)amine
PEA: N-Phenyldiethanolamine

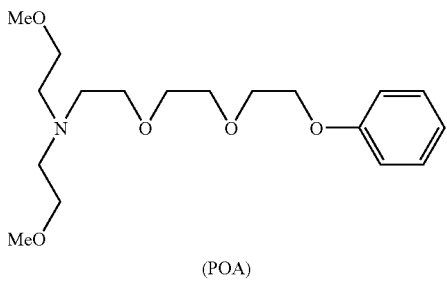

(POA)

It is apparent from the results in Table 2 that the positive photosensitive compositions containing the polymer compounds synthesized according to the invention are high sensitivity and prevention of falling down is also good.

Example 39

A resist film is obtained by preparing a resist solution and coating in the same manner as in Example 1, except that the polymer compound is replaced with the following polymer compound, provided that the film thickness is made 0.40 μm. The obtained resist film is subjected to pattern exposure with a KrF excimer laser stepper (FPA3000EX-5, wavelength: 248 nm, manufactured by Canon Inc.), and formation of a pattern is confirmed. It is ascertained that the positive photosensitive composition of the invention can also be preferably used in pattern formation by KrF excimer laser exposure.

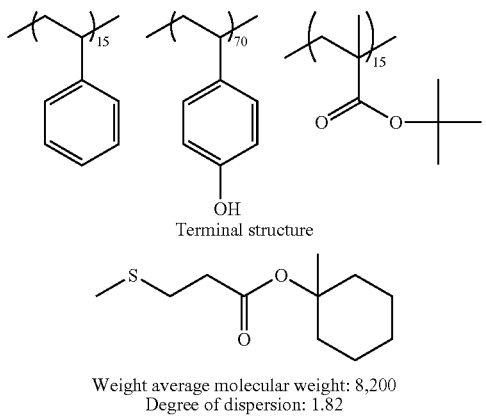

Terminal structure

Weight average molecular weight: 8,200
Degree of dispersion: 1.82

The invention can provide a positive photosensitive composition that is improved in dissolution contrast between the exposed area and the unexposed area, and also improved in sensitivity as compared with conventional photosensitive compositions by containing a polymer compound having a structure broken by the action of an acid catalyst on the terminal. Further, the invention can provide a polymer compound for use in the positive photosensitive composition, a manufacturing method of the polymer compound, a compound for use in the manufacture of the polymer compound, and a pattern forming method using the positive photosensitive composition. The invention can further provide a positive photosensitive composition that is improved in falling down of a pattern by the flattening of a resist pattern at the interface of the exposed part and the unexposed part by containing a polymer compound having a structure that is broken by the action of an acid catalyst on the terminal, and the invention can also provide a polymer compound for use in the positive photosensitive composition, a manufacturing method of the polymer compound, a compound for use in the manufacture of the polymer compound, and a pattern forming method using the positive photosensitive composition.

The entire disclosure of each and every foreign patent application from which the benefit of foreign priority has been claimed in the present application is incorporated herein by reference, as if fully set forth.

What is claimed is:

1. A positive photosensitive composition comprising:
    a polymer compound having an acid-decomposable structure on a terminal of a main chain of the polymer compound; and
    a compound capable of generating an acid upon irradiation with actinic ray or radiation.

2. The positive photosensitive composition as claimed in claim 1,
    wherein the polymer compound further has a repeating unit having a lactone group.

3. The positive photosensitive composition as claimed in claim 1,
    wherein the polymer compound has a structure represented by formula (1) on the terminal:

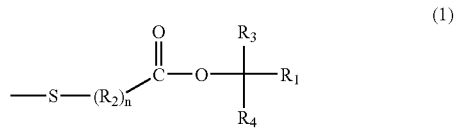

wherein $R_1$ represents an alkyl group, a cycloalkyl group, or an aryl group; $R_2$ represents an alkylene group, a cycloalkylene group, or an arylene group; $R_3$ and $R_4$ each independently represents a hydrogen atom, an alkyl group, a cycloalkyl group, an alkenyl group, or an aryl group, provided that at least one of $R_3$ and $R_4$ does not represent a hydrogen atom, and $R_3$ or $R_4$ may be bonded to contiguous $R_1$ to form a cyclic structure; and n represents 0 or 1.

4. The positive photosensitive composition as claimed in claim 1,
    wherein the polymer compound has a structure represented by formula (3) on the terminal:

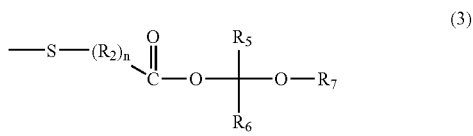

wherein $R_7$ represents an alkyl group, a cycloalkyl group, or an aryl group; $R_2$ represents an alkylene group, a cycloalkylene group, or an arylene group; $R_5$ and $R_6$ each independently represents a hydrogen atom, an alkyl group, a cycloalkyl group, an alkenyl group, or an aryl group, and $R_5$ and $R_6$ may be bonded to the carbon atom on $R_7$ to form a cyclic structure; and n represents 0 or 1.

5. A polymer compound having a structure represented by formula (1) on a terminal of the polymer compound:

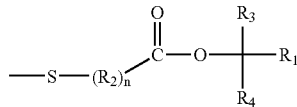

(1)

wherein $R_1$ represents an alkyl group, a cycloalkyl group, or an aryl group; $R_2$ represents an alkylene group, a cycloalkylene group, or an arylene group; $R_3$ and $R_4$ each represents a hydrogen atom, an alkyl group, a cycloalkyl group, an alkenyl group, or an aryl group, provided that at least one of $R_3$ and $R_4$ does not represent a hydrogen atom, and $R_3$ or $R_4$ may be bonded to contiguous $R_1$ to form a cyclic structure; and n represents 0 or 1.

6. A polymer compound having a structure represented by formula (3) on a terminal of the polymer compound:

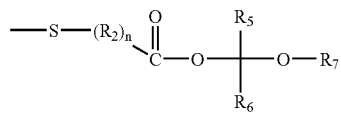

(3)

wherein $R_7$ represents an alkyl group, a cycloalkyl group, or an aryl group; $R_2$ represents an alkylene group, a cycloalkylene group, or an arylene group; $R_5$ and $R_6$ each represents a hydrogen atom, an alkyl group, a cycloalkyl group, an alkenyl group, or an aryl group, and $R_5$ and $R_6$ may be bonded to the carbon atom on $R_7$ to form a cyclic structure; and n represents 0 or 1.

7. A manufacturing method of a polymer compound, comprising
polymerizing a polymerizable compound having an ethylenic double bond by using a compound represented by formula (2) and a polymerization initiator:

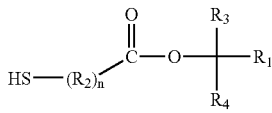

(2)

wherein $R_1$ represents an alkyl group, a cycloalkyl group, or an aryl group; $R_2$ represents an alkylene group, a cycloalkylene group, or an arylene group; $R_3$ and $R_4$ each independently represents a hydrogen atom, an alkyl group, a cycloalkyl group, an alkenyl group, or an aryl group, provided that at least one of $R_3$ and $R_4$ does not represent a hydrogen atom, and $R_3$ or $R_4$ may be bonded to contiguous $R_1$ to form a cyclic structure; and n represents 0 or 1.

8. A compound represented by formula (2):

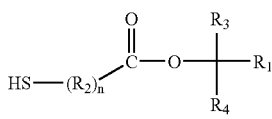

(2)

wherein $R_1$ represents an alkyl group, a cycloalkyl group, or an aryl group; $R_2$ represents an alkylene group, a cycloalkylene group, or an arylene group; $R_3$ and $R_4$ each represents a hydrogen atom, an alkyl group, a cycloalkyl group, an alkenyl group, or an aryl group, provided that at least one of $R_3$ and $R_4$ does not represent a hydrogen atom, and $R_3$ or $R_4$ may be bonded to contiguous $R_1$ to form a cyclic structure; and n represents 0 or 1.

9. A pattern-forming method comprising:
forming a photosensitive film with the positive photosensitive composition as claimed in claim 1; and
exposing and developing the photosensitive film.

* * * * *